(12) United States Patent
Hiraoka et al.

(10) Patent No.: US 6,835,889 B2
(45) Date of Patent: Dec. 28, 2004

(54) PASSIVE ELEMENT COMPONENT AND SUBSTRATE WITH BUILT-IN PASSIVE ELEMENT

(75) Inventors: Toshiro Hiraoka, Kanagawa-ken (JP); Yasuyuki Hotta, Tokyo (JP); Koji Asakawa, Kanagawa-ken (JP); Shigeru Matake, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/251,825

(22) Filed: Sep. 23, 2002

(65) Prior Publication Data

US 2003/0107465 A1 Jun. 12, 2003

(30) Foreign Application Priority Data

Sep. 21, 2001 (JP) ........................................ 2001-289617
Sep. 26, 2001 (JP) ........................................ 2001-295183
Feb. 22, 2002 (JP) ........................................ 2002-046321

(51) Int. Cl.[7] ........................ H01L 23/29; H01L 21/20
(52) U.S. Cl. ................ 174/52.2; 438/381; 257/E23.112
(58) Field of Search ...................... 174/52.2; 438/381; 257/E21.151, E23.112, E31.013, E33.018

(56) References Cited

U.S. PATENT DOCUMENTS

| | | | | |
|---|---|---|---|---|
| 5,034,801 A | * | 7/1991 | Fischer | 428/422 |
| 5,712,184 A | * | 1/1998 | Kaiser | 437/62 |
| 6,153,489 A | * | 11/2000 | Park et al. | 438/381 |
| 6,261,892 B1 | * | 7/2001 | Swanson | 438/381 |
| 6,261,893 B1 | * | 7/2001 | Chang et al. | 438/238 |
| 6,391,471 B1 | | 5/2002 | Hiraoka et al. | |
| 6,486,017 B1 | * | 11/2002 | Verma et al. | 438/381 |
| 6,507,105 B1 | * | 1/2003 | Yamagata et al. | 257/720 |
| 6,534,406 B1 | * | 3/2003 | Howard et al. | 438/381 |
| 6,569,524 B2 | * | 5/2003 | Kawai et al. | 428/375 |
| 6,627,507 B2 | * | 9/2003 | Yuan | 438/381 |

* cited by examiner

*Primary Examiner*—Dean A. Reichard
*Assistant Examiner*—Adolfo Nino
(74) *Attorney, Agent, or Firm*—Oblon, Spivak, McClelland, Maier & Neustadt, P.C.

(57) ABSTRACT

The present invention provides a composite material such as a passive element, a passive element composite component, a substrate with a built-in passive element and a composite wiring substrate which are free from, for example, a layer peeling problem and enables high density packaging with ease. In the present invention, a porous base material is divided into plural functional regions and a material having different electromagnetic characteristics is filled in a pore of the porous base material of each functional region, to form a passive element or a wiring substrate. Among the aforementioned plural functional regions, at least one functional region is a conductive material region filled with a conductive material and other regions are filled with a high-dielectric material, a high-permeability material or a low-dielectric material. This structure ensures that a single passive element, plural passive elements or a wiring substrate provided with a circuit wiring can be formed on a porous base material efficiently.

15 Claims, 11 Drawing Sheets

PASSIVE ELEMENT COMPONENT AND SUBSTRATE WITH BUILT-IN PASSIVE ELEMENT

BACKGROUND OF THE INVENTION

1. Field of the Invention

The present invention relates to a passive element, such as a resister element, condenser element and coil element, a passive element composite component in which plural passive elements are connected with each other, a substrate having a built-in passive element and a composite wiring substrate which are used in electric, electronic and communication fields.

2. Background Art

Along with the recent development of portable and multifunctional electronic devices, electronic devices have been miniaturized. Because in the case of, particularly, high performance electronic devices such as portable telephones and wearable computers, a multifunctional electronic circuit is stored in a case having a small capacity, it is inevitable to accomplish high density packaging. This is the reason why not only the miniaturization of electronic components but also technologies concerning wiring boards formed with fine wiring are essential for high density packaging.

In, particularly, a wiring substrate used in a radio module, it is necessary to use a low-dielectric substrate in a usual wiring part to treat high speed signals whereas it is rather effective to use a high-dielectric substrate in an antenna part. Therefore, there is an increasing need of forming regions each having a different electromagnetic characteristics on a single substrate. However, it is difficult to form the low-dielectric component and the high-dielectric component separately on a single wiring substrate.

In this situation, substrates designed to have a multilayer structure by laminating a plurality of substrates and by binding these substrates to integrate them are known (see the publication of JP-A-2001-15916). However, if plural substrates having different characteristics are laminated, layer peeling tends to be caused by a difference in the thermal expansion coefficient of each substrate.

Similarly, as to, also, a built-in element type wiring substrate incorporated with passive elements such as a condenser, a multilayer wiring substrate incorporated with a high-dielectric layer for forming a condenser is known (see the publication of JP-A-11-179824). However, in such a wiring substrate, layer peeling and the like are also easily caused and only a condenser is disposed on the high-dielectric layer, giving rise to the problem that it is difficult to improve packaging density.

As aforementioned, the wiring substrates having a laminate structure have the problem that layer peeling is easily caused. Also, in the case of mounting plural components which make a demand upon substrates for each different electromagnetic characteristics, on a single substrate, there is a limitation in the design of circuit arrangement, posing the problem that the efficiency of storing electronic circuits is decreased.

Moreover, in, also, a passive element electronic component having a conventional laminate structure, the miniaturization makes it difficult to maintain mechanical strength which a relatively large component originally possess, which affords the possibility that the layer peeling of the elements is caused by a thermal or mechanical shock.

DISCLOSURE OF THE INVENTION

As aforementioned, with regard to radio module wiring substrates and wiring substrates with a built-in passive element, multilayer wiring substrates prepared by laminating plural substrates differing in dielectric constant and the like are proposed. However, such a method as to make each layer differ in characteristics such as dielectric constant has the problem that layer peeling tends to be caused and further it is difficult to improve packaging density.

In view of this situation, it is an object of the present invention to provide a composite material, such as a passive element component and substrate with a built-in passive element, which is free from problems such as layer peeling and can accomplish high density packaging easily.

The present invention has been made to solve the above problems and made from the viewpoint based on the fact that a passive element, passive element composite component, substrate with a built-in passive element and composite wiring substrate which are free from layer peeling can be formed by filling pores in selected regions of a porous base material, in which continuous pores are formed, with a conductive material, passive element functional material, insulation material or the like.

According to a first aspect of the present invention, there is provided a passive element component comprising a conductive material region produced by filling a conductive material in two regions of a porous base material which regions are not in contact with each other and a functional region sandwiched between each conductive material region on the porous base material and prepared by filling the porous base material with a passive element functional material.

According to a second aspect of the present invention, there is provided a passive element component comprising a conductive material region and plural functional regions produced by filling each pore of a porous base material with a material having different electromagnetic characteristics, wherein;

one of the plural functional regions is a passive element functional material region which is in contact with the conductive material region, is produced by filling pores of the porous base material with a passive element functional material and constitutes a passive element together with the conductive material region; and the other of the plural functional regions is an insulation material region which is in contact with at least one of the conductive material region and the functional material region and is produced by filling pores of the porous base material with an insulation material differing from the passive element functional material.

According to a third aspect of the present invention, there is provided a passive element component comprising a first functional region, a second functional region and a third functional region produced by filling each pore of a porous base material with a material having different electromagnetic characteristics, wherein;

the first functional region is a conductive material region produced by filling the porous base material with a conductive material;

the second functional region is a passive element functional material region which is in contact with the conductive material region, is produced by filling pores of the porous base material with a passive element functional material and constitutes a passive element in combination with the conductive material region; and the third functional region is an insulation material region which is in contact with at least one of the conductive material region and the functional material region and is produced by filling pores of the porous base material with an insulation material differing from the passive element functional material. In the first to third aspects of the present invention, the passive element constituted of the conductive material region and the functional material region may be provided plurally.

Also, the plural passive elements are preferably separated from each other by the insulation material region.

According to a fourth aspect of the present invention, there is provided a condenser element component comprising a conductive material region produced by filling a conductive material in two regions of a porous base material which regions are not in contact with each other and a functional region sandwiched between each conductive material region on the porous base material and prepared by filling the porous base material with a high-dielectric material, a resister element component comprising a conductive material region produced by filling a conductive material in two regions of a porous base material which regions are not in contact with each other and a functional region sandwiched between each conductive material region on the porous base material and prepared by filling the porous base material with a resistant material or a coil element component comprising a conductive material region produced by filling a conductive material in two regions of a porous base material which regions are not in contact with each other and a functional region sandwiched between each conductive material region on a porous base material and prepared by filling the porous base material with a high-magnetic permeability material.

According to a fifth aspect of the present invention, there is provided a substrate with a built-in passive element, the substrate being provided with a passive element component comprising a conductive material region and plural functional regions produced by filling each pore of a porous base material with a material having different electromagnetic characteristics, wherein;

one of the plural functional regions is a passive element functional material region which is in contact with the conductive material region, is produced by filling pores of the porous base material with a passive element functional material aid constitutes a passive element in combination with the conductive material region; and the other of the plural functional regions is an insulation material region which is in contact with at least one f the conductive material region and the functional material region and is produced by filling pores of the porous base material with an insulation material differing from the passive element functional material; or a passive element component comprising a first functional region, a second functional region and a third functional region produced by filling each pore of a porous base material with a material having different electromagnetic characteristics, wherein;

the first functional region is a conductive material region produced by filling the porous base material with a conductive material;

the second functional region is a passive element functional material region which is in contact with the conductive material region, is produced by filling pores of the porous base material with a passive element functional material and constitutes a passive element in combination with the conductive material region; and the third functional region is an insulation material region which is in contact with at least one of the conductive material region and the functional material region and is produced by filling pores of the porous base material with an insulation material differing from the passive element functional material; and further wiring for connecting these passive elements.

In the substrate with a built-in passive element according to the fifth aspect of the present invention, the passive element may be designed to be a condenser element produced by filling the functional region of the porous body with a high-dielectric material, a resister element produced by filling the functional region with a resistant material or a coil element produced by filling the functional region with a high-magnetic permeability material. Also, this substrate with a built-in passive element maybe provided with plural passive elements, which are connected with each other by using wiring formed by allowing a porous substrate to be impregnated with a conductive material to form an electronic circuit. Also, the substrate with a built-in passive element maybe further provided with a through-hole formed on the surface of the substrate for mounting electronic components.

PREFERRED EMBODIMENT OF THE INVENTION

Figure 1:
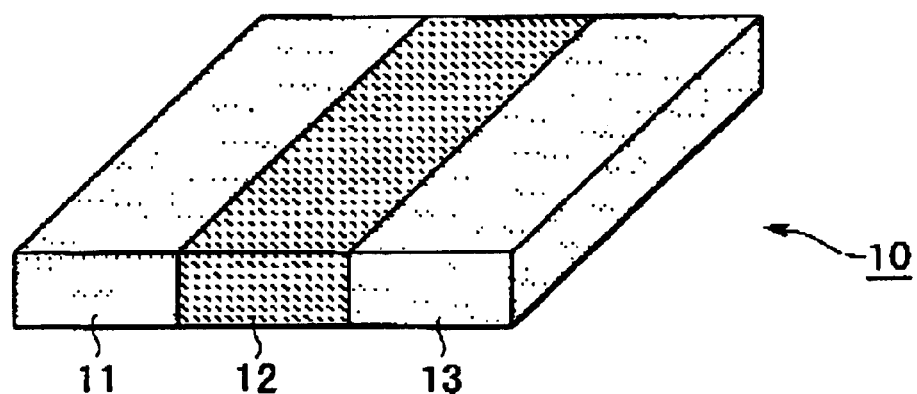
FIG. 1 is a perspective view showing one example of a passive element according to the present invention.

Explanations will be furnished as to a porous base material, formation of a conductive material region and formation of other regions which are adopted in common in the passive element, passive element composite component, substrate with a built-in passive element and composite wiring substrate of the present invention and thereafter as to the passive element, passive element composite component, substrate with a built-in passive element and composite wiring substrate.

(Porous Base Material)

The porous substrate used in the present invention may be any substrate without any particular limitation as far as it has pores and a porous body made of an organic or inorganic material may be used corresponding to uses. Also, as the shape of the porous base material, various shapes such as a plate form, line form, cylinder form and sphere form maybe applied without any particular limitation.

As the organic porous base material, a porous base material made of a polymer material is used. Examples of the polymer material include resins, which are conventionally used as insulation materials of print wiring substrates, such as epoxy resins, bismaleimidotriazine resins, PEEK reins and butadiene resins, and other than the above, polyolefins such as polyethylene and polypropylene, polydienes such as polybutadiene, polyisoprene, polyisoprene and polyvinylethylene, acryl type resins such as polymethylacrylate and polymethylmethacrylate, polystyrene derivatives, polyacrylonitrile derivatives such as polyacrylonitrile and polymethacrylonitrile, polyacetals such as polyoxymethylene, polyesters including polyethylene terephthalate, polybutylene terephthalate and the like and aromatic polyesters, polyarylates, polyamides such as aromatic polyamides, e.g., para or metha type alamide resins, and nylon, polyimides, aromatic polyethers such as poly p-phenylene ether, polyether sulfones, polysulfones, polysulfides, fluorine type polymers such as polytetrafluoroethylene, polybenzoxazoles, polybenzothiazoles, polybenzoimidazoles, polyphenylenes such as polyparaphenylene, polyparaphenylenebenzobisoxazole derivatives, polyparaphenylenevinylene derivatives, polysiloxane derivatives, novolac resins, melamine resins, urethane resins and polycarbodiimide resins.

As the porous base material formed of each of these polymer materials, a porous body produced by a drawing method, phase transition method or the like is used. Specific examples of the porous base material include a PTFE drawn sheet and porous bodys such as polysulfone, polyamide and polyimide prepared by a phase transition method.

Also, a porous body produced by removing a specific phase selectively from the three-dimensional network micro-phase separate structure of a block copolymer may be used. The porous body like this is suitable for the formation of a fine conductive pattern because pores are even in diameters and is therefore most desirable.

As measures for removing a specific phase selectively from a micro-phase separate structure, any optional measures may be adopted without any particular limitation. For example, a method is used in which a specific phase polymer is decomposed by ozone oxidation or irradiation with β-rays and thereafter the decomposed product is removed by means of washing With a solvent to form a porous body.

Examples of materials used for the porous body produced from the micro-phase separate structure include a polycarboxysilane sheet, crosslinked polybutadiene sheet and polycyclohexene sheet. Also, it is possible to remove the specific phase of the micro-phase separate structure b heat decomposition and vaporization. This measures makes it possible to produce a porous body of a heat resistant polymer such as polyimide.

Moreover, nonwoven fabric in which fine fibers of a polymer are intertwined three-dimensionally may be used as the porous body. The nonwoven fabric like this may be produced using, for example, a thermoplastic resin such as polyparaphenylene sulfide by a melt blow method or the like. The porous body maybe produced also by processing about 0.1 to 0.3-$\mu$m-thick fine fiber of a liquid crystal polymer such as fine alamide fiber paper-making-wise.

On the other hand, as the inorganic porous body, a porous body using a ceramic material is used. Examples of the ceramics material include metal oxides such as silica, alumina, titania and potassium titanate, silicon carbide, silicon nitride and aluminum nitride. The inorganic porous body is produced from these ceramics materials by a sol gel method, emulsion templating method or the like.

A porous body made of a composite material consisting of an organic material and an inorganic material may also be used. Given as examples of such a porous body are those prepared by dispersing fine fillers of ceramics such as silica, alumina or montmorillonite in a polymer such as polyamide or polyamide. Such a composite material has superior dimensional stability and heat resistance and is therefore preferable.

In the porous structure of the porous body of the present invention, it is preferable that continuous pores having an opening end at the outside of the porous body be formed uniformly over the inside of the porous body. A honeycomb-like or three-dimensional network porous structure is desirable and a three-dimensional network porous structure is particularly preferable. In the porous body having a three-dimensional network porous structure, the conductive material with which the porous body is impregnated and filled is also three-dimensionally continuous and therefore retained an fixed. Also, because pores to be filled with the conductive material are continued in every direction, it becomes possible t' form three-dimensional wiring and also good conductivity is obtained.

It is to be noted that in the case of a punching sheet in which many through-holes are formed and a mesh sheet obtained by processing fiber by means of plane weaving, such an effect can be unexpected. For example, in a plane-woven mesh sheet as disclosed in the publication of JP-A-10-321989, although a little conduction in a horizontal direction is possible, s large part of conduction in a horizontal direction must be secured above and below the sheet. Accordingly, large irregularities are formed by conductive pattern portions and nonconductive portions. For this, it is difficult to accomplish lamination and to mount semiconductor elements and high frequency characteristics are impaired caused by inconstant thicknesses of layer insulation layers. Also, when a via and wiring are fined, a conductive pattern size is on a level with the thickness of a fiber and it is therefore difficult to form a small die meter via. Furthermore, because the width of wiring is inconstant, high frequency characteristics are significantly impaired. Such a problem is solved by using a porous body provider with three-dimensionally continuous pores having a pore diameter much smaller than the size of the conductive pattern and preferably a pore diameter as small as $\frac{1}{10}$ or less of the size of the conductive pattern.

The porosity of the porous base material used in the present invention is preferably 40 to 95% and more preferably 50 to 85%. When the porosity is too large, the porous base material has unsatisfactory mechanical strength and dimensional stability. On the other hand, when the porosity is too small, it is difficult to fill the conductive material and sufficient conductivity is therefore secured with difficulty.

This porosity can e measured by the observation of the section of the porous base material using an optical microscope, scanning type electron microscope, transmission type electron microscope or by a method such as an immersion method.

Also, the average pore diameter of pores of the porous base material is preferably 0.05 to 5 μm and more preferably 0.1 to 0.5 μm. When the pore diameter is excessively large, it becomes difficult to form fine wiring. On the other hand, when the pore diameter is excessively small, the conductive material is filled with difficulty. The average pore di meter can be measured by measurement of small angle X-ray scattering, measurement of light scattering, or by the observation f the section of the porous base material using an optical micro cope, scanning type electron microscope or transmission type electron microscope.

When a porous substrate is a sheet-like, the 5 times as much range of the thickness of this sheet as the average di meter of a pore is desirable. The more desirable range is 10 times. The still more desirable range is 50 or more times. To a pore diameter, unless the thickness of a sheet is thick enough, it can form neither a conductive material area nor a functional area in the core of a sheet.

(Formation of a Conductive Material Region)

The passive element component and substrate with built-in passive element according to the present invention are provided with a conductive material region. This conductive material region functions as an electrode or wiring for a passive element. The conductive material region maybe a region obtained by filling the aforementioned porous body with a conductive material or may be a region filled with no conductive material.

As the conductive material, metals such as copper, nickel, gold and silver or alloy of these metals, conductive ceramics such as indium tin oxide, carbon materials such as graphite, semiconductors such as highly doped silicon, and conductive polymers such as polyaniline derivatives, polythiophene derivatives and polypyrrole derivatives are used.

No particular limitation is imposed on measures for impregnating and filling the porous base material with these conductive materials at desired positions of the porous base material and widely-spread and known technologies may be used. A microparticle or solution of a conductive material may be printed on the porous body by means of screen printing, relief-printing or the like. Also, an energy ray is a plied to change the penetrability of the irradiated portion thereby making a conductive material penetrate into a specified region. In this case, for example, using a porous body which ha been processed by water-repellent treatment using a fluorine type surface treating agent, a desired region of the porous body is irradiated with an energy ray to remove the fluorine type surf ace treating agent. If this porous body is immersed in, for example, an aqueous solution of a conductive polymer such as polyaniline sulfonate, the conductive polymer penetrates only into the region from which fluorine has been removed. Thereafter, if the porous body is dried, only the region from which fluorine has been r moved can be selectively made to be conductive. Alternatively, as disclosed in the publication of JP-A-6-293837, a specified region of a PTFE porous sheet impregnated with a hydrophilic solution is irradiated with ultraviolet rays to make the exposed portion hydrophilic selectively. Then, if the porous sheet is immersed in an aqueous solution of a conductive polymer in the same manner as above, the irradiated portion can be selectively impregnated with the conductive polymer.

Further, a region where a conductive portion is formed can be produced by allowing a catalyst used in CVD, electroless plating and the like to be generated in or adsorbed to a desired region selectively thereby producing a region where a conductive portion is formed. Also, for example, the surface of pore of a porous sheet is reformed by irradiation with an energy ray, thereby allowing a catalyst to be generated in and adsorbed to the exposed portion or unexposed portion selectively. In this case, the catalyst-generated portion and the catalyst-ad orbed portion can be filled with a conductive material such as a metal by a method such as CVD and electroless plating.

A pattern plating means as proposed in Japanese latent Application No. 2000-159163 by the inventors of the present invention is most preferably used because the process i easy and fine and a highly accurate via and wiring can be formed.

The details of a method of forming the conductive material region preferably used in the present invention will be explained later.

(Formation of Regions Except for the Conductive Material Region)

In the present invention, regions having electromagnetic characteristics such as insulation, high dielectricity and high magnetic permeability respectively are formed in contact with the foregoing conductive material region by filling the porous base material with materials having these characteristics respectively.

For example, each filler is printed on the porous base material by printing such as screen printing or ink jet printing to fill pores with the material though no particular limitation is imposed on a method of producing plural different regions separately.

Usually, it is desirable to carry out these operations after a conductive material to be wiring is filled. If the filler is filled in advance, it becomes difficult to form fine wiring and the like in the subsequent step. For this, it is preferable that a conductive pattern formed by filling a conductive material for wiring be made into a shape easy to fill the porous base material with the filler.

Figure 4A:
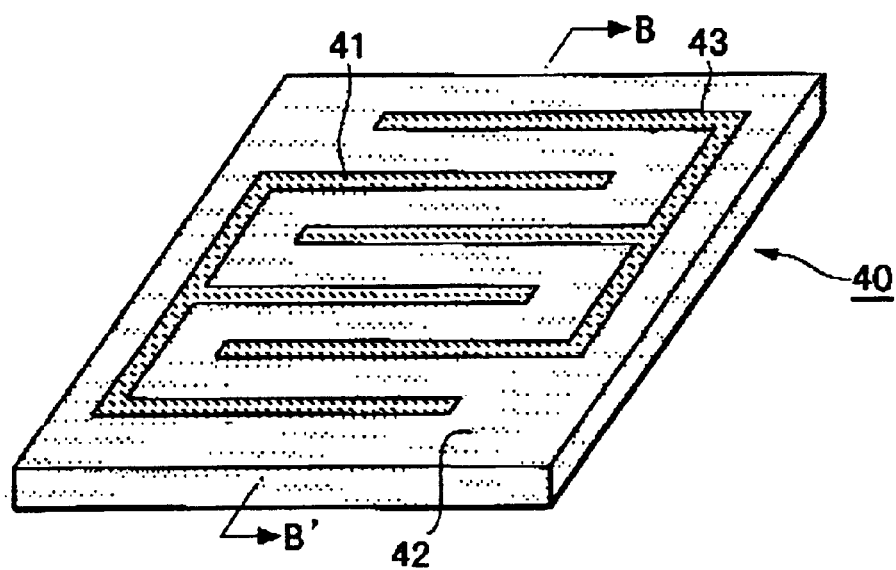
FIG. 4(A) is a perspective view showing a condenser element having a comb type electrode as one example of a passive element according to the present invention and FIG. 4(B) is a sectional view of the element of FIG. 4(A)
Figure 4B:
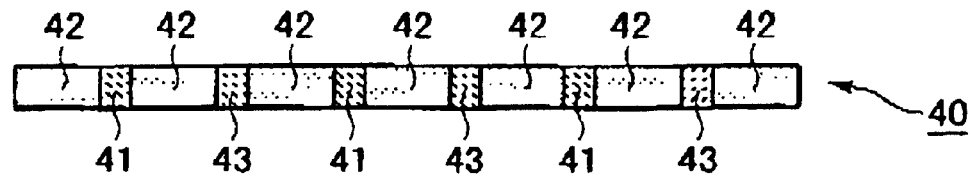

In the case of, for example, a condenser, a simple parallel plate electrode affords a difficulty in filling a filler in a space between the electrodes. For this, it is desirable that a parallel plate electrode be formed in parallel to the direction in which the filler is filled and the length of the electrode in this direction be as short as possible. In order to ensure sufficient condenser capacity while satisfying such a requirement, a comb type electrode type such as those shown in FIG. 4 is desirable. Such a three-dimensionally comb type electrode can be easily formed using measures as explained in, for example, Japanese Patent Application No. 2000-159163.

(Formation of the Insulation Material Region)

A region for forming not a passive element portion such as an antenna and a condenser but wiring is preferably formed by filling a low-dielectric insulation material in pores of the porous base material. Since the dielectric constant of gas is low, it is rather preferable to fill nothing in the pores to obtain low dielectric constant. However, there is a fear that moisture absorption and migration of the conductive material are easily caused and the reliability is lowered and therefore the pore is preferably filled with a low-dielectric material.

The insulation material to be filled in pores of the porous body may be an inorganic material or an organic material, or may be a composite material of these materials. For example, the porous body is made to be impregnated with a solution of a ceramic precursor such as silica sol to fill ceramic or a resin such as a thermoplastic resin or a curable resin may be filled. The curable resin may be a heateurable type, photocurable or electron-ray curable type without any particular limitation. Concretely, for example, an epoxy resin, bismaleimide resin, bismaleimide-triazine resin, benzocyclobutene resin, polyimide resin, polybutadiene resin, silicone resin or polycarbodiimide resin is used. Those obtained by dispersing microparticles of ceramics and the like in these resins may be acceptable. Also, a porous material consisting of these materials may be filled. As the porous material, porous materials having independent pores are superior because these materials have low dielectric constant and migration is scarcely caused.

[Passive element]

The passive element of the present invention will be explained hereinbelow.

Given as examples of the passive element are sensor elements and nonlinear elements as well as resister elements, condenser elements, coil elements. These elements comprises a conductive material region constituting an electrode and a passive element functional material region formed in contact with the conductive material region and the terminal portion of the passive element is formed in the conductive material region. The passive element functional material is a material determining the electric action of the passive element. As the passive element functional material, resistant materials, highly dielectric material, high magnetic permeability materials, pressure-sensitive materials, heat-sensitive materials and moisture-sensitive materials and the like are used.

Figure 11:
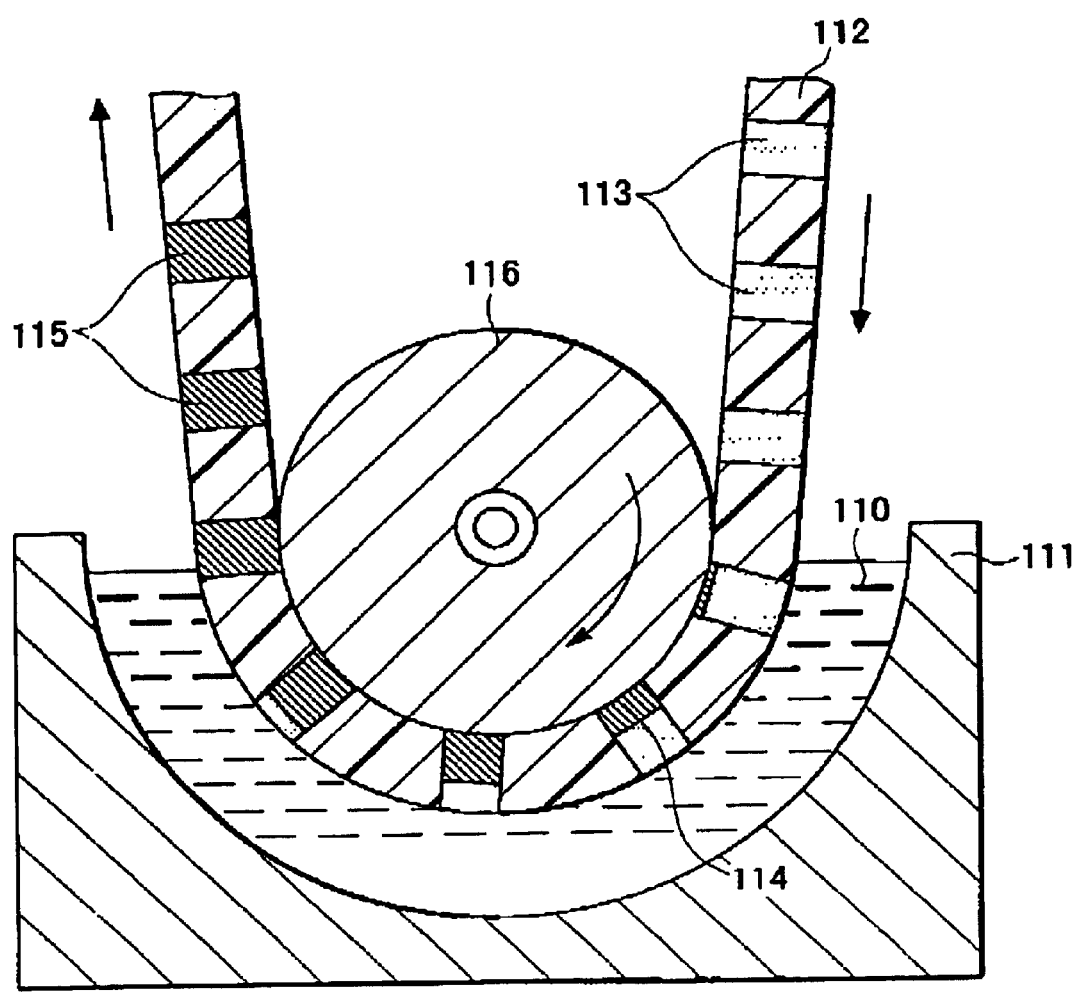
FIG. 11 is a schematic view showing a method of forming a conductive region as a method adoptable in the present invention and a sectional view of a device for forming using a roll-like electrode.
Figure 13:
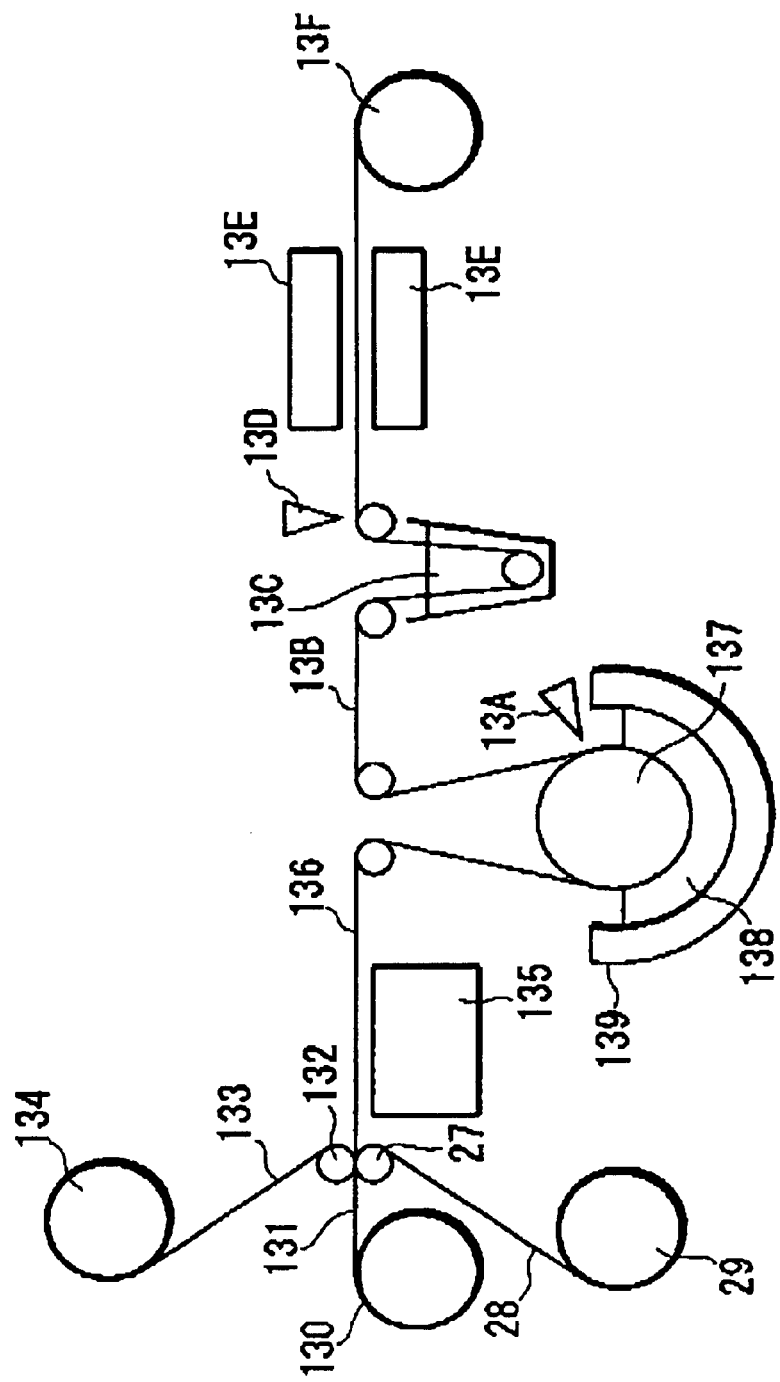
FIG. 13 is a schematic view of another example of a device for forming a conductive region according to the present invention by using a continuous step of "reel to reel".

The fundamental structure of the passive element f the present invention will be explained with reference to FIG. 1. FIG. 1 is a perspective view of the passive element of the present invention. In FIG. 1, 10 represents a passive element constituted by filling a porous base material with each functional material. This porous base material is divided into at least three regions and regions impregnated with plural impregnated layer functional materials differing in electro-magnet characteristics are formed in each of the above three re ions. In FIG. 1, 11 and 13 represent conductive material regions produced by filling the porous base material with a conductive material and these conductive material regions form electrodes of this passive element. Also, 12 represents a passive element functional material region mounted between these conductive material regions. When the passive element functional material to be filled in this functional material region 12 is, for example, a highly resistant material such as a carbon paste, a resistor element is formed, whereas when a high-dielectric material is filled in this functional material region, a condenser element is formed. Also, when this functional material region is filled with, for example, a material which is varied in resistance corresponding to ambient temperature, a heat-sensitive sensor element is formed. Further, if this functional material region is filled with a material which is varied in resistance by absorbing moisture in an ambient atmosphere, a moisture-sensitive element is formed.

Figure 2:
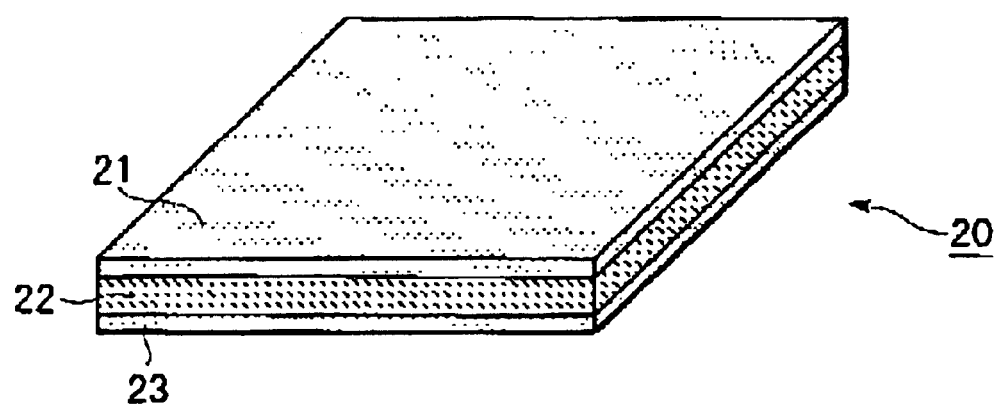
FIG. 2 is a perspective view showing another example of a passive element according to the present invention.

These elements are constituted of two conductive material regions and a functional material region mounted between these conductive material regions. In this passive element, each region may be formed such that it penetrates through the porous base material in the direction of the thickness of the porous base material as shown in FIG. 1 or each region layer may be formed in parallel to the surface of the porous base material as shown in FIG. 2. The arrangement of these regions may be determined so as to have an optimum structure corresponding to the characteristics of an intended passive element. FIGS. 2, 21 and 23 represent conductive regions impregnated with a conductive material and these regions becomes electrodes of the passive element. Also, a region 22 sandwiched between these electrodes is a functional material region.

Also, the passive element is prevented from being affected by ambient moisture by further forming an insulation material region on the outside of the region where this passive element is formed. In this case, a coating layer may be formed over the entire surface of the passive element. Or a coating layer is formed only on the side surface of the element and both end portions are opened as electrode terminal portions.

Further, when the passive element is a coil element, the passive element preferably comprises two regions consisting of a high-permeability material region and a conductive material region formed on the high-permeability material region and an insulation material region which insulates the conductive material region from the ambient.

Various passive elements will be explained herein below.

(Resister Element)

The resister element is formed by arranging a register material region in a region between electrode layers consisting of a pair of conductive material regions.

The region where a resister is formed is preferably filled with a conductive material having a resistance as high as about $10^{-5}$ to $10^{-2}\Omega\cdot cm$. Examples of such a conductive material include alloy materials such as a copper-manganese alloy (manganin), copper-nickel alloy and nickel-chromium-aluminum alloy, metal pastes or carbon pastes prepared by dispersing microparticles of metals such as Pd, Pd—Ag and Cr or carbon microparticle carbon black and a resin binder in a solvent and materials pr pared by dissolving a conductive polymer material and a resin binder in a solvent.

(Condenser Element)

The condenser element is formed by arranging a high-dielectric material region between electrodes consisting of a pair of conductive material regions formed far apart from each other and an insulation material region formed adjacent to the conductive material region or the high-dielectric material.

Figure 3A:
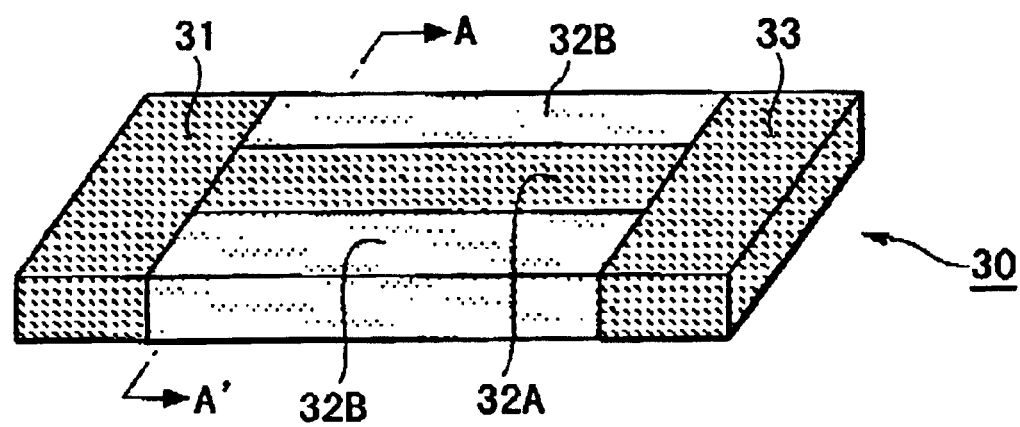
FIG. 3(A) is a perspective view showing a further example of a passive element according to the present invention and FIG. 3(B) is a sectional view of the element of FIG. 3(A)
Figure 3B:
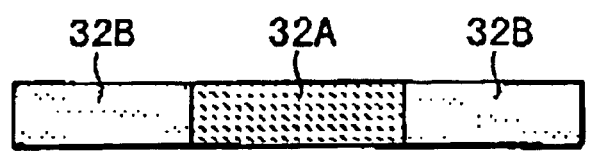

The capacity of the condenser element is dependent n the area of the electrodes facing each other and the distance between both electrodes and it is preferable to form the electrode layer such that it penetrates through the porous base material in the direction of the thickness of the porous base material to be a base material. Also, in order to increase the area of the electrodes facing each other, the condenser element ma have a structure shown in FIG. 2 as a structural body 20 consisting of three layers parallel to the surface of the porous base material and comprising a central dielectric layer 22 and electrodes layers 21 and 23 disposed so as to sandwich the dielectric layer 22 between the both. Also, as shown in FIG. 4, the condenser element may have a structure comprising paired comb type electrodes 41 and 43 embedded in the dielectric region layer 42 in the direction of the thickness of the dielectric region layer 42. Specifically, in FIG. 2, FIG. 3 and FIG. 4, numerals 20, 30 and 40 represent a condenser element. Conductive material regions 21, 23 and 32B which are to be electrodes of the condenser element are formed on the porous base material. Then, a high dielectric material is filled in regions other than these conductive material regions 21 and 23 to form dielectric layer regions 22, 31, 32A and 33. Terminal portions are formed at appropriate places of the above conductive material regions.

The high-dielectric material used in the present invention may be an inorganic material or an organic material or a composite material of these materials. Those having a relative dielectric constant of preferably 5 or more and preferably 10 or more are used.

As the high-dielectric material, for example ceramics, high-dielectric polymers or oligomers or composite materials of ceramics and binders such as polymer are used.

Examples of the ceramics include perovskite type inorganic compounds such as $M1TiO_3$ (where M1 contains at least one element selected from Ba, SrPb, Ca, Mg and Rn) and $M2ZrO_3$ (where M2 contains at least one element selected from Pb, Sr and Ca), an more specifically, barium strontium titanate, strontium titanate, barium titanate, lead titanate, lead lanthanum titanate, calcium titanate, magnesium titanate, barium zirconate titanate lead zirconate titanate, lead lanthanum zirconate titanate, lead zirconate, strontium zirconate and calcium zirconate. Besides the above compounds, microparticles of compounded oxide such as barium magnesium fluoride and bismuth titanate and metal oxides such as titanium dioxide, ditantalum pentaoxide and diyttrium trioxide are used. These ceramics may be used in a manner that, for example, a micronized ceramics is dispersed in a solvent and the porous body is impregnated with the dispersion to thereby fill the ceramics. Also, after the porous body is impregated with a sol solution of these ceramics, the sol solution is gelled to thereby fill the ceramics.

As the high-dielectric polymer or oligomer, for example cyanoethyl group-containing polymers and oligomers such as cyanoethyl cellulose (relative dielectric constant: 16), cyanoethylhydroxyethyl cellulose (relative dielectric constant: 18), cyanoethylhydroxypropyl cellulose (relative dielectric constant: 14), cyanoethyldihydroxypropyl cellulose (relative dielectric constant: 23), cyanoethyl amylose (relative dielectric constant: 17), cyanoethylstarch (relative dielectric constant: 17), cyanoethyldihydroxypropyl search (relative dielectric constant: 18), cyanoethyl pullulan (relative dielectric constant: 18), cyanoethyl glycidol pullulan (relative dielectric constant: 20), cyanoethylpolyvinylalcohol (relative dielectric constant: 20), cyanoethylpolyhydroxymethylene (relative dielectric constant: 10), cyanoethyl sucrose (relative dielectric constant: 25) and cyanoethyl sorbitol (relative dielectric constant: 40) and vinylidene type polymers such as polyvinylidene fluoride (relative dielectric constant: 11) and vinylidene fluoride/trifluoroethylene copolymers (55/45: relative dielectric constant: 18, 75/25: relative dielectric constant: 10) are used.

As these materials, for example, the following commercially available products may be utilized: cyanoethylhydroxyethylcellulose (trademark: Cyano Resin CR-E, manufactured by Shin-Etsu Chemical Co., Ltd.), cyanoethyl pullulam (trademark: Cyano Resin CR-S, manufactured by Shi-Etsu Chemical Co., Ltd.), cyanoethylpolyvinyl alcohol (trademark: Cyano Resin CR-V, manufactured by Shin-Etsu Chemical Co., Ltd.) and cyanoethyl sucrose (trademark: Cyano Resin CR-U, manufactured by Shin-Etsu Chemical Co., Ltd.).

These products may be used either independently or by mixing plural types. The porous body is impregnated with each of these polymers or oligomers made into a solution state to thereby fill each.

As the composite body of ceramics and a polymer, for example, those obtained by dispersing microparticles of ceramic such as those aforementioned in a polymer are used.

Such a dispersion may be produced by compounding microparticles of ceramics in a polymer or by mixing a sol solution of ceramics with a polymer solution. When the microparticles of ceramics are much smaller than the pore diameter of the porous body, the ceramics is filled in the porous body more easily.

As microparticles of the foregoing ceramics, the following commercially available products maybe utilized: barium titanate (trademark: BT-01, average particle diameter: 100 nm; trademark: BT-02, average particle diameter: 200 nm; trademark: BT-03, average particle diameter: 300 nm; trademark: BT-04, average particle diameter: 400 nm; trademark: BT-05, average particle diameter: 500 nm, all of these products are manufactured b SAKAI CHEMICAL INDUSTRY CO., LTD.), strontium titanate (trademark: ST-03, manufactured by SAKAI CHEMICAL INDUSTRY CO., LTD., average particle diameter: 300 nm), barium strontium titanate (manufactured by SAKAI CHEMICAL INDUSTRY CO., LTD., average particle diameter: 300 nm), barium zirconate titanate (trademark: BTZ-01-9010 and BTZ-01-8020, average particle diameter: 100 nm; trademark: BTZ-05-9010 and BTZ-05-8 20, average particle diameter: 500 nm, all of these products are manufactured by SAKAI CHEMICAL INDUSTRY CO., LTD.), lead zirconate titanate (manufactured by SAKAI CHEMICAL INDUSTRY CO., LTD., average particle diameter: 200 to 500 nm), strontium zirconate (trademark: SZ-03, manufactured by SAKAI CHEMICAL INDUSTRY CO., LTD., average particle diameter: 300 nm), calcium titanate (trademark: CT-03, manufactured by SAKAI CHEMICAL INDUSTRY CO., LTD., average particle diameter: 300 nm), calcium zirconate (trademark: CZ-03, manufactured by SAKAI CHEMICAL INDUSTRY CO., LTD., average particle diameter: 300 nm), titanium dioxide (manufactured by Shinku Yakin-sha, average particle diameter: 30 nm), titanium dioxide (manufactured by C. I. Kasei-sha, average particle diameter: 30 nm), titanium dioxide (trademark: ST-01and ST-31, average particle diameter: 7 nm; trademark: ST-21, average particle diameter: 20 nm; trademark: ST-41, average particle diameter: 50 nm, all of these products are manufactured by Ishihara Sangyo Kaisha), diyttrium trioxide (C. I. Kasei-sha, average particle diameter: 20 nm) and titanic acid-zirconic acid compounds (trademark: ZTO-5347, average particle diameter: 100 nm, manufactured by SAKAI CHEMICAL INDUSTRY CO., LTD.).

As the polymer of the binder for dispersing these ceramics microparticle, epoxy resins, bismaleimide resins, bismaleimide-triazine resins, benzocyclobutene resins polyimide resins, polybutadiene resins, silicone resins, polycarbodiimide resins or the like maybe used or high-dielectric polymers such as those aforementioned may be used.

As the binder, ceramics or composite materials of ceramics and organic materials may be used.

As ceramics to be used as the binder, besides silica and silicon nitride, for example, amorphous materials using almost as a major constituent, a metal oxide including tantalum oxide, yttrium oxide, titanium oxide or aluminum oxide and amorphous materials using almost as a major constituent, a compounded oxide including barium strontium titanate, strontium titanate, barium titanate, lead titanate, lead lanthanum titanate, calcium titanate, magnesium titanate, barium zirconate titanate, lead zirconate titanate, lead lanthanum zirconate titanate, lead zirconate, strontium zirconate, calcium zirconate, barium magnesium fluoride or bismuth titanate are used.

When silica or a composite of silica and an organic material is used as a binder, for example polysilazane or silsesquioxanes may be used as a precursor of the binder. As polysilazne or silsesquioxanes, for example, following commercially available products may be utilized: poly(1,1-dimetbylsilazane) telomer (PSN-2M01, manufactured by Chisso Corporation), poly(1,1-dimethylsilazane) crosslinker (PSN-2M02, manufactured by Chisso Corporation), poly (1,2-dimethylsilazane) (PNS-2M11, manufactured by Chisso Corporation), poly(2-chloroethyl) silsesquioxane (SST-CE1, manufactured by Chisso Corporation) and poly (2-bromoethyl) silsesquioxane (SST-BBE1, manufactu ed by Chisso Corporation). Also, a methoxypropyl alcohol solution of a-chloroethylsilsesquioxane (trademark: Seramic SI, manufactured by Chisso Corporation) may be utilized.

A dispersion prepared by dispersing high-dielectric inorganic compound particles in a solution of each of these silica precursors is applied and calcined at about 200° C. or less in an atmosphere or in an atmosphere with supplying steam, whereby a ceramic microparticle dispersion containing amorphous silica as a binder can be obtained. Also, if UV-curable type Gelest Seramic SI (manufactured by Chisso Corporation) of a methoxypropyl alcohol solution of a-chloroethylsilsesquioxane is used, amorphous silica can be obtained by only deep UV-ray irradiation.

When silicon nitride used as an inorganic material or a composite of silicon nitride and an organic material is used as a binder, polysilazane is exemplified as the precursor of the binder.

As the polysilazane, for example the following commercially available products may be utilized: poly (1,1-dimethylsilazane) telomer (PSN-2M01, manufactured by Chisso Corporation), poly(1,1-dimethylsilazane) crosslinker (PSN-2M02, manufactured by Chisso Corporation) and poly (1,2-dimethylsilazane) (PNS-2M11, manufactured by Chisso Corporation).

A dispersion using a solution in which each of these polysilazanes is dissolved is applied and calcined at about 200° C. or less in an inert gas atmosphere, whereby a ceramic fine particle dispersion containing amorphous silicon nitride as a binder can be obtained.

In the case of amorphous materials using almost as a major constituent, a metal oxide including silica, tantalum oxide, yttrium oxide, titanium oxide or aluminum oxide and amorphous materials using almost as a major constituent, a compounded oxide including barium strontium titanate, strontium titanate, barium titanate, lead titanate, lead lanthanum titanate, calcium titanate, magnesium titanate, barium zirconate titanate, lead zirconate titanate, lead lanthanum zirconate titanate, lead zirconate, strontium zirconate, calcium zirconate, barium magnesium fluoride or bismuth titanate, a dispersion using a solution in which a precursor containing an alkoxide of the contained metal element is dissolved is applied to hydrolyze this solution and to scatter only an organic component by prebaking performed at a temperature less than 400° C. and preferably 200° C. or less, whereby a ceramic fine particle dispersion containing each of these amorphous material as a binder can be obtained. A metal alkoxide polymer maybe utilized.

As the precursor containing each of these alkoxide, the following commercially available products may be utilized: trademarks: Si-05S, PS-05S, BPS-05S, BS-05S, Ti-03-S, Al-03-P, Ta-10-P, Y-03, PLZT-20, PLZT-10, PZT-20, PZT-10, PT-25, T-10, ST-06, BT-06, BST-06-P, MT-05, PZ-20, SZ-10-3, LN-03, T-03, SYM-SI05, SYM-TA05 and SYM-T105 (all of these product are manufactured by Kojundo Kagaku-sha) and trademark: Seramic BST (manufactured by Chisso Corporation).

(Coil Element)

Figure 5:
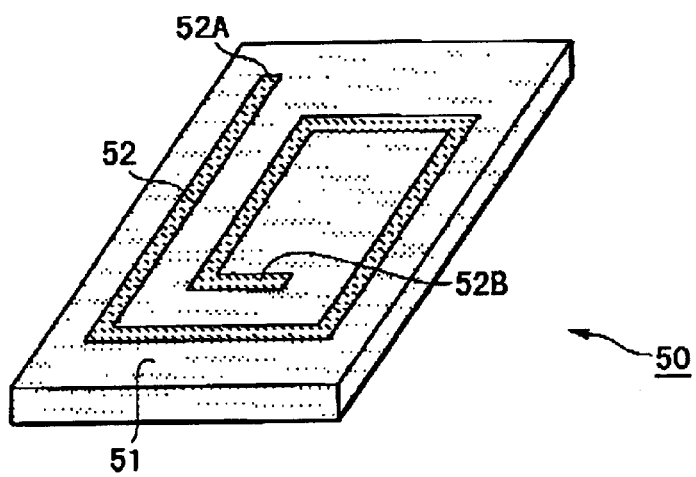
FIG. 5 is a perspective view showing a coil element which is one example of a passive element according to the present invention.

The coil element is formed from a conductor formed adjacent to the high-permeability material layer. As shown in FIG. 5, the conductor is made to have a winding structure, and conductive layers are respectively formed on both surfaces of the base material and electrically connected with each other to increase inductance.

In FIG. 5, 50 represents a coil element. A porous base material 51 is filled with a high-permeability material. Then, a conductor 52 is formed on the surface of the porous base material 51 in a spiral form. The terminals of the coil element are led out from the ends 52A and 52B of the conductor. In FIG. 5, a conductor having the same pattern is formed on the opposite surface and a connecting portion penetrating through the porous base material is formed whereby an element increased in inductance can be formed. Also, a spiral coil element having a center axis parallel to the horizontal direction of the porous sheet may be formed in the porous sheet.

As the high-permeability material suitable for use in the present invention, for example, a resin composition cont 10 to 70% by weight of microparticles of alumina or Mn-Z or Ni—Zn type ferrite is preferably used. Microparticles of ferrite are exemplified. Because microparticles off ferrite and the like are conductive, materials the surface of which is coated with an insulation material such as a polymer are preferable as the high-permeability material.

As to elements other than the passive elements explained above, various passive elements may be formed in the same manner as in the case of the aforementioned elements by selecting proper materials as materials filled in the foregoing passive element functional material region.

[Passive Element Composite Component]

The second aspect of the present invention resides in a passive element composite component. According to this aspect, plural passive elements formed on the foregoing porous base material are electrically connected with each other to make a composite component having necessary circuits such as filter circuits and resonance circuits.

The passive element composite component of the present invention is produced as follows. Specifically, a single porous base material is divided into plural passive element regions and the porous base material corresponding to each element region is filled with a material having optimum electromagnetic characteristics to form a necessary passive element. These element regions are electrically connected with each other to make a composite component in which plural passive elements are mounted on a single porous base material. When, in the present invention, the porous base material is divided into plural passive element regions, it is desirable to compart each region by an insulation material so as not to affect each other.

Figure 6:
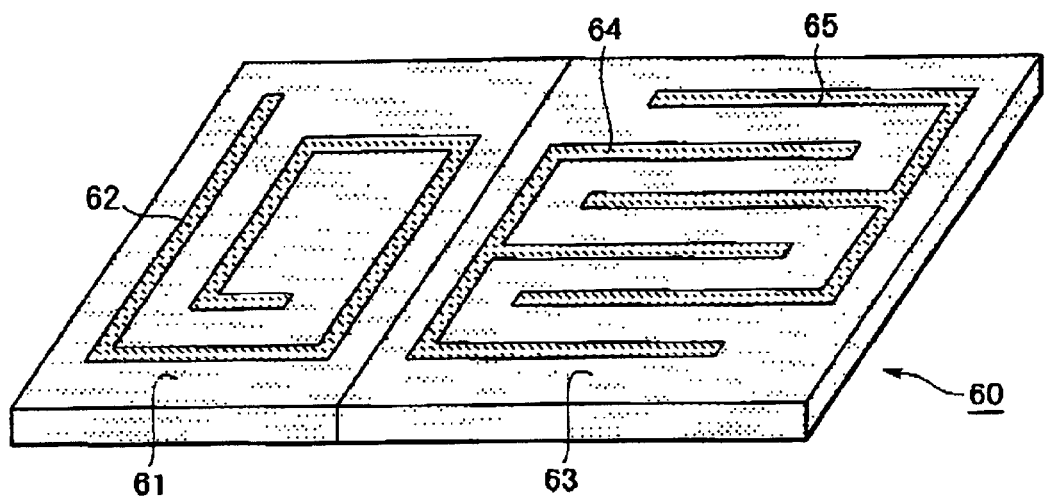
FIG. 6 is a perspective view showing one example of a passive element composite component according to the present invention.

One example of the passive element composite component of the present invention will be explained with reference to FIG. 6. FIG. 6 shows a composite component in which a coil element and a condenser element are mounted on a porous base material. The porous base material is divided into a coil element region 61 and a condenser element region 63.

The porous base material corresponding to the coil element region 61 is filled with a high-permeability material and also, a conductive layer 62 of the coil element is formed on the surface of the coil element region 61. This conductive layer 62 of the coil element maybe provided in a manner that it penetrates t rough the porous base material in the direction of the thickness of the porous base material or may be formed only on the surface of the porous base material. This coil element may be formed as a laminate coil by forming the conductive layer 62 on both front and back surfaces of the porous base material and by making electrical connection penetrating through the porous base material.

In the porous base material corresponding to the condenser element region 63, on the other hand, paired electrodes 64 and 65 which penetrate through the porous base material in the direction of the thickness of the porous base material a d are filled with a conductive material are provided so as to face each other and a high-dielectric material is filled in a space between both electrodes.

Electrodes are led out of the conductive layer of these passive elements and thus a composite component having a necessary function is formed by connecting wiring formed on the surface of the porous base material or by external wiring. This wiring may be formed by soldering a copper wire to an electrode-leading portion or made using print wiring techniques. Of course, the wiring layer may be formed inside of the porous base material.

[Substrate with a Built-in Passive Element]

The third aspect of the present invention reside in a substrate with a built-in passive element comprising a single passive element or plural passive elements formed in the inside of the porous base material or on the base material and wiring for connecting these passive elements.

This substrate with a built-in passive element may be provided with an electronic component-mounting region for mounting an antenna, semiconductor chip and other electronic components. In this case, when the electromagnetic characteristics of the substrate to which electronic components to be mounted are adjacent affect the characteristics of the electronic components, the characteristics of the electronic components to be mounted can be improved by filling the porous base material region with a material having this electromagnetic characteristics. For example, when an antenna element is mounted, it is desirable to fill a high-dielectric material in the porous base material corresponding to a region where the antenna element is to be mounted because the efficiency is improved if the antenna element is mounted on a substrate made of a high-dielectric material.

Figure 7A:
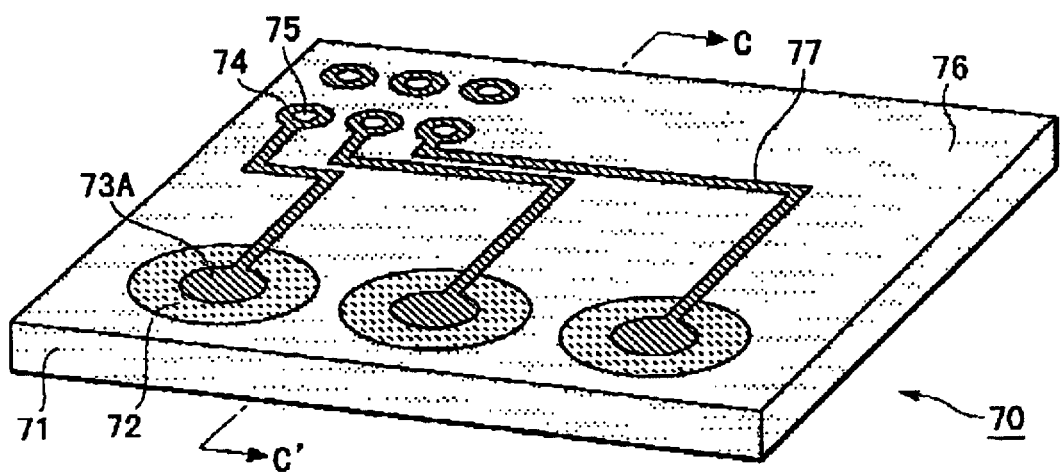
FIG. 7 is a perspective view showing one example of a substrate with a built-in passive element according to the present invention.

One example of the substrate with a built-in passive element according to the present invention is shown in FIG. 7(A). FIG. 7(A) shows a structure in which a condenser element region, wiring region and electronic component-mounting region are formed on a substrate 70. On the porous base material 71, a region 72 filled with a high-dielectric material is formed. A conductive layer 73A to be an electrode of the condenser element is formed on the surface of the region 72. A conductive layer, though not shown, is formed also on the corresponding position of the base material on the side opposite to the conductive layer 73A. These pared conductive layers forma condenser element. A region 76 filled with a low-dielectric material is formed in a region other than this high-dielectric material region. In this low-dielectric material region, a wiring 77 and a terminal portion 74 provided with a through-hole 75 for mounting electronic components are formed.

Figure 7B:
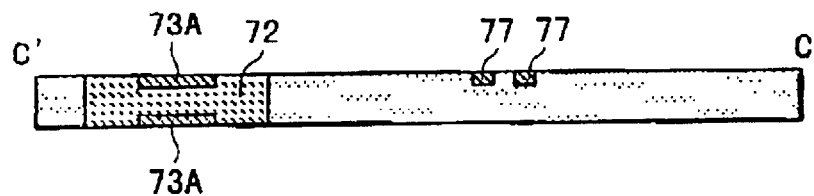

Also, FIG. 7(B) is a sectional view along the line C–C' in the substrate with a built-in passive element of FIG. 7(A). In the condenser element region, as shown in FIG. 7(B), a conductive layers 73A can be formed on both surfaces of the porous base material and a high-dielectric material layer 72 can be formed in a region sandwiched between two conductive layers. As to the wiring region 77, a conductive region 77 may be formed only on the surface of the porous base material 76 or may be formed so as to penetrate through the porous base material 76 in the direction of the thickness of the base material 76 as shown in FIG. 7(B).

Since the high-dielectric region, the low-dielectric region and the like are formed separately on one substrate, wiring density and packaging density can be improved with ease.

Also, since the high-dielectric region and the low-dielectric region are fabricated such that they are integrated with one porous sheet, peeling is scarcely caused between layers. Because the wiring is formed by filling the porous sheet with a conductive material, breaking of a wire and the like are scarcely developed even in the case where wiring is formed in a manner that it is extended over different regions.

(Composite Circuit Substrate)

The composite circuit substrate of the present invention is produced by dividing a single porous base material into plural regions for mounting components and by filling materials having different electromagnetic characteristics in pores of the porous base material corresponding to each component-mounting region. For example, a region filled with a low-dielectric material and a region filled with a high-dielectric material are formed on a porous base material. A circuit for treating high-frequency signals in the former region and an antenna element is formed in the latter region. Such a composite circuit substrate makes it possible to improve the density of electronic circuit packaging because substrates differing in qualities can be formed on a single porous base material.

Plural component-mounting regions are formed on this composite circuit substrate. Through-holes, circuit wiring, via-holes and the like which are formed in a usual multilayer wiring substrate for mounting these components can be formed in the same manner as above. Also, the composite circuit substrate of the present invention can be fabricated as a flexible substrate or as a rigid multilayer wiring substrate.

As explained above in detail, the present invention enables the provision of a composite material which is free from a layer peeling problem and can be used as a wiring substrate for a radio module ensuring high density packaging, for self-containing a passive element and the like.

(Details of the Formation of the Conductive Material Region)

A method of forming the conductive material layer suitable for the purpose intended to adopt it in the present invention will be explained in detail.

A first embodiment of the method of forming a conductive region suitable for the purpose intended to apply the present invention comprises a process performed through the following pattern forming step, adsorbing step and plating step:

Light-sensitive layer forming step: a step of forming a light-sensitive layer in which an anion exchange group is generated or eliminated and which has swelling characteristics by irradiating the surface of a substrate with an energy ray; Energy line irradiation step: a step of forming a pattern of an anion exchange group in which pattern an anion exchange group is formed on the irradiated portion or non-irradiated portion by irradiating the foregoing light-sensitive layer with an energy ray;

Adsorbing step: a step of adsorbing a metal-containing ion, a metal-containing compound or a metal colloid to the foregoing pattern of the anion exchange group; and Plating step: a step of forming a conductive pattern by carrying out electroless plating on the pattern of the anion exchange group to which the foregoing metal-containing ion, metal-containing compound or metal colloid is adsorbed.

A second embodiment of the method of forming a conductive region suitable for the purpose intended to apply the present invention comprises a process performed through the following light-sensitive forming step, energy ray irradiation step, adsorbing step and plating step:

Light-sensitive layer forming step: a step of forming a light-sensitive layer having at least an acyloxime derivative group-containing compound or an azide derivative group-containing compound which generates an anion exchange group by irradiating the surface of a base material with an energy ray.

Energy line irradiation step: a step of forming a pattern of an anion exchange group in which pattern anion exchange group is formed on the irradiated portion or non-irradiated portion by irradiating the foregoing light-sensitive layer with an energy ray;

Adsorbing step: a step of adsorbing a metal-containing ion, a metal-containing compound or a metal colloid to the foregoing pattern of the anion exchange group; and Plating step: a step of forming a conductive pattern by carrying out electroless plating on the pattern of the anion exchange group to which the foregoing metal-containing ion, metal-containing compound or metal colloid is adsorbed.

A third embodiment of the method of forming a conductive region suitable for the purpose intended to apply the present invention comprises the following step of arranging electrodes, step of reforming a surface portion, step of making a plating solution penetrate and electrolytic plating step:

Step of arranging electrodes: a step of arranging electrodes on the foregoing porous body;

Step of reforming a surface portion: a step of forming a pattern in which the affinity of the reformed portion to water is made to differ from the affinity of the unreformed portion to water by reforming a part of the foregoing porous body to change the surface energy thereof;

Step of making a plating solution penetrate: a step of making a plating solution selectively penetrate an insulation region of the reformed and unreformed portions in the porous body selected and disposed adjacent to the surface of the foregoing electrodes; and Electrolytic plating step: a step of forming a conductive portion by energizing the electrodes to precipitate an electrolytically plated metal in the foregoing region.

In the aforementioned third embodiment of the present invention, the foregoing light-sensitive layer is preferably a light-sensitive layer in which an ion exchange group is generated or eliminated by irradiation with an energy ray. Also, the foregoing ion exchange group is preferably an anion exchange group.

In the above first, second and third embodiments, the foregoing anion exchange group is preferably an amino group each of these embodiments of the method of forming the conductive region will be explained in detail.

[1] Method of Producing a Composite Material (First Embodiment)

First, each production step in the first embodiment of a method of producing a composite material will be explained. In the following explanations, each step will be explained for the sake of understanding of the method of the production of the composite material which is the first embodiment of the present invention.

(1) Production Step

The method of the production of the composite material which is the first embodiment of the present invention is fundamentally constituted of each of the step of forming a light-sensitive layer, energy ray irradiation step, adsorbing step and plating step shown below.

(A) Step of Forming a Light-sensitive Layer

First, a light-sensitive layer in which an anion exchange group is generated or eliminated by irradiation with an energy ray and which has swelling characteristics is formed on the surface of a base material. When manufacturing a wiring substrate and the like, an insulation base material is used.

Also, there is no particular limitation to the shape of the base material and the present invention may be applied to base materials having various shapes such as a plate shape, line shape, cylinder shape and sphere shape. If a porous base material is used in particular, a conductive pattern may be formed in the inside of the porous base material.

Although no particular limitation is imposed on a method of forming the light-sensitive layer on the base material, the light-sensitive layer is usually formed, for example, by applying a solution of the light-sensitive agent to the base material. The layer thickness of the light-sensitive layer to be applied is designed to be in a range generally from about 0.5 to 1000 nm, preferably from 1 to 100 nm and more preferably from 20 to 50 nm, though no particular limitation is imposed on it.

(B) Energy Ray Irradiation Step

The base material formed with the light-sensitive layer is irradiated with an energy ray to form a pattern of an anion exchange group. For example, if a light-sensitive layer which generates an anion exchange group by irradiation with an energy ray is used, the light-sensitive layer formed on the base material is irradiated with patterned light to generate an anion exchange group on the irradiated portion of the light-sensitive layer. The irradiation with patterned light may be carried out by using an exposure mask or by scanning a laser ray. Alternatively, the irradiation with patterned light may be carried out, for example, by modulating the light from a light source by a micro-mirror array in which a large number of micro-sized mirrors are arranged matrix-wise.

When a porous base material is used, the porous base material is exposed to light penetrating into the inside of a pore whereby a conductive pattern can be formed in the inside the pore.

As to the condition of the above process for irradiation with an energy ray, the process is usually carried out using, example, a high pressure mercury lamp as the light source exposing the base material at an exposure amount of about to 10000 $mJ/cm^2$ through a mask with the same pattern. The exposure may be carried out, for example, by using a mask, or scanning a laser ray, or by modulating the light from a light source by a micro-mirror array in which a large number of micro-sized mirrors are arranged matrix-wise.

(C) Adsorbing Step

Next, a plating catalyst (plating nucleus), or metal-containing ion, metal-containing compound or a metal colloid which is a precursor of the catalyst is adsorbed to the med pattern of the anion exchange group.

(Metal-containing Ion)

An anion is used as the metal-containing ion. The anion ms a salt in combination with the anion exchange group and absorbed as a counter ion of the anion exchange group.

(Metal-containing Compound)

As the metal-containing compound, a compound having a connecting group which can be combined with the anion exchange group is used. This connecting group is combined with the anion exchange group, so that the compound is adsorbed.

(Metal Colloid)

As the metal colloid, for example, one which is negatively charged is used. The charged metal colloid was electrostatically adsorbed to an ionized anion exchange group.

(Metalization)

The metal-containing ion, metal-containing compound or a metal colloid serves as a catalyst in the subsequent electrolytic plating step. When the metal-containing ion or the metal-containing compound is adsorbed, it is reduced to metallize the metal ion according to the need. The metallization improves the catalytic ability in the electrolytic plating.

The above adsorption operation is carried out generally, for example, by soaking the base material formed with the pattern of the anion exchange group in a solution of the above metal-containing ion, metal-containing compound or metal colloid. The soaking time is designed to be in a range between about 10 seconds and 5 hours. The light-sensitive layer which can be swelled is swelled by these solutions of a plating nucleus and the solution is penetrated into the inside of the light-sensitive layer. Therefore, the plating nucleus can be adsorbed not only to the surface layer of the light-sensitive layer but also to the anion exchange group present inside of the layer. This enables an increase in the amount of adsorption of the plating nucleus, leading to the result that the plating time can be shortened and the conductance of the formed conductive pattern can be heightened.

(D) Plating Process

A conductive pattern is formed by electroless plating of copper or the like, using the adsorbed metal containing ion, metal containing compound or metal colloid as catalyst nucleus.

When using a photosensitive material containing a compound which loses its ion exchange radical by exposure, a negative pattern is formed in which the ion exchange radical is left over in the nonilluminated area in the energy beam irradiation process.

Or by losing the anion exchange capability by reaction of anion exchange radical generated in the illuminated area by pattern irradiation selectively with fluorine compound or the like, and exposing or heating the entire surface, an anion exchange radical is generated in the nonilluminated area of the preceding pattern irradiation process, and the metal containing ion, metal containing compound or metal colloid may be adsorbed on this anion exchange radical as plating means.

This operation requires two steps of exposure and heating operation. Therefore, the plating method of adsorbing the metal containing ion, metal containing compound or metal colloid directly on the anion exchange radical formed by pattern irradiation is simple in process and excellent in the dimensional stability of the manufactured compound material.

The copper electroless plating solution important for wiring material is often a strong alkali. Therefore, if a cation exchange radical is used, the photosensitive layer may be melted into the strong alkaline plating solution, or may be peeled off easily. By contrast, when an anion exchange radical is used, since resistance to plating solution is excellent, flawless plating is expected.

A manufacturing method of compound material in a first aspect of the invention is very effective when rock crystal, glass or carbon is used as base material.

Usually, in rock crystal or glass, silanol radicals are present on the base material surface. On the surface of carbon base material, usually, carboxyl radicals are present. The silanol radical or carboxyl radical functions as cation exchange radical, and adsorbs the plating catalyst or its precursor such as metal cation or metal colloid.

Accordingly, in the conventional plating method of adsorbing plating catalyst (metal cation or the like) on the cation exchange radical, the plating catalyst is adsorbed also on the silanol radical or carboxyl radical on the base material surface. As a result, abnormal plating is likely to deposit on an undesired area of base material surface.

By contrast, plating catalyst adsorbed on anion exchange radical is hardly adsorbed on the silanol radical or carboxyl radical. Therefore, abnormal deposition of plating can be prevented. Not limited to rock crystal, glass or carbon, cation exchange radicals formed by oxidation of the base material are often present on the base material surface.

In particular, when treated with oxygen plasma in order to improve wettability, a lot of cation exchange radicals are formed on the base material surface. For example, in the case of polymer base material of carbon compound, carboxyl radicals are formed. The use of anion exchange radical as the radical for adsorbing the plating catalyst is very effective for preventing abnormal deposition of plating.

Further, anion exchange radicals such as amino radicals hardly corrode conductive parts formed of copper, nickel or other metals. The radical adsorbing the plating catalyst is leftover between the base material and plating deposit. Accordingly, when cation exchange radicals, which are acidic, are left over, they are likely to corrode the conductive parts. There is no such possibility in anion exchange radicals. The use of anion exchange radical is very effective when forming a conductive part made of a metal.

Moreover, the amino radical and others can harden the curing resin such as epoxy resin. After plating deposition, or after adsorbing the plating catalyst, if amino radicals can be generated in other area than plating deposition area, the curing resin impregnated in a porous material can hardened with an excellent adhesion with the base material surface.

Yabe et al. disclosed a technique of forming a pattern of amino radical on a base material surface, adsorbing plating catalyst thereon, and then applying electrolessplating (morning issue of Feb. 19, 1993, Nippon Keizai Shimbun). In this technique, a polytetrafluoroethylene substrate is used as the base material, and it is irradiated with an excimer laser in hydrazine gas atmosphere. When the polytetrafluoroethylene in the illuminated area reacts with hydrazine, an amino radical is generated. This technique requires irradiation with excimer laser of high energy in order to react with a non-phostosensitive base material. Besides, in order to irradiate in the hydrazine gas atmosphere, the base material is put in a chamber filled with hydrazine gas, and hence the irradiation equipment is expensive and the through-put cannot be raised. Other method is proposed, in which excimer laser is emitted in the contact state of base material and aqueous solution, and hydrophilic radicals are generated on the base material surface, but it involves various problems because a liquid substance is handled in the exposure equipment. Yet, since beams of short wavelength of excimer laser and the like are almost completely absorbed in the resin, if a porous material is used, for example, as the base material and it is attempted to plate into the inner parts of the porous material, the light emitted to the base material is absorbed, the inside of the porous material is hardly illuminated efficiently. In the invention, by contrast, since the photosensitive layer absorbing energy beams is formed only thinly on the base material surface, the inside can be illuminated sufficiently if the base material is a porous material.

The electroless plating condition is not particularly specified, but generally the temperature of the plating solution is set somewhere between 20 and 60° C., and the plating time is set in a range of 30 minutes to 10 hours.

(2) Detailed Description of Each Process

Each process of manufacturing method of compound material in a first aspect of the invention is described in detail below. In the following description, the metal containing ion, metal containing compound, and metal colloid may be generally called as plating nucleus.

(A) Base Material
(a) Material Composing Base Material

Base material for forming conductive parts is not particularly specified, and various inorganic materials or organic materials may be used. For example, polymers, ceramics, carbon, and metals may be used.

When a compound material such as wiring board forming wirings and via holes is formed as a conductive part, the base material is preferred to be an insulator. An insulating base material for forming the conductive part may be any insulating material, and specifically polymers and ceramics may be used.

(Polymer)

Examples of the polymer include resins hitherto used widely as insulator of printed wiring board such as epoxy resin, bis-maleimide-triazine resin, PEEK resin, and butadiene resin, and further include polyethylene, polypropylene, other polyolefins, polybutadiene, polyisoprene, polyvinyl ethylene, other polydienes, polymethylacrylate, polymethylmethacrylate, other acrylic resins, polystyrene derivative, polyacrylonitrile, polymethacrylonitrile, other polyacrylonitrile derivatives, polyoxymethylene, other polyacetals, polyethylene terephthalate, polybutylene terephthalate, other polyesters containing aromatic polyesters, polyallylates, aramid resin, other aromatic polyamides, nylons, other polyamides, polyimides, epoxy resins, poly-p-phenylene ether, other aromatic polyethers, polyether sulfones, polysulfones, polysulfides, polytetrafluoroethylene (PTFE), other fluorine polymers, polybenzoxazoles, polybenzothiazoles, polyparaphcnylene, other polyphenylenes, polyparaphenylene vinylene derivatives, polysiloxane derivatives, novolak resins, melamine resins, urethane resins, polycarbodiimide resins, and others.

(Ceramics)

Examples of the ceramics include silica, alumina, titania, potassium titanate, other metal oxides, silicon carbide, silicon nitride, aluminum nitride, and others.

Among these insulating base materials, polymers are preferred because of low dielectric constant and other properties, and in particular, owing to excellent heat resistance, liquid crystal polymers such as polyimides and aromatic polyimides, and fluorine polymers such as polytetrafluoroethylene are preferably used.

(b) Shape of Base Material

In the invention, when forming a conductive part in a stereoconfiguration, for example, when forming a conductive part also in the thickness direction, not limited to the plane direction, on a sheet of insulator, a conductive part of a high precision can be easily formed by using a porous material having consecutive pores made of the insulating material as mentioned above as the insulator.

Using the porous material, the plating depots in the pores of the porous material. As a result, a steric conductive part composed of a deposit impregnated region is formed in the porous material. In this conductive part, if the consecutive pores are continuous three-dimensionally, it is an isotropically conductive compound realized by mutual penetration of deposits and the insulating material composing the porous material. The conductive part of solid shape composed of such compound can be used as three-dimensional wiring, multilayer wiring, or via holes for interlayer connection of multilayer wiring.

(Porous Material)

As the porous material, specific examples include a porous sheet forming three-dimensional consecutive pores in a sheet of polymer material or the like, cloth having polymer fibers or ceramic fibers entangled in three-dimensional mesh form, and nonwoven cloth.

More specifically, for example, a sheet of crystalline polymer such as polypropylene or polytetrafluoroethylene is drawn and manufactured, or a porous material of polyimide or the like may be formed by making use of spidanol decomposition of polymer, micro phase separation, or other phase separation phenomenon.

Cloth and nonwoven cloth may be manufactured from ceramic fibers or polymer fibers.

Examples of ceramic fibers include silica glass fiber, alumina fiber, silicon carbide fiber, potassium titanate fiber, and others.

Polymer fibers include, for example, aromatic polyamide fibers, aromatic polyester fibers, other liquid crystal fibers and high Tg polymer fibers, PTFE fibers, other fluorine polymer fibers, polyparaphenylene sulfide fibers, aromatic polyimide fibers, polybenzoxazole derivative fibers, and others.

The ceramic fibers and polymer fibers may be mixed, or compound fibers of ceramics and polymer may be used.

The nonwoven cloth is more preferable than the cloth because the fibers are entangled three-dimensionally and the pore size is uniform. The nonwoven cloth is, for example, preferably nonwoven cloth of polymer fiber manufactured by melt blow method, or nonwoven cloth of fine fibers of diameter of about 0.1 to 0.3 $\mu$m obtained by finely grinding liquid crystal polymer fibers of aromatic polyamide or the like because the fiber size is fine and pore size is uniform. These nonwoven cloths are preferably treated so that the fibers may not deviated from each other by fusing the fibers or coating with polymer or the like in order to enhance the dimensional stability.

Among these porous materials, the porous material drawing polytetrafluoroethylene, polyimide and other porous material formed by making use of phase separation phenomenon, and nonwoven cloth of fine fibers of liquid crystal polymer are preferred because they have a porous structure of homogeneous and anisotropic composition three-dimensionally, and are uniform in pore size.

The average pore size of consecutive pores is preferred to be set in a range of 0.05 to 5 $\mu$m, and more preferably in a range of 0.1 to 0.5 $\mu$m. If the pore size is too small, the plating solution does not permeate sufficiently into the inside of the porous material, and the inside of the porous material cannot be plated sufficiently. If the pore size is too large, it is hard to form a fine plating metal pattern, or when exposing with ultraviolet rays or visible rays, the exposure rays are scattered by the porous structure, and it is hard to expose the pattern at high contrast. To prevent excessive scattering of exposure rays and to grow the plating metal uniformly in the pores, the pore size is preferred to be uniform. Preferably, the pore size should be set in a range of 20 to 95%, and more preferably in a range of 45 to 90%. If the porosity is too small, the plating metal may not permeate sufficiently, or the conductivity of the pattern of the formed plating metal may be low. If the porosity is too large, the strength of the porous material is not enough, and the dimensional stability is lowered.

(c) Hydrophilic Treatment

The surface of the base material is preferred to be treated to have a hydrophilic property in order to improve wettability with plating solution. In particular, using a porous material as the base material, when plating to the inside of the porous material, hydrophilic treatment is important for allowing the plating solution to permeate to the inside of the porous material. The hydrophilic treatment method is not particularly specified, and known techniques maybe employed. Such methods include, for example, a method of applying hydrophilic substance such as polyvinyl alcohol and other hydrophilic polymers, and methods of reforming the surface by optical, thermal or chemical treatment.

Specifically, the surface of the base material oxidized by irradiating with ultraviolet rays in the presence of oxygen stream or ozone stream, or by exposing to the ozone atmosphere or ozone solution. For example, the surface of the base material may be oxidized by plasma treatment with oxygen or the like in vacuum. It may be also treated with acid or alkali. Further, as disclosed in Japanese Laid-open Patent No. 2000-290413, the surface may be made hydrophilic by an oxidizing method.

When polymer or glass is oxidized, acidic radicals capable of adsorbing metal cations such as carboxyl radicals or silanol radicals are generated. However, in the method of the invention using anion exchange radical, as mentioned above, abnormal deposition of plating does not take place if such acidic radicals are present.

Among these hydrophilic treatments, the plasma treatment in atmosphere is preferred because the process is simple.

(B) Photosensitive Layer
(a) Anion Exchange Radical

In the invention, the anion exchange radical refers to a radical capable of adsorbing an anion, and it is either a cationic radical or a basic radical.

(Cationic Radical)

Specifically, examples of cationic radical include aliphatic amine such as ammonium radical, quaternary ammonium base derivative radical of aromatic amine, and quaternary ammonium base derivative radical of complex ring containing nitrogen such as pyridinium radical or imidazolium radical.

(Basic Radical)

Examples of basic radical include aliphatic or aromatic amino radical, and complex ring derivative radical containing nitrogen such as pyridine residue or imidazole residue.

(b) Swelling Property

The photosensitive layer in the embodiment is a layer having a swelling property. The swelling property refers to a nature having an affinity to the solution used in adsorption of plating nucleus, when adsorbing the plating nucleus on the base material in a later process, and expanding in volume by incorporating the solution into the layer. As a result, in the plating nucleus adsorbing process, the plating nuclei permeate sufficiently into the inside of the photosensitive layer, and the plating nuclei are adsorbed on the photosensitive layer at high density, and hence a sufficient amount of electroless plating layer can be formed in a short time.

(c) Formation of Photosensitive Layer
(Photosensitive Layer)

The photosensitive layer for generating or extinguishing the anion exchange radical by energy beam irradiation in the invention is a layer formed on the base material surface, and is a layer having a photosensitive radical for generating or extinguishing the anion exchange radical by energy beam irradiation.

The photosensitive layer may be composed only of a photosensitive compound having a photosensitive radical, but may be a mixture with other compound. When the photosensitive layer containing such photosensitive radical is irradiated with energy beam in a desired pattern, the ion exchange radical can be generated or extinguished in the irradiation position. For example, when a composite material is used as wiring substrate, the base material is required to have electric characteristics, heat resistance and mechanical strength. If the base material itself is photosensitive, it is hard to establish together with these required characteristics. Accordingly, it may be easier to form a photosensitive layer on the surface of non-photosensitive base material.

In particular, using a porous material as the base material, when forming a conductive part into the inside of the porous material, it is preferred that the photosensitive layer is formed separately from the base material. If the porous material itself is photosensitive, emitted energy beams are absorbed intensely, and it is hard to expose sufficiently to the inside of the porous material. It is therefore preferred to form a photosensitive layer sparingly on the surface of a porous material made of a material not absorbing or hardly absorbing the emitted energy beams. The thickness of the photosensitive layer formed on the surface of the pores in the porous material is preferred to be 1 to 100 nm, or more preferably 20 to 50 nm. If too thin, however, the amount of the anion exchange radical is not enough, and sufficient amount of plating catalyst cannot be adsorbed. If too thick, the pores maybe clogged. Or all of the emitted energy beams maybe absorbed near the surface, and the photosensitive layer inside of the porous material may not be exposed sufficiently. The thickness of the photosensitive layer should be sufficiently thin as compared with the pore diameter so as not to clog the pores. Specifically, the thickness of the photosensitive layer should be 20% or less of the pore diameter, or preferably 10% or less.

(Formation of Photosensitive Layer)

The photosensitive layer can be formed by coating the surface of the base material with a photosensitive compound having photosensitive radical and crosslinking radical or a photosensitive composition containing a compound having a photosensitive radical.

Alternatively, a photosensitive layer may be formed by bonding a molecule having a radical capable of bonding with a functional radical existing on the base material surface and a photosensitive radical on the base material surface.

Japanese Laid-open Patent No. 6-202343 discloses a method of selective plating by using a silane coupling agent having both a radical for generating a carboxyl radical for adsorbing metal ions, and a trialkoxy silyl radical which can be bonded to the surface of a glass substrate.

In this method, however, metal ions are also adsorbed on the silanol radical generated from the trialkoxy radical, which may lead to disorderly deposition of plating. However, since the anion exchange radical and silanol radical are opposite in polarity of electric charge, such disorderly deposition of plating hardly occurs.

Other selective plating method features the use of a silane coupling agent having both amino radical, that is, anion exchange radical for adsorbing metal ions, and trialkoxy silyl radical which can be adsorbed on the surface of a glass substrate. Irradiating with ultraviolet rays of short wavelength of 200 nm or less, the carbon-carbon covalent bond is cut off, and the amino radical in the illuminated area is extinguished to form a latent image. Palladium colloid is adsorbed on this latent image. In this method, too, it is hard to form a photosensitive layer of sufficient film thickness with the silane coupling agent, and moreover, being crosslinked at high density, the photosensitive layer is not swollen in the plating nucleus solution. As a result, the palladium colloid is adhered only on the surface of the photosensitive layer, the plating nucleus adsorbing amount is not sufficient. Besides, since the carbon-carbon covalent bond is cut off directly by ultraviolet rays of short wavelength, the sensitivity of exposure is poor. In the case of porous material used as the base material, it is hard to expose to the inside of the base material. On the other hand, the photosensitive layer made of polymer or polymer compound having photosensitive radical is easily swollen, and a sufficient amount of plating nuclei can be adsorbed. By using the photosensitive radical of the invention, especially by using the acyl oxime derivative radical or azide derivative radical as the photosensitive radical, a latent image can be formed at high sensitivity. Besides, the wavelength can be selected from a wide range, and it is excellent when forming a plating pattern to the inside of the porous material.

A photosensitive layer can be also formed by reforming the surface of base material by chemical reaction. For example, by interface graft polymerization method, a photosensitive graft polymer chain having a photosensitive radical is grown from the growth point formed on the base material surface, and the base material surface is coated with the photosensitive graft polymer chain. Further, by introducing a functional radical on the base material surface of porous sheet or the like of a polymer having an aromatic ring such as polyimide porous sheet, the introduced functional radical may be chemically modified to form a photosensitive radical. To introduce a functional radical, a sulfonic acid radical may be introduced by Friedel-Crafts reaction or the like, or as disclosed in Japanese Laid-open Patent No. 2000-290413, a hydroxyl radical or carboxyl radical maybe introduced by oxidation method. Since the base material can be selected from a wide range and the photosensitive layer can be formed easily, it is most preferred to form a photosensitive layer by coating the base material surface with a photosensitive compound or a photosensitive material composed of photosensitive composition.

(d) Photosensitive Radical

A photosensitive radical is any one of a radical which generates an anion exchange radical alone by chemical reaction by absorbing the emitted energy beam, a radical which generates an anion exchange radical by reacting chemically by irradiation to form a precursor of a certain anion exchange radical, being followed by chemical reaction of this precursor with a substance existing in the surrounding, a radical which generates an anion exchange radical by acting with a base or the like generated from a base generating agent by energy beam irradiation, and a radical which extinguishes an anion exchange radical by energy beam irradiation. Among them, the photosensitive radical which generates or extinguishes the anion exchange radical alone by chemical reaction is most preferred, because it reacts alone and is hardly affected by humidity or other ambient atmosphere, and it can prevent fluctuations of reactivity due to deviation of composition likely to occur when forming a photosensitive layer by applying a composition containing a compound having a photosensitive radical. Meanwhile, if the precursor generated by irradiation chemically reacts with a surrounding substance to produce an anion exchange radical, the surrounding substance is any substance usually contained in the atmosphere such as water and moisture, or a substance mixed preliminarily in the photosensitive layer, and therefore the process is simple and excellent.

The photosensitive radical which generates the anion exchange radical is preferred to the photosensitive radical which extinguishes it. Since the plating reaction is an amplifying reaction, if a trace of plating nucleus is present, certain growth of plating is expected therefrom. Therefore, when extinguishing the anion exchange radical, unless extinguished completely, abnormal deposition of plating may occur from undesired area (that is, illuminated area), which may lead to defective insulation or the like. By contrast, in the case of generating the anion exchange radical, if the reaction rate is not very high, abnormal deposition of plating does not occur in undesired area (in this case, nonilluminated area).

Examples of the photosensitive radical which generates anion exchange radical alone by absorbing energy beams include carbamoyl oxide derivative radical such as carbamoyl oxyimino radical which generates amine or other basic radical, carbaminic acid derivative radical, and formamide derivative radical. The carbarninic acid derivative of piperidine derivative has its base acting as a catalyst, and produces a piperidine derivative which is thermally an amine. Accordingly, by combining with a photosensitive radical which generates other basic radicals or a photobase generator, a large amount of basic radicals can be generated by a small amount of exposure.

Those generating anion exchange radical by reacting chemically by energy beam irradiation to produce a precursor of a certain anion exchange radical, followed by chemical reaction of this precursor, that is, the photosensitive radicals for producing anion exchange radicals by multistage reaction triggered by chemical reaction by irradiation include, for example, acyl oxime derivative radical, and azide derivative radical.

Photosensitive radicals for producing anion exchange radicals by acting with the base generated from the base generator by energy beam irradiation include carbaminic acid derivative radical of piperidine derivative and others.

(Photobase Generator)

When using a photosensitive radical which generates an anion exchange radical by acting with the base generated from the base generator by energy beam irradiation, a photobase generator which generates a base by energy beam irradiation is added. When irradiated with an energy beam, a base is generated from the photobase generator, and the protective radical is decomposed by the generated base, so that an anion exchange radical is generated.

As the photobase generator, for example, cobalt amine derivative, ketone oxime ester, carbamate such as o-nitrobenzyl carbamate, and formamide are used, and specific examples are carbamate products such as Midori Chemical NBC-101 (CAS No. 119137-03-0), and triarylsulfonium salt products such as Midori Chemical TPS-OH (CAS No. 58621-56-0).

Instead of the photobase generator, a photoacid generator and a basic compound may be combined. That is, at the energy beam illuminated position, acid is generated from the photoacid generator, and the basic compound is neutralized.

In the nonilluminated area, by contrast, the basic compound acts to produce an anion exchange radical. As a result, an anion exchange radical can be selectively disposed only in the nonilluminated area.

(Photoacid Generator)

The photoacid generator includes onium salt having a pairing anion such as $CF_3SO_3-$, $p-CH_3PhSO_3-$, or $p-NO_2PhSO_3-$, diazonium salt, phosphonium salt, iodonium salt, other salts, triazines, organic halogen compound, 2-nitrogenzyl sulfonic acid ester, iminosulfonate, N-sulfonyloxide imide, aromatic sulfones, quinone diazide sulfonic acid ester, etc.

Specific examples of photoacid generator include triphenyl sulfonium trifurate, diphenyl iodonium trifurate, 2,3,4, 4-tetrahydroxy benzophenone-4-naphthoquinone diazide sulfonate, 4-N-phenylamino-2-methoxy phenyl diazonium sulfonate, diphenyl sulfonyl methane, diphenyl sulfonyl diazomethane, diphenyl disulfone, alpha-methyl benzoin tosilate, pyrogallol trimethylate, benzoin tosilate, naphthalimidyl trifluoromethane sulfonate, 2-[2-(5-methylfurane-2-yl) ethenyl]-4,6-bis (trichloromethyl)-s-triazine, 2-[2-(furane-2-yl) ethenyl]4-,6-bis (trichloromethyl)-s-triazine, 2-[2-4-diethylamino-2-methylphenyl) ethenyl)-4,6-bis (tirchloromethyl)-s-triazine, 2-[2-(4-diethylaminoethyl) amino]4-,6-bis (trichloromethyl)-s-triazine, dimethyl sulfate, 2-[2-(3,4-dimethoxyphenyl) ethenyl]-4,6-bis (trichloromethyl)-s-triazine, 2-(4-dimethoxyphenyl)-4,6-bis (trichloromethyl)-s-triazine, 2-methyl-4,6-bis (trichloromethyl)-s-triazine, and 2,4,6-tris (trichloromethy)-s-triazine.

These photoacid generators maybe combined with acid growth promoter which generates acid auto-catalytically newly by acid. Of course, an acid growth promoter having photoacid generating property may be used alone. The acid growth promoter includes, for example, t-butyl 2-methyl-2-(p-toluene sulfonyloxymethyl) acetoacetate and its derivative, cis-1-phenyl-2-(p-toluene sulfonyloxy)-1-cyclohexanol and its derivative, 3-nitro-4-(t-butoxycarbonyloxy) benzyl tosilate and its derivative, 3-phenyl-3,3-ethylene dioxypropyl tosilate, and other 3-phenyl-3,3-ethylene dioxypropyl sulfonate derivative, cis-3-(p-toluene sulfonyloxy)-2-pinanol and other 2-hydroxybicycloalkane-1-sulfonate derivative, 1,4-bis (p-toluene sulfonyloxy) cyclohexane and other sulfonate derivative of 1,4-cyclohexane diol, 2,4,6-tris [2-(p-toluene sulfonyloxy) ethyl]-1,3,5-trioxane, and other trioxane derivative. The acid growth promoter of photoacid g enerating property includes 3-phenyl-3,3-o-nitrophenylene ethylene dioxypropyltosilate, and other 3-phenyl-3,3-ethylene dioxy propyl sulfonate derivative.

(Basic Compound)

The basic compound used in combination with the photoacid generator is not particularly specified as far as it is neutralized by the acid released from the photoacid generator, and acts as catalyst of reaction for producing anion exchange radical, and either organic compound or inorganic compound may be used. Preferably, ammonia, primary amine, secondary amine, and tertiary amine may be used.

The photosensitive radical which loses the anion exchange radical by energy beam irradiation is a radical having an anion exchange radical before irradiation, and dissociating its anion exchange radical by energy beam irradiation or changing into a hydrophobic radical.

Specific examples are radicals having structures of onium salts, that is, diazonium salts having anions such as Cl-, PF6-, AsF6-, SbF6-, BF4-, C104-, CF3S03-, HS04-, FS03-, F2P02-, p-CH3-C6H4-SO3, p-N02-C6H4-SO3-, and others as pairing ions, and also phosphonium salt, iodonium salt, sulfonium salt, selenonium salt, etc. By anion exchange reaction, they can adsorb ions containing metal or compounds containing metal. They are charged in positive polarity, and can hence adsorb metal colloid. They are also decomposed by energy beam irradiation to become nonionic, and hence can hardly adsorb plating nucleus.

(e) Polymer or Polymer Compound Bonded with Photosensitive Radical

Since the photosensitive layer is exposed to an alkaline or acidic aqueous solution when adsorbing the plating nucleus or when plating, to make it hard to be dissolved, it is preferred that the photosensitive radical for producing or eliminating the cation exchange radical is bonded with polymer or polymer compound. When the photosensitive radical is bonded with the polymer or polymer compound, it is not dissolved in the plating nucleus solution or plating solution, but can be swollen by such solution. Accordingly, the solution permeates into the inside of the photosensitive layer, and the adsorbing amount of plating nucleus or deposition amount of plating can be increased. Since the adsorbing amount of plating nucleus has a significant effect on the conductivity of the conductive part, and it is particular important to be swollen in the plating solution. To swell without being dissolved in the solution, the polymer and polymer compound should be preferably not crosslinked to an extremely high density, and have a proper affinity for the solution. Preferred examples of such polymer include phenol novolak resin, xylenol novolak resin, pyrogallol resin, vinyl phenol resin, cresol novolak resin, other phenol resin, polyamide resin, polyimide resin, polyester resin, polyolefin resin, polyacrylic acid ester derivative, polymethacrylic acid ester derivative, other acrylic resin, polysiloxane derivative, and resins having a sufficient long chain portion with few crosslinking points in the resin molecule. Among them, from the viewpoint of coating performance and others, it is preferred to use phenolic resin and acrylic resin.

The polymer compound is a polymer compound composed of aromatic ring and carbon chain, and is preferred to be branched. The molecular weight of the polymer or polymer compound is not particularly specified, but the molecular weight (or weight-average molecular weight in the case of polymer) is preferred to be 1,000 to 5,000,000, and more preferably 2,000 to 50,000.

If the molecular weight of the polymer or polymer compound is too small, the film forming performance is poor, and the solvent resistance in the plating solution may be lowered. That is, it is easily dissolved in the plating solution. It is hard to provide the polymer or polymer compound with swelling performance without sacrificing the resistance to the solvent. On the other hand, if the molecular weight is excessive, the solubility into the solvent for application is lowered, and the coating performance also drops.

If the feeding amount of photosensitive radical in the polymer or polymer compound is too small, the plating nucleus cannot be adsorbed sufficiently, or if excessive, it is easily dissolved in the plating solution, and the manufactured compound member is likely to absorb moisture, and defective insulation and other problems are likely to occur.

The feed rate of the photosensitive radical for producing or eliminating the anion exchange radical in the polymer or polymer compound is preferably 5 to 300%, and more preferably 30 to 70%. The feed rate is calculated in the following formula.

Feed rate of photosensitive radical in polymer (%)=(number of anion exchange radicals being produced or eliminated)/(number of monomer units in polymer)×100

Feed rate of photosensitive radical in polymer compound (%)= (number of anion exchange radicals being produced or eliminated)/(molecular weight of polymer compound)×100

To heighten the solvent resistance and make it hard to dissolve in the plating solution, the polymer or polymer compound should be preferably crosslinked. To crosslink the polymer or polymer compound, a radical generator such as organic peroxide is added, and carbon- carbon bond is formed in the polymer molecule by hydrogen extraction reaction in the polymer. Or a crosslinking radical may be introduced into the polymer main chain or side chain, or in the polymer compound.

(Crosslinking Radical)

As the crosslinking radical, the crosslinking radicals may be self-polymerized with each other to crosslink, or may be bonded with other substance in the photosensitive layer to crosslink.

Examples of self-polymerized crosslinking radicals include epoxy radical such as glycidyl, vinyl ether radical, chloromethyl phenyl radical, methylol radical, benzocyclobutene radical, vinyl radical, acryloyl radical, methacryloyl radical, maleimidyl radical, alkoxysilyl radical, acetoxysilyl radical, enoxysilyl radical, oximesilyl radical, and their derivative radicals.

These crosslinking radicals are crosslinked by, as required, irradiation with light, heating or action of catalyst. As the catalyst, an acidic or basic catalyst is used in epoxy radical, methylol radical, vinyl ether radical, alkoxy silyl radical, acetoxysilyl radical, enoxysilyl radical, oxime silyl radical, or the like, and a radical generating agent is used in the radical polymerizing radical such as vinyl radical, acryloyl radical, methacryloyl radical, maleimidyl radical and other radical having multiple bonds. The crosslinking radical for crosslinking by radical reaction is preferred because the bond produced by crosslinking is excellent in resistance to plating solution, strong alkaline solution or strong acidic solution.

The radical reaction progresses fast even at ordinary temperature, and heat treatment is usually not required. It is hence possible to prevent lowering of dimensional stability or thermal deterioration due to heat treatment of base material. The crosslinking radical used when crosslinking by forming bond with other substance in the photosensitive layer includes, for example, hydroxyl radical, isocyanate radical, carboxylic anhydride radical, maleimidyl radical, aldehyde radical, alkoxy silyl radical, etc.

(Crosslinking Aid)

At this time, to form a crosslinking bond by bonding with such cross linking radicals, a cross linking aid having a plurality of radicals capable of bonding with the crosslinking agent in one molecule is used.

As the crosslinking agent, for example, alkoxy silane, aluminum alkoxide, carboxylic anhydride, bismaleimide derivative, isocyanate compound, polyhydric methylolcompound, and epoxy compound are used for hydroxyl radical. Polyhydric alcohol and others are used for isocyanate radical, carboxylic anhydride radical and alkoxy silyl radical.

Any other material crosslinking by reacting with anion exchange radical may be used. For example, epoxy radical, chloromethyl phenyl radical, methylol radical, alkoxy silyl radical, maleimidyl radical, isocyanate radical, carboxylic anhydride radical, and aldehyde radical react with amino radical, and crosslink. In particular, the epoxy radical is excellent because the property of adsorbing the plating nucleus is maintained sufficiently after reaction with amino radical. The crosslinking agent having a plurality of such radicals in one molecule may be merely added to crosslink mutually the polymers having the anion exchange radicals. In these cases, too, acid catalyst or other catalyst may be added properly. As the crosslinking radical, the following radicals being dimerized by energy beam irradiation maybe used. Such radicals absorb part of the energy beam, but are excellent in that only the illuminated area can be selectively crosslinked. Such examples are cinnamoyl radical, cinnamyridine radical, chalcone residue, isocoumarine residue, 2,5-dimethoxystylbene residue, styryl pyridinium residue, thymine residue, alpha-phenyl maleimidyl radical, anthracene residue, and 2-pyrone residue.

The feed rate of the crosslinking radical in polymer or polymer compound is preferably 1 to 100%, more preferably in a range of 10 to 50%. The feed rate is calculated in the following formula.

Feed rate of crosslinking radical in polymer (%)=(number of crosslinking radicals)/(number of monomer units in polymer)×100

Feed rate of crosslinking radical in polymer compound (%)=(number of anion exchange radicals being produced or eliminated)/(molecular weight of polymer compound)×100

If the feed rate of the crosslinking radical in the polymer or polymer compound is too small, sufficient crosslinking is difficult, and it is easy to dissolve in the plating solution. On the other hand, if the crosslinking radical is supplied in excess, when crosslinked, it is hard to swell in the plating nucleus solution, and the photosensitive layer is cured and contracted, and the base material may be deformed, and the photosensitive layer may be peeled from the base material.

The crosslinking reaction is preferred to be executed after forming the photosensitive layer. If crosslinked before forming the photosensitive layer, solubility of the solvent into the polymer or polymer compound is lowered, and it is hard to applied on the insulating base material. After forming the photosensitive layer, the crosslinking reaction should be progressed by heating, energy beam irradiation, stimulation with moisture in the air, and others.

Energy beam irradiation should be done preferably together with the energy beam irradiation for generating or eliminating the anion exchange radical. For example, the catalyst to be activated by energy beam irradiation includes photoacid generator, photobase generator, and radical generator. The energy beam to be emitted is not particularly specified, and includes ultraviolet ray, visible ray, infrared ray, X-ray, electron ray, alpha-ray, gamma-ray, heavy particle beam, and others. Usually, ultraviolet ray, visible ray, and electron ray are widely used.

As explained above, the crosslinking reaction is most preferred to be radical reaction, and the radical generator is preferred to be used in combination with the radical polymerizing crosslinking compound or crosslinking radical.

(Radical Generator)

As the radical generator, for example, the following organic peroxides may be used:

Methyl ethyl ketone peroxide, cyclohexanone peroxide, methyl cyclohexanone peroxide, methyl acctoacetate peroxide, acetyl acetone peroxide, other ketone peroxides, 1,1-bis (t-hexylperoxy)-3,3,5-trimethyl cyclohexane, 1,1-bis (t-hexylperoxy) cyclohexane, 1,1-bis(t-butyl-oxy)-3,3,5-trimethyl cyclohexane, di-t-butylperoxy-2-methyl cyclohexane, 1,1-bis (t-butylperoxy) cyclohexane, 1,1-bis (t-butylperoxy) cyclododecane,2,2-bis(t-butylperoxy) butane, n-butyl-4,4-bis (t-butylperoxy) valerate, 2,2-bis (4,4-di-t-butylperoxy cyclohexyl) propane, other peroxy ketals, p-menthane hydroperoxide, diisopropyl benzene hydroperoxide, 1,1,3,3-tetramethyl butyl hydroperoxide, coumene hydroperoxide, t-hexyl hydroperoxide, alpha-alpha'-bis (t-butylperoxy) diisopropyl benzene, dicumyl peroxide, 2,5-dimethyl-2,5-bis (t-butylperoxy) hexane, t-butyl cumyl peroxide, di-t-butyl peroxide, 2,5-dimethyl-2,5-bis (t-butylperoxy) hexine, other dialkyl peroxides, isobutylyl peroxide, 3,5,5-trimethyl hexanoyl peroxide, octanoyl peroxide, lauroyl peroxide, stearoylperoxide, succinic acid peroxide, m-toluoyl and benzyl peroxide, benzoylperoxide, other diacylperoxides, di-n-propyl peroxydicarbonate, diisopropyl peroxydicarbonate, bis (4-t-butylcyclohexyl) peroxydicarbonate, di-2-ethoxy ethyl peroxydicarbonate, di-2-ethylhexyl peroxydicarbonate, di-3-methoxybutyl peroxydicarbonate, di (3-methyl-3-methoxybutyl) peroxydicarbonate, other peroxydicarbonates, alpha-alpha'-bis (neodecanoylperoxy) diisopropylbenzene, cumylperoxy neodecanoate, 1,1,3,3-tetramethyl butylperoxy neododecanoate, 1-cyclohexyl-1-methyethylperoxy neodecnoate, t-hexylperoxy neodecanoate, t-butylperoxy neodecanoate, t-hexylperoxy pivalate, t-butyloxy pivalate, 1,1,3,3-tetramethyl butylperoxy-2-ethylhexanoate, 2,5-dimethyl-2,5-bis (2-ethyhexanoylperoxy) hexane, 1-cyclohexyl-1-methylehtylperoxy-2-ethylhexanoate, t-hexylperoxy-2-ethylhexanoate, t-butylperoxy-2-ethylhexanoate, t-butylperoxy isobutylate, t-hexylperoxy isopropyl monocarbonate, t-butylperoxy maleic acid, t-butylperoxy-3,5,5-trimethylhexanoate, t-butylperoxy laurate, 2,5-dimethyl-2,5-bis (m-toluylperoxy) hexane, t-butylperoxy isopropyl monocarbonate, t-butylperoxy-2-ethylhexyl monocarbonate, t-hexylperoxy benzoate, 2,5-dimethyl-2,5-bis (benzoylperoxy) hexane, t-butylperoxy acetate, t-butylperoxy-m-toluyl benzoate, t-butylperoxy benzoate, bis (t-butylperoxy) isophthalate, other peroxy esters, b-butylperoxy allyl monocarbonate, t-butyltrimethyl silylperoxide, 3,3',4,4'-tetrakis (t-butylperoxy carbonyl) benzophenone, and 2,3-dimethyl-2,3-diphenyl butane. In particular, multifunctional radical generators such as 2,2-bis (4,4-di-t-butylperoxy cyclohexyl) propane, and 3,3',4,4'-tetra (t-butylperoxy carbonyl) benzophenone are preferred because they also act as cross linking aid.

Aside from peroxides, further, azonitriles such as azobis-sobutylonitrile may be also used.

(Sensitizer)

Various sensitizers may be added to the photosensitive layer. By adding a sensitizer, the sensitivity maybe enhanced, and the photosensitive wavelength may be varied according to the light source to be used.

To sensitize to the inside of the porous base material, it is preferred to sensitize with an energy beam capable of passing through the base material easily by using light of wavelength other than the absorption wavelength of the base material.

For example, most porous base materials of polyimide absorb light of about 500 nm or less, and it is hard to expose to the inside of the porous material with g-ray or i-ray. In such a case, by using a visible light sensitizer having an absorption band in a wavelength region of 500 nm or more, the inside of the porous material can be sensitized sufficiently.

Specific examples of sensitizer include aromatic hydrocarbon and its derivative, benzophenone and its derivative, o-benzoyl ester benzoate and its derivative, acetophenone and its derivative, benzoin and benzoin ether and their derivative, xanthone and its derivative, thioxanthone and its derivative, disulfide compound, quinone compound, compound containing halogenated hydrocarbon and amines, 3-ethyl-5-[(3-ethyl-2 (3H)-benzothiazolylidene) ethylidene]-2-thioxo-4-oxoazolydinone, 5-[(1,3-dihydro-1,3,3-trimethyl-2H-indole-2-ylidene) ethylidene]-3-ethyl-2-thioxo-4-oxazolydinone, other melocyanine pigments, 3-butyl-1,1-dimethyl-2-[2[2-diphenylamino-3-[(3-butyl-1,3-d ihydro-1,1-dimethyl-2H-be z[e]indole-2-ylidene) ethylidene]-1-cyclopentene-1-yl]ethyenyl]-1H-benz[e] indolium percholate, 2-[2-[2-chloro-3-[(3-ethyl-1,3-dihydro-1,1-dimethyl-2H-benz[e]indole-2-ylidene) ethylidene]-1-cyclohexene-1-yl]ethenyl]-1,1]dimethyl-3-ethyl-1H-benz[e]indolium tetrafluoroborate, 2-[2-[2-chloro-3-[(3-ethyl-1,3-dihydro-1,1-dimethyl-2H-benz [e]indole-2-ylidene]ethylidene]-1-cyclopentene-1-yl]ethenyl]-1,1] dimethyl-3-ethyl-1H-benz[e]indolium iodide, other cyanine pigments, squalium cyanine pigments, 2-[p-(dimethylamino) styryl]benzothiazole, 2-[p-(dimethylamino) styryl]naphtho [1,2-d]thiazole, 2-[(m-hydroxy-p-methoxy) styryl]benzothiazole, other styryl pigments, eosine B (C.I. No. 45400), eosine J (C.I. No. 45380), cyanosine (C.I. No. 45410), Bengal rose, erythrosine (C.I. No. 45430), 2,3,7-trihydroxy-9-phenyloxanetene-6-one, Rhoda mine 6G, other xanthene pigments, thionine (C.I. No.52000), azuleA (C.I. No. 52005), azule C (C.I. No. 52002), other thiazine pigments, vinyl on B (C.I. No. 45005), vinyl on GY (C.I. No. 45005), other vinyl on pigments, 3-acetyl coumarin, 3-acetyl-7-diethylamino coumarin, 3-(2-benzothiazolyl)-7-(diethylamino) coumarin, 3-(2-benzothiazolyl)-7-(dibutylamino) coumarin, 3-(2-benzylimidazolyl)-7-(diethylamino) coumarin, 10-(2-benzothiazolyl)-2,3,6,7-tetrahydro-1,1,7,7-tetramethy 1-1H,5H,11H-[1] benzopyrano[6,7,8-ij]quinolidine-11-one, 3-(2-benzothiazolyl)-7-(dioctylamino) coumarin, 3-carbetoxy-7-(diethylamino) coumarin, 10-[3-[4-(dimethylamino) phenyl]-1-oxo-2-propenyl]-2,3,6,7-tetrahydro-1,1,7,7-tetramethyl-1H, 5H,11H-[11benzopyrano[6,7,8-ij] quinolidine-11-one, other coumarin pigments, 3,3'-carbonylbis (7-dibutylamino coumarin), 3,3'-carbonyl-7-dibutylamino coumarin-7'-bis (butoxyethyl) amino coumarin, 3,31-carbonylbis (7-dibutylamino coumarin), other ketocoumarin pigments, 4-(dicyanomethylene)-2-methyl-6-(p-dimethylamino styryl)-4H-pyran, 4-(dicyaznomethylene)-2-methyl-6-(p-dibutylamino styryl)-4H-pyran, and other DCM pigments.

The blending rate of such sensitizer in the compound for producing or eliminating the anion exchange radical by exposure is usually 0.001 to 10 wt. %, or preferably 0.01 to 5 wt. %.

The sensitizer maybe merely mixed into the photosensitive layer, or may be incorporated into the side chain of the polymer having photosensitive radical. If the photosensitive layer is sufficiently thin, a layer containing the sensitizer may be laminated on the photosensitive layer.

In the invention, when forming the photosensitive layer, either a photosensitive compound for forming a composite material mentioned below, or a photosensitive material containing a photosensitive composition for forming a composite material may be used.

(C) Energy Beam to be Emitted

Energy beam to be emitted is not particular specified, and may include ultraviolet ray, visible ray, infrared ray, X-ray, electron ray, alpha-ray, gamma-ray, heavy particle beam, and others. Usually, ultraviolet ray, visible ray, and electron ray are widely used. In particular, ultraviolet rays or visible rays of 280 nm or preferably 350 nm or more are preferred. Preferred examples are i-ray (wavelength 365 nm) using high pressure mercury lamp as light source, g-ray (wavelength 435 nm), argon ion laser beam (for example, wavelength 488 nm), and semiconductor laser beam (for example, wavelength 405 nm). These energy beams require a relatively simple irradiation equipment, and can illuminate a wide area in the atmosphere. When using a mask, general polymer film mask or glass mask may be used. If the wavelength is too short, the beam is absorbed by the glass or polymer film of the mask. When plating to the inside of the porous material, as mentioned above, the irradiating energy beam must pass through the porous base material. In the case of a porous base material made of heat resistant aromatic polymer, a strong absorption may occur such as by the benzene ring having a peak in the vicinity of 250 to 250 nm. Accordingly, at 280 nm or less, a sufficient transmissivity may not be obtained.

(D) Adsorption

To adsorb the plating nucleus on the anion exchange radical, a base material forming a photosensitive layer is brought into contact with a plating nucleus solution.

The contacting method may be immersion of base material in the solution, or spraying of solution on the base material. As the plating nucleus, an ion containing metal, compound containing metal, or metal colloid may be used.

(a) Ion Containing Metal

The ion containing metal is the one to be a catalyst of electroless plating as being reduced, such as gold, platinum, palladium, copper, silver, nickel, ruthenium, rhodium, other organic acid or inorganic acid, or organic salt or inorganic salt.

Since the ion containing metal is adsorbed as a pairing ion in the anion exchange radical, it is preferred to be an anion. Examples of anion include AuC14-, PtC142-, PtC162-, Pd C142-, PdC162-, CuC142-, etc. Usually these anions are used as being dissolved in a solvent such as water or alcohol, in a form of organic acid, inorganic acid, inorganic salt such as sodium salt or potassium salt, or organic salt such as ammonium salt. When a basic radical such as amino radical is used as anion exchange radical, it is preferred to be once ionized by the action of an acid or the like, and then adsorb the anion. As the acid, using a strong acid such as hydrochloric acid or sulfuric acid, it is preferred to generate a salt of basic radical and strong acid. At this time, by using sodium salt or potassium salt, that is, a salt of a strong base, as the metal salt, the ion containing metal may be adsorbed on the anion exchange radical as a pairing iron at high reactivity by the reaction of promptly producing a salt of strong acid and strong base, by the salt of strong acid (hydrochloric acid or sulfuric acid) and salt of strong base (sodium hydroxide or potassium hydroxide).

Since ionizing and adsorbing can be carried out simultaneously, it is preferred to use the organic acid or inorganic acid capable of generating the ion containing metal.

(Organic Acid and Inorganic Acid)

The organic acid and inorganic acid capable of generating these anions containing metal include tetrachloroauric (III) acid, hexachloroplatinic (IV) acid, and tetrachloropalladic (II) acid.

(Organic Salt and Inorganic Salt)

The organic salt and inorganic salt include potassium tetrachloroaurate (III), sodium tetrachloroaurate (III), other aurate chloride, potassium tetrachloroplatinate (II), sodium tetrachloroplatinate(II), potassium hexachloroplatinate(II), sodium hexachloroplatinate (II), ammonium hexachloroplatinate (IV), ammonium tetrachloroplatinate (II), other platinate chloride, potassium tetrachloropalladinate (II), sodium tetrachloropalladinate (II), potassium hexachloropalladinate (IV), sodium hexachloropalladinate (IV), ammonium tetrachloropalladinate (II), ammonium hexachloropalladinate (IV), other palladinate chloride, potassium tetrachlorocuprate (II), sodium tetrachlorocuprate (II), ammonium tetrachlorocuprate (II), other cuprate chloride, potassium dicyanoargentate, other silver salt, etc.

(b) Compound Containing Metal

The compound containing metal includes an organic metal complex having a bonding radical capable of adsorbing or bonding the anion exchange radical.

Specifically, for example, a bonding radical is introduced into an organic metal complex composed of ligand, such as beta-diketone derivative, dipiridine derivative, biquinoline derivative, phenantrolene derivative, porphyrin derivative, etc.

Examples of bonding radical include hydroxyl radical or mercapto radical bonded with fluorine substitute alkyl radical, phenolic hydroxyl radical, thiophenolic hydroxyl radical, other acidic radical, mercapto radical, carboxyl radical, sulfo radical (sulfonic acid radical), phosphono radical (phosphoric acid radical), other acidic radical, and their salts. These acidic radicals and salts adsorb pairing ions of anion exchange radicals, and form ester bond to be bonded.

It is also possible to use those reacting and bonding with amino radicals of anion exchange radicals, such as aldehyde radical, epoxy radical, active ester radical, acid anhydride derivative radical, maleimide derivative radical, and others. Metal alkoxide derivative radical such as alkoxysilyl radical, or nitroaryl halide derivative radical may be also used. Examples of active ester radical include 4-nitrophenyloxy carbonyl radical derivative, active ester radical of carboxyl radical and N-hydroxy succinimide or N-hydroxy benzimide, and imide ester derivative radical. The alkoxy silyl radical is, for example, trimethoxysilyl radical, triethoxysityl radical, triisopropoxysilyl radical, and methoxy dimethylsilyl radical.

Usually, these ions containing metal and compounds containing metal are used in a form of aqueous solution, alcoholic solution or other solution. A base material forming a pattern of anion exchange radical is immersed in the solution, or the solution is sprayed to make contact, thereby adsorbing into the anion exchange radical. The solution is easy to handle and safe, and it is preferred to be used in a form of aqueous solution.

The compound containing metal is preferred to be added in a water soluble form as a salt with a strong base, that is, sodium salt or potassium salt, when the bonding radical is an acidic radical such as carboxylic radical. In this case, the anion exchange radical is preferably a salt with a strong acid. The anion exchange radical such as amino acid is treated in hydrochloric acid or sulfuric acid, and is prepared as a strong base such as chlorate or sulfate. When the compound containing metal such as sodium salt or potassium salt acts on it, by the reaction of generating a salt of strong acid+ strong base and a salt of weak acid+weak base from the salt of strong acid+weak base and salt of weak acid+strong base, the compound containing metal can be adsorbed efficiency on the anion exchange radical.

The adsorbed ion containing metal or compound containing metal is used directly or reduced and metallized, and is used as the catalyst of electroless plating.

The ion of the metal of smaller ionizing tendency than the metal to be plated is not required to be reduced particularly, but is reduced later by the ion of the plating metal in the plating solution.

For example, in the case of copper plating, the ions of metal, platinum, palladium and silver can be used directly. The copper ions are once reduced and prepared as fine copper particles, and is used as the catalyst of electroless plating. As the reducing agent, any known reducing agent may be used, such as formaldehyde, sodium borohydride, dimethylamine borane, tirmethylamine borane, hydrazine, sodium hypophosphite, and other hypophosphites.

The reducing agent is generally prepared as aqueous solution or other solution, and the base material is immersed in this solution and is reduced. Before reducing, preferably, the base material should be washed in water to remove excess portion of ion containing metal or compound containing metal.

(c) Metal Colloid

As metal colloid solution, an aqueous solution of colloid such as gold, silver, platinum, palladium, copper, nickel or the like is used, or alcoholic or other organic solution is also used.

As the metal colloid, it is preferred to use a protective colloid being protected with protective substance such as surface active agent or polymer, from the viewpoint of storage stability of the metal colloid solution. In most cases, the metal colloid is charged in positive or negative polarity, and the charging polarity may be varied with the protective substance.

The anion exchange radical is also charged in the solution in most cases, and the metal colloid is adsorbed by the electrostatic attraction with the anion exchange radical. It is preferred to use the metal colloid charged in negative polarity.

Using the metal colloid having the bonding radical on the surface, this bonding radical maybe bonded to the anion exchange radical.

The bonding radicals include hydroxyl radical or mercapto radical bonded with phenolic hydroxyl radical, thiophenolic hydroxyl radical, or fluorine substitute alkyl radical, other acidic hydroxyl radical, mercapto radical, carboxyl radical, sulfo radical (sulfonic acid radical), phosphono radical (phosphoric acid radical), other acidic radical, and their salts. These acidic radicals adsorb pairing ions of anion exchange radicals, and form ester bond to be bonded. It is also possible to use those reacting and bonding with amino radicals of anion exchange radicals, such as aldehyde radical, epoxy radical, metal alkoxide derivative radical, active ester radical, alkoxysilyl radical, other metal alkoxide derivative radical, acid anhydride derivative radical, maleimide derivative radical, nitroaryl halide derivative radical. Examples of active ester radical include 4-nitrophenyloxy carbonyl radical derivative, active ester radical of carboxyl radical and N-hydroxy succinimide or N-hydroxy benzimide, and imide ester derivative radical. The alkoxysilyl radical is, for example, trimethoxysilyl radical, triethoxy sibyl radical, triisopropoxy silyl radical, and methoxy dimethyl silyl radical.

The metal colloid can be directly used as catalyst for electroless plating without being reduced. In the case of protective colloid, the activity as catalyst is enhanced when the protective substance is removed by etching, using acid or alkali solution, or oxidizer solution.

A specific example of metal colloid solution is palladium hydrosol. The palladium hydrosol is prepared by using, for example, an aqueous solution of palladium chloride (II)and sodium chloride, adding an aqueous solution of surface active agent in this aqueous solution while stirring violently, and then adding an aqueous solution of sodium borohydride as reducing agent.

The surface active agent is not particularly specified but any known compound may be used. Examples include cationic surface active agent such as stearyl trimethyl ammonium chloride, anionic surface active agent such as sodium dodecyl benzene sulfonate, nonionic surface active agent such as polyethylene glycol mono-p-nonyl phenyl ether, and amphoteric ion surface active agent. To prepare negatively charged metal colloid, sodium dodecyl benzene sulfonate or similar anionic surface active agent may be used.

Particle size of metal colloid is not particularly specified, but in order to adsorb uniformly and at high density on a fine pattern of the anion exchange radical, generally, it is about 1 to 100 nm, preferably 1 to 20 nm. In particular, when adsorbing the metal colloid to the inside of the porous material, the particle size is preferred to be 1 to 10 nm.

The concentration of the plating nucleus solution is preferably 0.1 to 20% by weight, preferably in a range of 1 to 15%. If the concentration is too low, a sufficient amount of plating nuclei may not be adsorbed on the anion exchange radical, or the adsorption speed is low and it takes a long time in adsorption. If the concentration is too high, plating nuclei may be adsorbed disorderly in other area than the occupied zone of anion exchange radical, and it is hard to form a favorable composite member. The contact time of the solution and base material, such as immersion time of base material in plating nucleus solution, is not particularly specified, but the duration is generally from 10 seconds to about 5 hours.

In the plating nucleus solution, it is preferred to add a surface active agent or the like in order to enhance the wettability on the base material surface. When using a porous material as the base material, in particular, it is preferred to add a surface active agent so that the solution may permeate sufficiently into the inside of the porous material. As the surface active agent, it is preferred to use a nonionic surface active agent in order to impede adsorption of plating nucleus or prevent abnormal adsorption. In particular, the surface active agent of fluorine compound is preferred because it is hardly changed chemically. A solution of supercritical fluid of plating nucleus may be also used. The supercritical fluid is excellent because it can permeate smoothly into the inside of fine structure of porous material. In the case of electroless plating into the inside of the porous base material, better effects are obtained by using a solution of ion containing metal or a solution of compound containing metal. The metal colloid is small in the diffusion speed in solution, and can hardly diffuse into the inside of the porous material. It is hence suited to the case of plating only the surface area of the porous base material.

By contrast, the ion containing metal or the compound containing metal is faster in diffusion speed, and it is possible to adsorb into the inside of the porous material. It is suited in the case required to plate also the inside of the porous material, such as the case of forming via holes. Not limited to the porous base material, if there are fine undulations on the base material surface, it is possible to plate tightly by following up the fine undulations by using the solution of iron containing metal or solution of compound containing metal. After bringing the base metal into contact with the plating nucleus solution, it is preferred to clean and remove extra plating nuclei. For example, it is preferred to clean by using a same solvent as the solvent of the plating nucleus solution. By cleaning, the plating nuclei sticking to other region than the occupied area of the anion exchange radical can be removed, thereby preventing disorderly plating in other region than the occupied area of the anion exchange radical.

When a porous material is used as the base material, cleaning is particularly important. For cleaning, the base material is immersed in a cleaning tank filled with water or cleaning solution, or cleaning solution is blown by spray or the like. When a flat and smooth plate is used as the base material, that is, when undulations are smaller and solution is hardly collected, it is enough to clean by using air knife, ultrasonic air, or air or nitrogen gas flow, and the extra plating nucleus solution can be easily blown away. It is also possible to remove the solution by vibration, centrifugal separation or other method.

(Adapter Molecule)

Usually, the plating nucleus is directly adsorbed on the anion exchange radical, but in order to be applicable to a wide range of plating conditions or to enhance the adsorbing capability, the adapter molecule may be used. The adapter molecule is a module used for bonding between the anion exchange radical and plating nucleus. The adapter molecule comprises the bonding radical for bonding with the anion exchange radical, and the adsorbing radical for adsorbing the plating nucleus. First, the adapter molecule is bonded to the anion exchange radical. Then the plating nucleus is adsorbed on the bonded adapter molecule.

Such use of adapter molecule brings about the following two major benefits.

First, the range of choice is wider for selecting the types and adsorbing conditions of the plating nucleus, and the types and plating conditions of the plating nucleus. For example, when the adapter molecule having a cation exchange radical is used as the adsorbing radical, a metal cation or positively charged metal colloid can be adsorbed. Or, by using various ligands as the adsorbing radical, various ions containing metal can be adsorbed at high adsorbing and selecting performance. It is also possible to cope with changes of plating nuclei or various absorbing conditions. In the plating process, similarly, it is applicable to various plating solution composition and properties or plating conditions.

Of course, in the conventional cation exchange radicals, similar adapter molecules can be applied. However, the amino radicals, that is, anion exchange radicals have a higher reactivity to bonding reaction. Therefore, even in moderate reaction conditions, a strong bond with bonding radical can be formed.

Second, the adsorbing amount of the plating nuclei can be increased. By using an adapter molecule having multiple adsorbing radicals in one molecule, more plating nuclei can be adsorbed per cation exchange radical.

The usable bonding radical of adapter molecule includes hydroxyl radical or mercapto radical bonded with phenolic hydroxyl radical, thiophenolic hydroxyl radical, or fluorine substitute alkyl radical, other acidic hydroxyl radical, mercapto radical, carboxyl radical, sulfo radical(sulfonic acid radical), phosphono radical (phosphoric acid radical), other acidic radical, and their salts.

These acidic radicals are bonded with pairing ions of anion exchange radicals, and form ester bond to be bonded. However, when bonded with pairing ions, it is likely to dissociate in the acidic or alkaline condition. Accordingly, in order to form a bond by more potent covalent bond, it is preferred to use those reacting and bonding with amino radicals of anion exchange radicals, such as aldehyde radical, epoxy radical, metal alkoxide derivative radical, active ester radical, alkoxysilyl radical, other metal alkoxide derivative radical, acid anhydride derivative radical, maleimide derivative radical, nitroaryl halide derivative radical. Examples of active ester radical include 4-nitrophenyloxy carbonyl radical derivative, active ester radical of carboxyl radical and N-hydroxy succinimide or N-hydroxy benzimide, and imide ester derivative radical. The alkoxysilyl radical is, for example, trimethoxysilyl radical, triethoxy silyl radical, triisopropoxy silyl radical, and methoxy dimethyl silyl radical.

Examples of adsorbing radical of adapter molecule include hydroxyl radical or mercapto radical bonded with phenolic hydroxyl radical, thiophenolic hydroxyl radical, or fluorine substitute alkyl radical, other acidic hydroxyl radical, mercapto radical, carboxyl radical, sulfo radical (sulfonic acid radical), phosphono radical (phosphoric acid radical), other acidic radical, and their salts, and also crown ether derivative, oligoethylene oxide, polyethylene oxide, other ethylene oxide derivative, beta-diketone derivative, dipiridine derivative, biquinoline derivative, phenantrolene derivative, porphyrin derivative, and other derivatives of metal ligands. To increase the adsorbing amount of the plating nuclei, a plurality of these adsorbing radicals may be contained in one molecule. The adsorbing radicals may be also introduced in the main chain or side chain of the adapter molecule of polymer.

In such adapter molecule solution, a base material forming a pattern of anion exchange radical is immersed to be in contact, and the adapter molecule is bonded with the anion exchange radical. Later, the plating nucleus is adsorbed similarly.

(E) Electroless Plating

A conductive pattern is formed by electroless plating, using the adsorbed plating nucleus or its reduced form as plating catalyst.

Electroless plating is executed by immersing a base material adsorbing a plating nucleus or its reduced form in a electroless plating solution to be kept in contact.

The electroless plating solution is not particularly specified, and any known plating solution may be used widely, such as copper, nickel, gold, silver, or platinum. In electroless plating, since the plating progresses by using the plating nucleus adsorbed on the anion exchange radical or its reduced form as plating catalyst, plating can be selectively applied, ultimately, only in the occupied region of the anion exchange radical.

The pattern of the anion exchange radical for adsorbing the plating nucleus should be preferably the pattern of anion exchange radical formed by pattern exposure on the photosensitive layer for producing or eliminating the anion exchange radical because only one process of exposure is needed. However, when plating on the exposure pattern and inverted pattern, operation of two or more processes of exposure may be employed, aside from the method of using the photosensitive layer for eliminating the cation exchange radical.

Using a photosensitive layer for producing an anion exchange radical, a pattern of anion exchange radical is formed by pattern exposure. The produced anion exchange radical is capped with protective radical so that the plating nucleus may not be adsorbed. Next, by exposure on the entire surface, an anion exchange radical is formed in other area than the pattern exposure region.

The plating nucleus is adsorbed and plated, and a conductive part of inverted pattern of the exposure pattern is formed. A similar method using a carboxyl group which is a cation exchange radical is disclosed in Japanese Laid-open Patent No. 6-202343.

However, since the carboxyl radical is not sufficient in reactivity, it is hard to cap the protective radical high in resistance to strong alkaline plating solution. If attempted to cap the protective radical of high resistance, it requires heating or special reagent, and the process tends to be complicated.

By contrast, the anion exchange radical such as amino radical is high in reactivity, and the highly resistant protective radical can be capped in moderate conditions of room temperature or the like.

(Protective Radical)

The compound to be capped as protective radical is preferred to be a compound having both a cap position not adsorbing the plating nucleus and a bonding radical capable of bonding with anion exchange radical.

The cap position is, for example, substitute or nonsubstitute alkyl radical, aryl radical, aralkyl radical, etc., and or fluorine replaced radical or siloxane derivative radical may be used. However, if the cap position is too hydrophobic, the plating solution is repelled too much, and defective plating is likely to occur if the pattern is fine or when using a porous material. Accordingly, an appropriate hydrophilic property to plating solution is preferred, and it is desired to use polar radicals such as hydroxyl radical, silanol radical, alkoxy radical, ester radical, or amide radical, or their replaced polar radicals.

Examples of bonding radical include hydroxyl radical or mercapto radical bonded with phenolic hydroxyl radical, thiophenolic hydroxyl radical, or fluorine substitute alkyl radical, other acidic hydroxyl radical, mercapto radical, carboxyl radical, sulfo radical (sulfonic acid radical), phosphono radical (phosphoric acid radical), other acidic radical, and their salts. These acidic radicals adsorb pairing ions of anion exchange radicals, and form ester bond to be bonded. It is also possible to use those reacting and bonding with amino radicals of anion exchange radicals, such as aldehyde radical, epoxy radical, active ester radical, acid anhydride derivative radical, maleimide derivative radical, and alkoxy silyl radical. Since it is capable of forming a bond of a high resistance to plating solution, it is preferred to use aldehyde radical, epoxy radical, active ester radical, acid anhydride derivative radical, maleimide derivative radical, and alkoxy silyl radical.

[II] Manufacturing Method of Composite Member (Second Aspect)

Each process of manufacturing method of composite member in a second aspect is described.

As compared with the first aspect, the second aspect differs in the materials for forming the photosensitive layer. That is, in the first aspect, the photosensitive layer was a swelling type photosensitive layer for producing or eliminating the anion exchange radical by illuminating the base material surface with energy beam, whereas the second aspect features the use of compound containing acyloxime derivative radical for generating an anion exchange radical by irradiating the base material surface with energy beam, or photosensitive layer having at least a compound containing azide derivative radical. In the explanation of this aspect, therefore, the explanation is omitted except for the compound containing acyloxime derivative radical for generating an anion exchange radical by irradiating the base material surface with energy beam, and photosensitive layer having at least a compound containing azide derivative radical.

The asyloxime derivative radical or azide derivative radical used in the embodiment is sensitized to an energy beam of long wavelength region of 280 to 800 nm by combined use of sensitizer as required. The energy beam in this region is not absorbed by the base material, but the photosensitive layer inside of the porous base material can be illuminated, and therefore the plating nucleus can be sufficiently adsorbed to the inside of the base material in the adsorbing process after energy beam irradiation process, so that a sufficient amount of plating nuclei can be formed.

These radicals do not have amide bonds and others likely to adsorbed abnormally the plating nucleus before photosensitizing. Hence, in the illuminated region and non-illuminated region, plating of high contrast is realized. For example, unlike the case of onium salt, there is no risk of generation of acid after plating from the photosensitive radical to corrode the conductive pattern or lower the insulation between the conductive patterns. Hence, it is possible to form a composite member excellent in electric characteristic and reliability. Further, the asyloxime derivative radical can crosslink the photosensitive portion by the action of crosslinking aid such as benzoquinone. The azide derivative radical also acts as a crosslinking radical by hydrogen extracting reaction of naphthorene. As a crosslinking aid, phenol novolak resin or the like may be also added. These photosensitive radicals can easily control the photosensitive wavelength by the photosensitizer, it is possible to plate sufficiently in the inside of the base material.

As the asyloxime derivative radical used in the embodiment, for example, the following compound may be used.

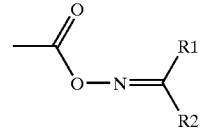

[Formula 1]

where R1, R2 are substitute or non-substitute alkyl radical, aryl radical, or aralkyl radical with 1 to 20 carbon atoms, independently.

As the azide derivative radical, for example, the following compound may be used.

$$—R—N_3$$ [Formula 2]

where R denotes substitute or non-substitute bivalent aromatic ring structure with 1 to 20 carbon atoms, specifically, for example, phenylene.

Compounds having such photosensitive radicals include, specifically, a polymer having such radicals in the side chain or main chain, or a polymer compound having a plurality of these radicals. As such polymer and polymer compound, the same polymer and polymer compound explained in the first embodiment may be used.

More preferred materials of photosensitive layer include a two-element copolymer of ester acrylate or ester methacrylate having such photosensitive radicals, and ester acrylate or ester methacrylate having such crosslinking radicals, a three-element copolymer further copolymerizing ester acrylate or ester methacrylate having sensitizing action, and a four-element copolymer further copolymerizing ester acrylate or ester methacrylate having hydrophobic radical for adjusting the solubility. Instead of ester acrylate or ester methacrylate, it is also possible to use styrene derivative, norbomene derivative, N-substitute maleimide derivative, and vinyl alcohol derivative. As the crosslinking radical, glycidyl radical, other epoxy radical, vinyl radical, acryloyl radical, or methacryloyl radical and other radical polymerizing radical are preferred. The molecular weight of polymer is preferred to be about 2,000 to 50,000.

As the ester acrylate or ester methacrylate having asyloxime derivative radial as photosensitive radical, for example, the following compound may be used.

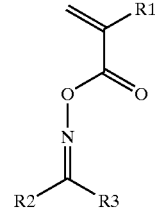

[Formula 3]

where R1 is hydrogen or methyl radical, R2, R3 are substitute or non-substitute alkyl radical, aryl radical, or aralkyl radical with 1 to 20 carbon atoms, independently, and the specific examples of R2 and R3 include methyl radical, phenyl radical, naphthyl radical, anthryl radical, etc.

Examples of monomer unit having azide derivative radical as photosensitive radical are as follows.

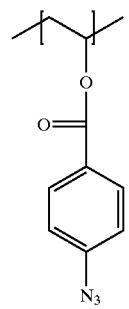

[Formula 4]

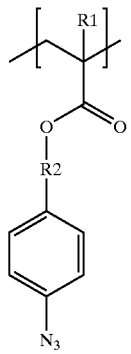

[Formula 5]

where R1 is hydrogen or methyl radical, and R2 denotes hydrocarbon chain with 1 to 10 carbon atoms, and the specific examples of R2 include methylene and ethylene.

Preferably, the photosensitive layer of the embodiment should have a swelling property. Therefore, as mentioned above, the plating nucleus forming composition can be permeated into the inside of the photosensitive layer desired to have a thickness of 20 to 50 nm, and the photosensitive layer existing inside of the base material can be photosensitive sufficiently, and hence the plating nuclei can be formed sufficiently, and a thick plating layer can be formed.

[III] Manufacturing Method of Composite Member (Third Aspect)

Each process of manufacturing method of composite member in a third aspect is described.

In the following explanation, to assist understanding, a porous material sheet is used as the base material, but it must be noted that the shape and manufacturing sequence of the porous material and electrode are not limited particularly in the invention.

(1) Manufacturing Process (A) Electrode Installing Process

As shown in FIG. 10, an electrode 102 is installed on one side of an insulating porous sheet 101. The porous sheet is a honeycomb sheet or three-dimensional mesh sheet having pores penetrating from face to back of the sheet. A photosensitive layer changing in the surface energy depending on energy beam irradiation is preferably formed inside of the pores of the porous sheet.

The method of forming the photosensitive layer on the base material is not particularly specified, but generally a solution of a photosensitive agent is applied on the base material. The layer thickness of the photosensitive material applied is not particularly specified, but is generally set in a range of about 0.5 to 1000 nm, or preferably 1 to 100 nm, or more preferably 20 to 50 nm.

The electrode is placed tightly to the porous sheet. It is important that the electrode surface contacting with the porous sheet communicates with the opposite side of the porous sheet through the pores penetrating through the face and back of the porous sheet. In a later process, a plating solution is permeated into the electrode surface through such penetrating pores to deposit a plating metal. The electrode may be placed after irradiation with energy beam.

(B) Surface Partial Reforming Process

Part of the porous material is reformed to change its surface energy, and a pattern of a region different in the affinity of the reformed portion for water from the affinity of the nonreformed portion for water is formed. As a result, the permeability of the plating solution into the porous sheet is changed, and the plating solution permeates more smoothly into the hydrophilic portion.

In this surface reforming process, the reforming means includes a method by energy beam irradiation, chemical reforming method, partial heating method, and mechanical method.

In the reforming method by using a chemical, hydrophilic substance or hydrophobic substance is applied, it is intended to reform by forming a hydrophilic layer or hydrophobic layer on the surface. In part of the base material, further, a chemical is applied by using oxidizing agent, reducing agent, hydrophilic radical introducing reaction initiator, or oleophilic radical introducing reaction initiator, and the surface can be reformed by inducing a desired reaction. When applying chemicals, the chemicals may be discharged by ink jet or the like, and the chemicals may be applied only on the necessary area of the base material, or the undesired area may be protected with wax or other masking agent, and the chemicals may be applied on the whole surface.

In the method by partial heating, part of the surface is oxidized by heating in oxidizing atmosphere, and the surface energy can be changed.

In reformation by mechanical means, part of the base material surface is rubbed to be roughened, and the surface energy can be changed.

However, as compared with these methods, from the viewpoint of working efficiency and reforming efficiency, the energy beam irradiation method is most efficient and preferred.

In the energy beam irradiation method, a porous sheet is irradiated with a pattern of energy beam, and the surface energy of the surface of the pores in the illuminated area is changed, and a selectively hydrophilic pattern is formed in the illuminated area or non-illuminated area. As a result, the permeability of the plating solution into the porous sheet is changed, and the plating solution permeates more easily into the hydrophilic portion. When a photosensitive layer is formed on the surface in the pores, the photosensitive layer is sensitized, and the surface energy is changed. FIG. 10 shows an example, in which the surface energy in the illuminated area is changed and the plating solution is likely to permeate. In this case, the photosensitive layer before irradiation is made of a material which repels the plating solution, so that the plating solution may not permeate into the non-illuminated area. By irradiation, the plating solution selectively permeates into an insulating region 103 in the porous material selected in contact with the electrode surface. The surface energy changing method is not particularly limited, but it is most preferred to use a photosensitive radical which produces or eliminates the ion exchange radical by energy beam irradiation because the surface energy change before and after irradiation is very large. For example, the electroplating solution of copper is generally acidic. Therefore, when a basic amino radical or the like is generated in the region 103, an ammonium salt is produced to make hydrophilic. Thus, the region 103 wettable with the plating solution is formed. By thus changing the surface energy, a region for selectively permeating the plating solution is formed, and this method is simple in process and can form a fine pattern. Otherwise, for example, in a method of applying wax or resist in the pores of the region not desired to permeate plating solution, it is hard to form a fine pattern, and it is hard to remove wax 100 or resist after plating. According to the method of the invention, the porous material remains porous throughout the process, and it is easy to impregnate with a curing resin or the like after forming a conductive pattern.

As the energy beam irradiating condition, generally, a high pressure mercury lamp is used as light source, and the energy beam is emitted at exposure of about 0.1 to 1000 mJ/cm$^2$ through a mask conforming to the pattern. Either a mask may be used in exposure or a laser beam may be used, or the light from the light source may be modulated by a micro mirror array having multiple micro mirrors arrayed in a matrix.

(C) Plating Solution Permeation Process

The porous sheet with electrode thus forming the region 103 is immersed in an electroplating solution, and the plating solution selectively permeates into the region 103.

Since the region 103 contacts with the electrode surface, the plating solution permeates up to the electrode surface so as to plate electrolytically. Since the surface in the pores of the region 103 is insulating, deposition of plating progresses only from the electrode surface side, and the pores are sequentially filled up to high filling rate. If the surface in the pores of the region 103 is conductive, plating deposition also progresses from the pore surface, and the pores in the periphery of the region 103 are likely to be clogged earlier. As a result, the plating solution may not be supplied sufficiently in the central portion of the region 103, and it is hard to plate at high filling rate.

The plating solution permeating process is generally terminated when the electroplating solution permeates immediately by immersing the base material in the electroplating bath for electroplating.

(D) Electroplating Process

After permeation of plating solution, the electrodes are energized to start electroplating. Then the electroplating progresses selectively only in the region 103, and a conductive part 104 is formed. Deposition of plating starts from the electrode surface and gradually fills the region 103. Since the deposition of plating progresses sequentially from the electrode surface, pores in the porous material can be filled up with a very high filling rate. By adjusting the current feed time, deposition may be stopped in the middle of the porous sheet 101 as in a conductive part 104, or plating maybe further continued to pass through the porous sheet 101 as in a conductive part 105. Further, deposition may project to the top of the porous sheet 101 as in a conductive part 106. In electroplating, as compared with electrolessplating, the plating deposition speed can be increased, and a high throughput is realized in a short time when forming the conductive part.

The plating conditions in electroplating process are not particularly specified, and generally the same conditions as in known electroplating may be applied.

(3) Detailed Description of Each Process

Each process in the third aspect of the manufacturing method of composite member of the invention is specifically described below.

(A) Base Material (a) Insulating Material Composing Base Material

The insulating material for forming the porous material may be either organic material or inorganic material, or may be a composite material of organic material and inorganic material.

(Organic Materials)

As the organic material, generally, a polymer material is used.

Examples of polymer material include polyethylene, polypropylene, other polyolefins, polybutadiene, polyisoprene, polyvinylethylene, other polydienes, polymethyl acrylate, polymethyl methacrylate, other acrylic resins, polystyrene derivatives, polyacrylonitrile, polymethacrylonitrile, other polyacrylonitrile derivatives, polyoxy methylene, other polyacetals, polyethylene terephthalate, polybutylene terephthalate, other polyesters containing aromatic ester, polyallylates, aramid resins, aromatic polyamides, nylons, other polyamides, polyimides, epoxy resins, aromatic polyethers, polyether sulfones, polysulfones, polysulfides, polytetrafluoroethylene, other fluorine polymers, polybenzooxazoles, polybenzothiazoles, polyparaphenylene, other polyphenylenes, polyparaephenylene vinylene derivative, polysiloxane derivative, novolak resins, melamine resins, urethane resins, etc.

(Inorganic Materials)

As the inorganic material, generally, a ceramic material is used.

Examples of ceramic material include silica, alumina, titania, potassium titanate, other metal oxides, silicon carbide, silicon nitride, aluminum nitride, etc.

Among these insulating base materials, polymers are particularly preferred because the dielectric constant is low, and from the viewpoint of heat resistance, liquid crystal polymers such as polyimides and aromatic polyamides, and fluorine polymers such as polytetrafluoroethylene are particularly desired.

(b) Shape of Porous Base Material

The porous material preferably has consecutive pores with an opening on the porous material surface, and more preferably the consecutive pores are formed in three-dimensional mesh form.

Being formed in three-dimensional mesh form, the metal plated in the pores are consecutive three-dimensionally, so that the strength and conductivity are excellent.

(Pores of Porous Base Material)

The average pore size of consecutive pores is preferably set in a range of 0.05 to 5 um, and more preferably 0.1 to 0.5 $\mu$m. If the pore size is too small, the plating solution does not permeate sufficiently into the inside of the porous material, or if the pore size is too large, it is hard to form a fine plating metal pattern, and the exposure beam is scattered by the porous structure when exposing with ultraviolet ray or visible ray, and it is hard to exposure a pattern at high contrast. The pore size is preferred to be uniform. The porosity is desired to be set in a range of 20 to 95%, more preferably 45 to 900. If the porosity is too small, the plating solution may not permeate sufficiently or the formed plating metal pattern maybe low in conductivity. If the porosity is too large, the strength of the porous material ions is not sufficient, and the dimensional stability is poor.

Specific examples and manufacturing method of porous material

As the porous material, specifically, a porous sheet forming three-dimensional consecutive pores in a polymer sheet, or cloth or nonwoven fabric having polymer fibers and ceramic fibers formed in three-dimensional mesh may be used.

The manufacturing method of porous sheet is not particularly specified, and for example a crystalline polymer sheet of polypropylene, polytetrafloroethylene or the like is drawn and manufactured. It may be also formed by making use of spinodal decomposition of polymer or phase separation phenomenon such as micro phase separation, or it may be formed by emulsion templating method using surface active agent.

As reported by Y. A. Vlasov et al. (Adv. Mater. II, No. 2, 165, 1999), or A. Johnson et al. (Science Vol. 283, 963, 1999), polymer or ceramics may be filled in the integrated body of beads of silica or polymer, and then the beams may be removed to form a porous sheet.

Or, as reported by S. H. Parks et al. (Adv. Mater. 10, No. 13, 1045, 1998), or S. A. Jenekhe et al. (Science Vol. 283, 372, 1999), an integrated body of gas foams or liquid foams may be used instead of beads.

Further, as reported by B. H. Cumpston et al. (Nature, Vol. 398, 512, 1999) or M. Campbell et al. (Nature, Vol. 404, 53, 2000), a three-dimensional optical forming method may be applied in manufactured.

The cloth or nonwoven fabric is manufactured from ceramic fibers or polymer fibers.

Ceramic fibers include silica glass fiber, alumina fiber, silicon carbide fiber, potassium titanate fiber, etc.

Polymer fibers include aromatic polyamide fiber, aromatic polyester fiber, other liquid crystal polymer, high Tg polymer fiber, PTFE fiber, other fluorine polymer fiber, polyparaphenylene sulfide fiber, aromatic polyimide fiber, polybenzoxazole derivative fiber, etc.

Ceramic fibers and polymer fibers may be mixed, or ceramic and polymer blended fibers may be used. The nonwoven fabric includes polymer nonwoven fabric manufactured by melt-blow method, and nonwoven fabric of liquid crystal polymer fibers such as aromatic polyamide being ground to fine diameter of 0.1 to 0.3 $\mu$m formed, and in such nonwoven fabric, the fiber diameters are fine and pore sizes are uniform.

To enhance the dimensional stability, the nonwoven fabric is processed by fusing the fibers mutually or coating with polymer, so that the fibers may not be separated from each other. Being less anisotropic, since the structure is homogeneous, the nonwoven fabric is preferred to the cloth.

The shape of the porous material is not limited to sheet, but may be formed in various shapes depending on application, such as fiber, hollow fiber, tube, sphere, or lump.

An example of porous sheet is a porous sheet used in flexible wiring board or multilayer wiring board, that is, the thickness is about 10 to 100 $\mu$m, the pore size is about 0.1 to 0.5 $\mu$m, the porosity is about 60 to 85%, and the polyimide porous sheet is manufactured by spinodal decomposition or micro phase separation, or a porous sheet of polytetrafluoroethylene is manufactured by drawing method, and further a nonwoven fabric of fine aramid fiber (aramid paper) may be used.

(c) Wettability of Inside Surface of Pores of Porous Material

When forming a photosensitive layer as mentioned above on the inside surface of pores of such porous material, the wettability to plating solution of the pore inside surface before forming the photosensitive layer is set according to the characteristics of the photosensitive layer. That is, the manufacturing method of the composite member in the third embodiment of the invention is characterized by selective permeation of the plating solution in a specific region by enhancing the wettability in the specific region of the pore inside surface to the plating solution. At this time, the other region of the pore inside surface must repel the plating solution to prevent permeation of the plating solution. If the photosensitive layer is made wettable to the plating solution by energy beam irradiation, the pore inside surface should be made water repellent to repel the plating solution. To the contrary, if the photosensitive layer is made repellent to the plating solution by energy beam irradiation, the pore inside surface should be made hydrophilic so as to permeate the plating solution smoothly. Anyway, the purpose of the invention is achieved as far as the surface of the photosensitive layer of the outermost layer is largely changed in wettability to the plating solution before and after exposure.

However, it may be difficult to cover the pore inside surface of the porous material completely with the photosensitive layer, and the pore inside surface of the porous material may be somewhat exposed. In such a case, the property of the pore inside surface of the porous material is reflected tot he permeability of the plating solution. That is, it is preferred to adjust the wettability of the pore inside surface to the plating solution should be adjusted to the state of the photosensitive layer before energy beam irradiation.

(B) Installation of Electrode

The electrode is placed in contact with the porous material, at least in part. For example, in the case of a porous sheet, a sheet electrode is adhered. Or a porous sheet may be wound about a columnar electrode. Or a wire or pipe electrode may be inserted into a hollow space of a hollow porous material.

As far as the electrode and porous material are in tight contact, they may be adhered and fixed, or glued and fixed in peelable state. Or they may be merely pressed to each other.

For example, as shown in FIG. 11, a porous sheet 112 is supplied and plated continuously on a rotating roll electrode 116 by reel to reel. The porous material 112 tightly wound around the electrode 116 is directly put into a plating solution bath 111, and conductive parts such as via holes 115 are plated, and it leaves the plating solution bath 111 to depart from the electrode. The roll electrode 116 is preferably made of stainless steel so as not to corrode.

The electrode surface is preferred to be smooth so that the conductive part can be easily separated from the electrode. Alternatively, the electrode surface may have an undulated texture, and the conductive part surface may be similarly undulated. By forming an undulated surface at the end face of via holes or the like, an electrical conduction with the wiring may be enhanced.

Further, pores in a selected region of the porous material may be filled with a conductive substance to form an electrode. If there is a gap between the porous electrode and the porous base material, deposition of plating occurs in this gap. If the electrode tightly contacts with the porous material, deposition of plating progresses only in a selected region of the porous material, and a conductive pattern of high precision can be formed.

(C) Energy Beam Irradiation

The energy beam to be emitted is not particularly specified, and includes ultraviolet ray, visible ray, infrared ray, X-ray, electron ray, alpha-ray, gamma-ray, heavy particle beam, and others. Usually, ultraviolet ray, visible ray, and electron ray are widely used. In particular, ultraviolet rays and visible rays of 280 nm or more, preferably 350 nm or more are preferred. Preferred examples are i-ray (wavelength 365 nm) using high pressure mercury lamp as light source, g-ray (wavelength 435 nm), argon ion laser beam (for example, wavelength 488 nm), and semiconductor laser beam (for example, wavelength 405 nm). These energy beams require a relatively simple irradiation equipment, and can illuminate a wide area in the atmosphere. When using a mask, general polymer film mask or glass mask may be used. If the wavelength is too short, the beam is absorbed by the glass or polymer film of the mask. For example, in the case of a porous base material made of heat resistant aromatic polymer, a strong absorption may occur such as by the benzene ring having a peak in the vicinity of 250 to 250 nm. Accordingly, at 280 nm or less, a sufficient transmissivity may not be obtained.

The method of changing the surface energy by energy beam irradiation is not particularly specified, and widely known methods m ay be employed. For example, as disclosed in Japanese Laid-open Patent No. 6-293837, a PTFE porous sheet may be irradiated with excimer laser to make hydrophilic. However, to pass the energy beam sufficiently into the inside of the porous material, preferably, a photosensitive layer to be sensitized at wavelength of 280 nm or more should be formed on the pore inside surface of the porous material.

(a) Photosensitive Layer

Since the process is simple and the change of surface energy is great, it is preferred to form a photosensitive layer to produce or eliminate the ion exchange radial on the pore inside surface by energy beam irradiation. If the porous material itself is photosensitive, absorption of energy beam by the porous material is too large and it is hard to illuminate into the inside of the porous material. It is also difficult to establish the required characteristics of the porous material such as electric characteristic, heat resistance and mechanical strength, together with the photosensitive nature. By contrast, by forming a photosensitive layer thinly on the inside surface of the pores of the porous material made of a material free from or weak in absorption of energy beam, the energy beam can reach sufficiently into the inside of the porous material. Since the porous material itself is not required to be photosensitive, the photosensitive layer for acquiring the electric characteristic, heat resistance and mechanical strength of the porous material may be treated with energy beam irradiation to have a radical for producing or eliminating the ion exchange radical, so that the process is very simple.

(Ion Exchange Radical)

The ion exchange radical in the invention refers to the radical capable of adsorbing an ion, and it is either ionic radical, or acidic or basic radical.

The ion exchange radical is hydrophilic or becomes hydrophilic by reacting with the plating solution, so that the plating solution may permeate easily. Whether to select acidic or basic ionic radical depends on the polarity of the plating solution in electroplating process.

The ion exchange radical is strongly hydrophilic because it is ionized. Hence it is preferred to be ionized also in the plating solution. For example, generally, a copper sulfate aqueous solution is used for electroplating of copper. The copper sulfate aqueous solution is a strong acid. Therefore, for example, a weak acidic radical such as phenolic hydroxyl radical or carboxylic radical cannot be ionized, and hydrophilic property is not sufficient. Similarly, the anionic radical formed by reaction of such weak acidic radical with a base is also a weak acidic radical in a strong acidic plating solution, and hydrophilic property is not enough. By contrast, a basic radical such as amino radical, and cationic radical such as ammonium radical are both ammonium radicals in a strong acidic plating solution, and a strong hydrophilic property is shown. That is, when the plating solution is acidic, it is preferred to use a cationic radical or basic radical.

On the other hand, in the case of an alkaline plating solution, it is preferred to use an anionic radical or acidic radical.

Anionic radicals and acidic radicals include hydroxyl radical or mercapto radical bonded with fluorine substitute alkyl radical, phenolic hydroxyl radical, thiophenolic hydroxyl radical, other acidic radical, mercapto radical, carboxyl radical, sulfo radical (sulfonic acid radical), phosphono radical (phosphoric acid radical), other acidic radical, and their salts. The cationic radicals and basic radicals include amino radical, amide radical, pyridine derivative radical, imidazole residue, oxazole residue, thiazole residue, other imidazole derivative radicals, triazole derivative residue, and their salts.

(Radicals Generating Anionic Radical or Acidic Radical by Energy Beam Irradiation)

Radicals generating anionic radical or acidic radical by energy beam irradiation include, for example, carboxylic acid, sulfonic acid, o-nitrobenzyl ester derivative of silanol, p-nitrobenzyl ester sulfonate derivative, naphthyl or phthalimide trifluorosulfonate derivative, etc.

Further examples include ester peroxide such as peroxide of tort-butyl ester of carboxylic acid. Still more examples are benzoquinone diazide, naphthoquinone diazide, anthraquinone diazide, and other quinone diazide derivatives.

Moreover, protective radicals that can be rid of protection by acid catalyst may be introduced in ion exchange radicals such as carboxyl radical, phenolic hydroxyl radical, or silanol radical.

(Photoacid Generator)

When using anion exchange radical introducing a protective radical that can be rid of protection by acid catalyst, a photoacid generator for generating an acid by energy beam irradiation is added.

By energy beam irradiation, an acid is generated from the photoacid generator, and the protective radical is decomposed by the generated acid, so that an ion exchange radical is formed.

Examples of protective radical of carboxyl radical include tort-butyl radical, tort-butoxy carbonyl radical, tetrahydropyranyl, and other acetal radicals. Protective radicals of phenolic hydroxyl radical and silanol radical include tert-butoxy carbonyl radicals, and which are used as tert-butoxy carbonyloxy radicals.

Preferred photoacid generators for depriving the protective radical of protection include onium salt having a pairing anion such as $CF_3SO_3-$, $p-CH_3PhSO_3-$, or $p-NO_2PhSO_3-$, diazonium salt, phosphonium salt, iodonium salt, other salts, triazines, organic halogen compound, 2-nitrogenzyl sulfonic acid ester, iminosulfonate, N-sulfonyloxide imide, aromatic sulfones, quinone diazide sulfonic acid ester, etc., and specifically the photoacid generators mentioned in the first embodiment of the manufacturing method of the composite member of the invention may be used. These photoacid generators may be used also in combination with acid growth promoter which generates an acid newly by auto-catalytic action by the acid. Further, to produce an acidic radical, the photoacid generator may be used in combination with an acid growth promoter radical for generating an acidic radical newly by auto-catalytic action by an acid introduced in the polymer side chain such as 2-hydroxy bicycloalkane-1-sulfonate residue.

(Radicals Eliminating Anionic Radical or Acidic Radical by Energy Beam Irradiation)

Radicals eliminating anionic radical or acidic radical by energy beam irradiation include, for example, carboxyl radical derivative radical capable of decomposing by including a decarbonation reaction. As a carboxyl radical derivative radical, a radical promoting decarbonation reaction by a basic compound is preferred. Such radical preferably has an electron attracting radical or unsaturated bond at alphaposition or beta-position of carboxyl radical. Herein, the electron attracting radical is preferably carboxyl radical, cyano radical, nitro radical, aryl radical, carbonyl radical, or halogen.

Specific examples of carboxyl radical derivative radical or photosensitive molecule containing such carboxyl radical derivative radical are alpha-cyanocarboxylic acid derivative, alpha-nitrocarboxylic acid derivative, alpha-phenyl carboxylic acid derivative, beta, gamma-olefin carboxylic acid derivative, and indene carboxylic acid derivative. When a photobase generator is used as a basic compound, a base is generated by energy beam irradiation, and the carboxyl radical is decarbonated and eliminated by the action of the generated base.

(Photobase Generator)

As the photobase generator, for example, cobalt amine complex, ketone oxime ester, carbamate such as o-nitrobenzyl carbamate, and formamide are used.

Specific examples are carbamate products such as Midori Chemical NBC-101 (CAS No. 119137-03-0), and triaryl sulfonium salt products such as Midori Chemical TPS-OH (CAS No. 58621-56-0).

Instead of the photobase generator, a photoacid generator and a basic compound may be combined. In this case, at the energy beam illuminated position, acid is generated from the photoacid generator, and the basic compound is neutralized.

In the non-illuminated area, by contrast, the basic compound acts on the compound containing carboxylic radical, and decarbonation reaction is promoted to eliminated the carboxyl radical. As a result, a carboxyl radical can be selectively disposed only in the illuminated area. As the photoacid generator, the same photoacid generator as mentioned above can be used.

(Basic Compound)

As the basic compound to be added, any compound may be used as far as it can be neutralized by the acid released from the photoacid generator, and can act as catalyst of decarbonation reaction of the compound containing carboxyl radical.

The basic compound may be either organic compound or inorganic compound, but an organic compound containing ammonia or nitrogen is preferred.

Specific examples are ammonia, primary amine, secondary amine, tertiary amine, etc.

The content of the photobase generator or basic compound should be 0.1 to 30 wt. %, preferably, 0.5 to 15 wt. % of the photosensitive composition.

If less than 0.1 wt. %, the decarbonation reaction is not progressed sufficiently, or if exceeding 30 wt. %, deterioration of the carboxyl radical derivative radical left over in the unexposed portion may be promoted.

When the photoacid generator and basic compound are combined, as a matter of course, the amount of the acid that can be generated from the photoacid generator is larger than the amount of the base of the basic compound, and specifically it is preferred to be 1 equivalent or more, or 1.2 equivalent or more preferably. Herein, the equivalent is expressed as follows.

Equivalent=(molar number of photoacid generator× number of acids generated from one molecule of photoacid generator× valence of generated acids)/(molar number of basic compound×valance of basic compound)

The radical which eliminates the cationic radical or basic radical by energy beam irradiation is the same as the photosensitive radical for producing or eliminating the anionic exchange radical by energy beam irradiation used in the manufacturing method of composite member in the first embodiment of the invention.

In the invention, when forming the photosensitive layer, the photosensitive compound for forming composite member mentioned below or a photosensitive material containing the photosensitive compound for forming composite member maybe used.

(Forming Method of Photosensitive Layer)

A photosensitive layer can be formed by coating the pore inside surf ace of porous material with a photosensitive molecule having a photosensitive radical or a photosensitive composition having a photosensitive molecule. Or a photosensitive layer may be also formed by bonding a radical to be bonded with a functional radical existing in the pore inside surface such as silane coupling agent with a pore inside surface having a photosensitive radical.

A photosensitive layer can be also formed by reforming the surface of base material by chemical reaction. For example, by interface graft polymerization method, a photosensitive graft polymer chain having a photosensitive radical is grown from the growth point formed on the pore inside surface, and the pore inside surface is coated with the photosensitive graft polymer chain. Further, by introducing a functional radical such as sulfonic acid radical by Friedel-Crafts reaction or the like, on the pore inside surface of the polymer porous sheet having an aromatic ring of polyimide porous sheet, the introduced functional radical may be chemically modified, and a photosensitive radical may be formed. Since the base material can be selected from a wide range and the photosensitive layer can be formed easily, it is most preferred to forma photosensitive layer by coating the pore inside surface with a photosensitive compound or a photosensitive material composed of photosensitive composition.

As the photosensitive material used for coating, because of excellent coating performance and excellent resistance to the plating solution, the photosensitive radical should be preferably introduced into the main chain or side chain of the same polymer as in the manufacturing method of composite member as in the first or second embodiment of the invention. For coating, for example, the solution of photosensitive material is impregnated in the porous material, and dried. When using the solution of photosensitive material, it is desired to be diluted so as not to clog the pores in the porous material. The solution coating means is not particularly specified, and dipping, spin coating, spraying and other methods maybe employed. Aside from coating with solution, a photosensitive layer maybe formed by vapor deposition, CVD or other method. The photosensitive layer is preferred to be formed sparingly on the pore inside surface of the porous material so as not to clog the pores. The porous material itself maybe photosensitive, since the absorption of emitted energy beam is strong, it is hard to illuminate sufficiently into the inside of the porous material. It is preferred to form a photosensitive layer sparingly on the surface of a porous material made of a material free from or small in absorption of emitted energy beam.

The thickness of the photosensitive layer is not particularly specified, but is preferably 1 to 100 nm, or more preferably 20 to 50 nm. If too thin, the amount of ion exchange radical is not enough, and the plating solution cannot permeate sufficiently. If too thick, the pores may be clogged. Or the emitted energy beam maybe completely absorbed near the surface, and the photosensitive layer in the porous material may not be exposed sufficiently.

The thickness of the photosensitive layer should be sufficiently thin as compared with the pore size so as not to clog the pores. The thickness of the photosensitive layer is 200 or less of the pore size, or preferably 100 or less.

(Method of Exposing Twice)

After capping the protective radical in a pattern of ion exchange radical formed by pattern exposure, the entire surface may be also exposed to form an ion exchange radical in other area than pattern exposure area so as to make hydrophilic. According to this method, a conductive part of inverted pattern of the pattern by pattern exposure can be formed. By using carboxylic radical as ion exchange radical, the method of forming hydrophilic and hydrophobic patterns by two exposure processes is disclosed in Japanese Laid-open Patent No. 6-202343, and this technique can be applied also in the second embodiment of the manufacturing method of composite member of the invention.

However, since the carboxyl radical is not sufficient in reactivity, it is hard to cap the protective radical high in resistance to strong alkaline plating solution. If attempted to cap the protective radical of high resistance, heating is needed or special reagent is needed, and the process becomes complicated. In an acidic electroplating solution of copper, for example, sufficient hydrophilic property may not be exhibited. By contrast, the anion exchange radical such as amino radical is high in reactivity, and the protective radical of high resistance can be capped in a moderate condition such as room temperature. Even in the acidic electroplating solution of copper, it can be ionized and a sufficient hydrophilic property may be exhibited.

The compound to be capped as protective radical may be a compound having both hydrophobic position for repelling plating solution and a bonding radical for bonding with the anion exchange radical.

The hydrophobic position is, for example, substitute or non-substitute alkyl group, aryl group, aralkyl group, etc., and fluorine replaced radical or siloxane derivative radical may be also used.

The bonding radical is, for example, hydroxyl radical or mercapto radical bonded with phenolic hydroxyl radical, thiophenolic hydroxyl radical, fluorine substitute alkyl radical, other acidic radical, mercapto radical, carboxyl radical, sulfo radical (sulfonic acid radical), phosphono radical (phosphoric acid radical), other acidic radical, and their salts. These acidic radicals adsorb pairing ions of anion exchange radicals, and form ester bond to be bonded.

It is also possible to those bonded by reacting with amino radicals of anion exchange radicals, such as aldehyde radical, epoxy radical, active ester radical, acid anhydride derivative radical, maleimide derivative radical, and alkoxysilyl radical. It is preferred to use aldehyde radical, epoxy radical, active ester radical, acid anhydride derivative radical, and maleimide derivative radical, because they can form a bond of high resistance to plating solution. A metal alkoxide derivative radical such as alkoxy silyl radical maybe also used. As active ester radical, 4-nitrophenyl oxycarbonyl radical derivative, and benzimide oxycarbonyl radical derivative may be used. Examples of alkoxysilyl radical include trimethoxysilyl radical, triethoxy silyl radical, triisopropoxy silyl radical, and methoxy dimethyl silyl radical.

(D) Permeation of Plating Solution

The method of permeating the plating solution selectively in an illuminated region or non-illuminated region in the porous material is not particularly specified, but various methods may be employed. Usually, the porous material is immersed in the plating solution.

(E) Electroplating

The electroplating method and plating solution are not particularly specified, and known plating methods and plating solutions may be employed. In particular, when using a porous material forming a photosensitive layer for producing or eliminating the anion exchange radical, it is preferred to use an acidic plating solution. A plating solution containing metal ion or ion containing metal is used, but a plating solution in which fine particles of polymer or ceramics is diffused may be also used. The electroplating substance is not limited to metal only, but ceramics or polymer may be also plated.

To promote deposition of plating in the pores of porous material, and to suppress deposition of plating after the plating is exposed outside of the porous material, it is preferred to add a leveling agent. Since supply of plating solution is not sufficient in the porous material, the portion once exposing the plating outside of the porous material is likely to be plated by priority. By adding a leveling agent, uniform plating in the porous material is realized. The leveling agent is not particularly specified, but any known agent may be used, for example, chloride ions obtained from calcium chloride. Besides, by pulse plating of exchanging the polarity applied to the electrode very frequently, it may be effective to suppress preferential plating of the exposed portion outside of the porous material.

(3) Reel-to-reel Continuous Process

Figure 12:
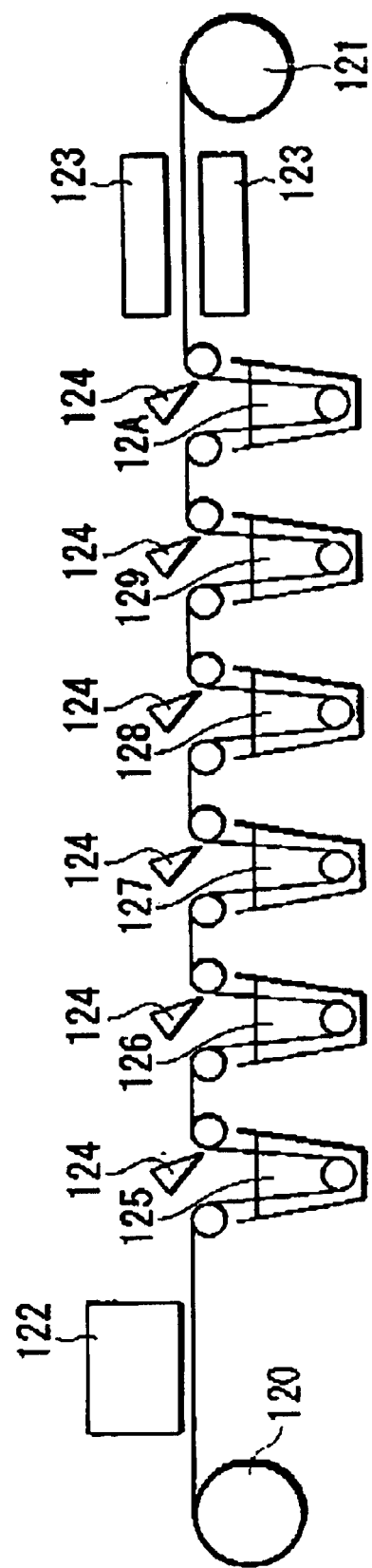
FIG. 12 is a schematic view of a device for forming a conductive region according to the present invention by using a continuous step of "reel to reel"

The manufacturing method of composite member in the first, second and third embodiments mentioned above can be also realized by a reel-to-reel continuous process by using a hoop base material. FIG. 12 shows an example of manufacturing method of composite member of the first and second embodiments of the invention according to the reel-to-reel continuous process. From a reel 120, a hoop base material forming a photosensitive layer is supplied. In an exposure device 122, the wiring pattern is exposed, and a latent image according to the wiring pattern is formed in the photosensitive layer. The base material forming the latent image is immersed in a plating nucleus adsorbing tank 125 filled with an plating nucleus solution such as platinate chloride aqueous solution, and the plating nucleus is adsorbed on the ion exchange radical on the base material. Excess plating nucleus solution is removed by an air knife 124. In a water washing tank 126, the remaining excess plating solution is cleaned. Excess cleaning water is removed by air knife. Consequently, in a reducing tank 127, the base material is immersed, and the plating nucleus is reduced and the plating nucleus is activated. When the metal colloid is used as the plating nucleus, it is not necessary to pass through the reducing tank. The excess reducing agent is removed in a water washing tank 128, and a conductive part is formed by electroless plating in an electroless plating tank 129. After electroless plating, excess plating solution is removed in a water washing tank 12A, and the base material forming the conductive part is dried in a dryer 123, and is supplied in a reel 121.

FIG. 13 shows an example of manufacturing method of composite member of the third embodiments of the invention according to the reel-to-reel continuous process. From a reel 130, as a hoop base material, a photosensitive porous sheet 131 protected with a protective film on both sides is supplied. The protective film 133 is peeled off by a roll 132, and is collected in a reel 134. The porous sheet without protective film is exposed with a wiring pattern by an exposure device 135, and a latent image (a pattern in plating solution permeation region) is formed. The porous sheet 136 forming the latent image remains wound tightly on a roll electrode 137, and is immersed into an electroplating solution tank 139 filled with an electroplating solution 138. At this time, the electroplating solution permeates into the plating solution permeation region of the porous sheet. Further, the roll electrode 137 is energized, and the plating deposits in the plating solution permeation region, and a conductive part is formed. The porous sheet 13B forming the conductive part is rid of excess plating solution by an air knife 13A, and is cleaned in a water washing tank 13C. The porous sheet forming the conductive part is cleaned, dried in a dryer 13E, and is stored in a red 13F.

EXAMPLES

The present invention will be explained in detail by way of examples, which, however, are not intended to be limiting of the present invention.

Example 1

In Example 1, a method will be explained in which a copper pattern of a condenser consisting of wiring, vias and comb type electrodes is formed on a porous sheet by using a light-sensitive molecule which generates an amino group by exposure and a high-dielectric polymer is screen-printed on the condenser section to produce a passive element substrate according to the present invention.

As the light-sensitive molecule generating an amino group as an anion exchange group by exposure, a polymer 1 which was a random copolymer shown by the following chemical formula was used. The polymer 1 was synthesized by a radical polymerization method using azobisisobutyronitrile (hereinafter referred to as AIBN) as a radical initiator.

[Formula 6]

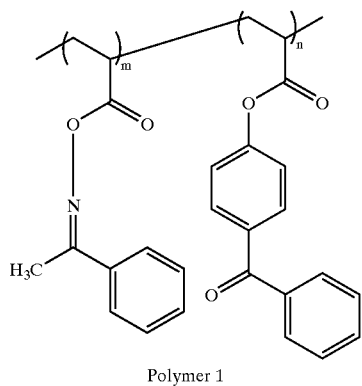

Polymer 1

First, a 100 ml eggplant-shape flask which was dried and in which the atmosphere was substituted with argon gas was charged with a solution prepared by dissolving 1 g of a monomer 1 represented by the formula shown below, 3,g of a monomer 2 represented by the formula shown below and 0.1 g of AIBN in 14 g of dry tetrahydrofuran (hereinafter referred to as THF) together with a stirrer. The solution was deaerated by bubbling using argon gas for one minute after it was placed in the flask. The solution was then heated at 60° C. for 40 hours with stirring slowly in an argon stream. After the heating was finished, the temperature of the solution was returned to ambient temperature. Then, the reaction solution was reprecipitated in a solvent. After reprecipitated, the solution was subjected to filtration using a glass filter to separate the precipitate, which was then dried under vacuum to obtain a polymer 1 as a white powder.

[Formula 7]

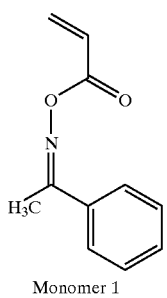

Monomer 1

[Formula 8]

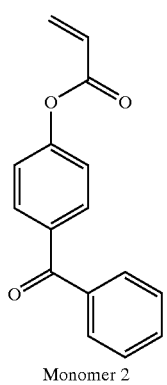

Monomer 2

A PTFE porous sheet (average pore diameter: 0.41.L m, film thickness: 60/.cm and porosity: 80%) which had been processed by hydrophilic treatment was immersed in a THF solution containing 5% by weight of the synthesized polymer 1. After the solution was sufficiently penetrated into the porous sheet by the immersion, the porous sheet was pulled up and dried under air to coat the inside surface of pores of the porous sheet with the polymer 1.

After the coating, the porous sheet was maintained in a porous state without any clogging of pores of the porous sheet. A parallel exposure apparatus CANON PLA 501 was used to carry out exposure in the condition of a light quantity of 1.2 J/cm$^2$ through a mask formed with a wiring pattern of a line width of 50 g m and a space of 50 $\mu$m and with a via pattern of a diameter of 50 m. As the mask, a half-tone mask was used in which the transmittances of the via pattern and wiring pattern were made to be 100% and 10% respectively. By this exposure, the wiring pattern portion was exposed to light only at the vicinity of the surface of the porous sheet and the via pattern portion was exposed to light penetrating through the porous sheet. Similar exposure was carried out also from the backface to carry out exposure of both surfaces.

Figure 8:
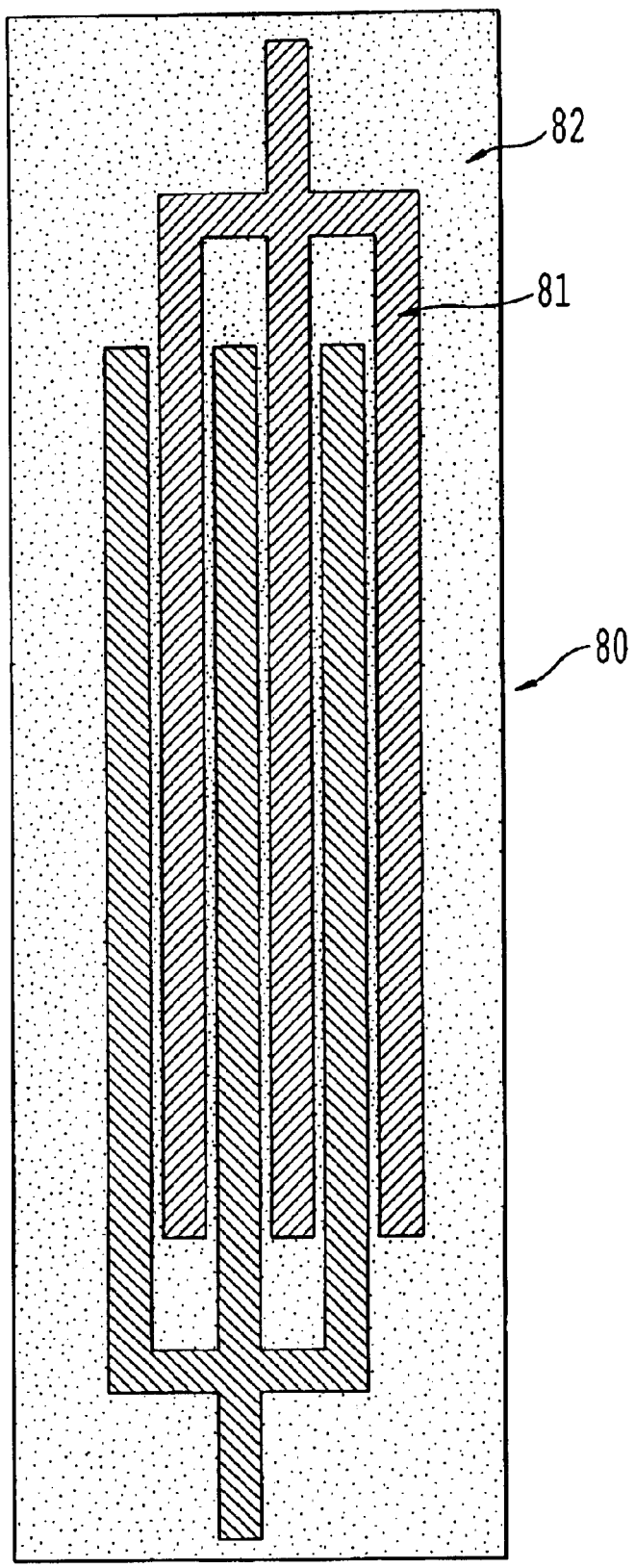
FIG. 8 is a top view showing one example of a comb-type electrode of a condenser according to the present invention.

Also, the sheet was exposed to light with an optical image containing a comb type electrode pattern as the condenser portion. The comb teeth pattern was formed by exposing both surfaces to light using a mask having a transmittance of 100% such that the sheet was exposed to light penetrating through the sheet. The exposed porous sheet was soaked in an aqueous 10 wt % chloro-gold acid for 30 minutes to adsorb a chloro-gold acid ion to an amino group. After the adsorbing operation was finished, the sheet was washed with distilled water to remove an excess aqueous chloro-gold acid solution. After washed, the sheet was soaked in an aqueous 0.01 M sodium borohydride solution for 5 minutes and then washed with distilled water. Further, the sheet was soaked in an electroless copper plating solution PS-503 at 40° C. for 2 hours to carry out copper plating, thereby obtaining a double wired sheet in which a Cu surface wiring with a line width of 50 μm, a space of 50 μm and a thickness of 10 μm is formed on both surfaces thereof and each wiring formed on both surfaces was connected with each other through a Cu via having a diameter of 50 μm. Also, as shown in FIG. 8, a comb type electrode having a width of 50 μm and a space of 10 μm and formed so as to penetrate through the sheet was formed in the condenser portion. In FIG. 8 numeral 80 refers to a condenser element, numeral 81 refers to conductive areas and numeral 82 refers to dielectric areas. A γ-butyrolactone solution of a high-dielectric polymer (trademark: Cyano Resin, manufactured by Shin-Etsu Chemical Co., Ltd.) was printed on the condenser portion of this double wired sheet by screen printing. The inside of holes of the porous sheet was well impregnated with the printed high-dielectric polymer. After the high-dielectric polymer was printed, the region of the porous sheet except for the region corresponding to the condenser portion was impregnated with an epoxy resin, followed by curing under heating to obtain a composite material with a built-in condenser. The capacity of the formed condenser was 2 pF.

Example 2

In Example 2, a method is explained in which a copper pattern of wiring and an inductor is formed using a light-sensitive molecule generating a carboxyl group by exposure to light and a ceramic paste is screen-printed on the inductor portion to thereby making a passive element substrate according to the present invention.

A PTFE porous sheet (pore diameter: 0.4 μm, film thickness 60 m and porosity: 800) was prepared as an insulation porous sheet in the same manner as in Example 1. In the meantime, a phenol resin having a naphthoquinonediazide group at its side chain (ratio of introduction of naphthoquinonediazide group: 33 equivalent mol %) was dissolved in acetone to prepare a 1 wt. % acetone solution. When the foregoing sheet was coated with the obtained light-sensitive agent solution by dipping method, the surface of internal pores including the inside of the pores of the porous sheet was coated with the light-sensitive composition.

Both surfaces of the sheet were exposed to light by using a CANON PLA 501 at an intensity of 1.2 J/cm$^2$ through masks each for front and back surfaces provided with a pattern of the inductor portion as shown in FIG. 9 to produce an ion exchange group at the exposed portion.

Figure 9A:
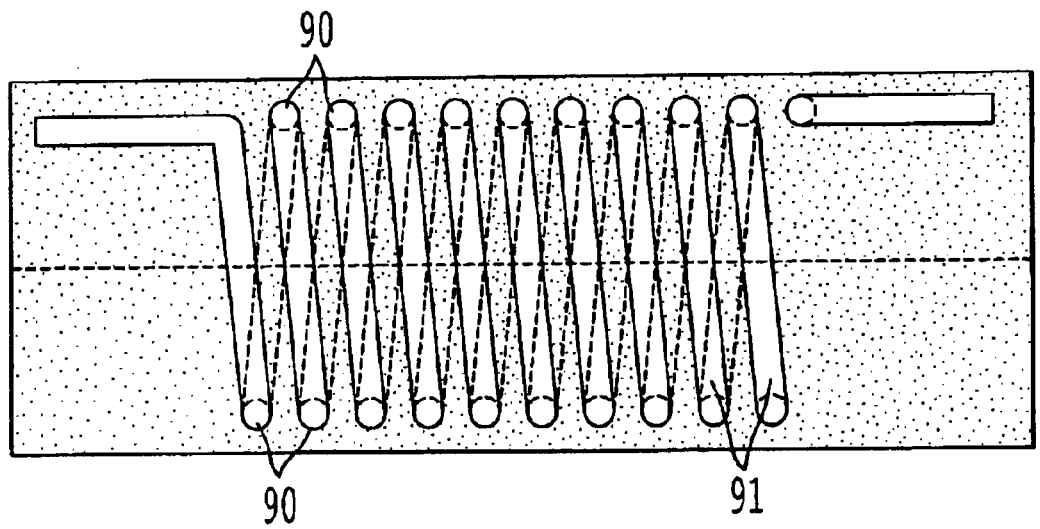
FIG. 9(A) is a mask pattern for exposing one side of a sheet and FIG. 9(B) is a mask pattern for exposing the other side of the sheet.
Figure 9B:
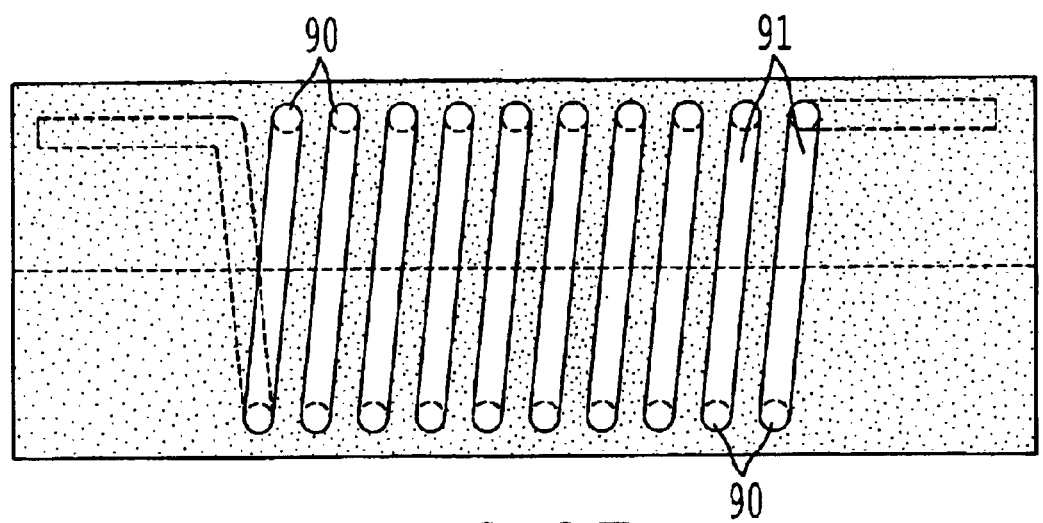
Figure 10A:
FIG. 10 is a diagram showing a method of forming a conductive region as a method adoptable in the present invention, wherein (a) to (e) show sectional views of a substrate in each step.
Figure 10B:
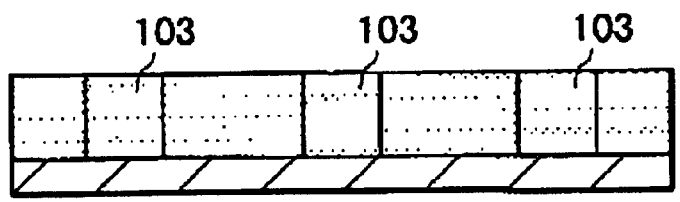
Figure 10C:
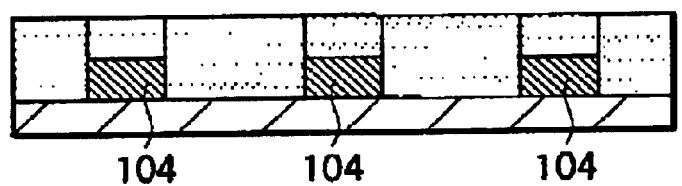
Figure 10D:
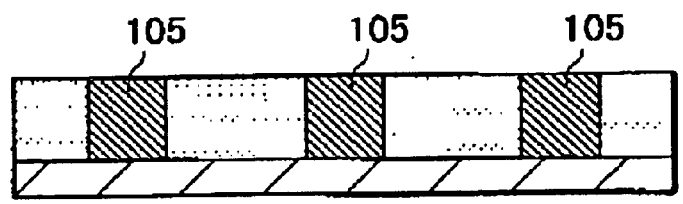
Figure 10E:
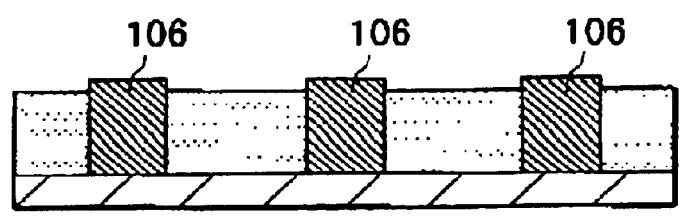

FIG. 9A is a mask pattern for exposing one side of a sheet. FIG. 9B is a mask pattern for exposing the other side of the sheet. Numeral 90 refers to the portion for through-pattern formation and numeral 91 refers to the portion for surface-pattern formation.

By this process, a pattern latent image comprising the ion exchange group was formed on the light-sensitive composition layer. The mask consisted of a through-pattern formation portion having a transmittance of 100% and a surface-pattern formation portion having a transmittance of 10%.

The porous sheet formed with a latent image was soaked in an aqueous 0.01 M sodium borohydride solution for 30 minutes and then washing with distilled water was repeated three times. In succession, the sheet was soaked in an aqueous copper acetate solution prepared in a concentration of 0.5 M for 30 minutes and then washing with distilled water was repeated three times. Further, the sheet was soaked in an aqueous 0.01 M sodium borohydride solution for 30 minutes, followed by washing with distilled water. Moreover, the sheet was soaked in an electroless copper plating solution PS-503 at 40° C. for 3 hours to carry out copper plating on the conductive portion, thereby forming a conductive pattern of a flat spiral inductor having a center axis in parallel to the surface of the sheet. At this time, the thickness of the conductive pattern was about 20 μm. Furthermore, voids left in the porous sheet corresponding to the inductor portion was impregnated and filled with an epoxy resin containing 5 wt % of alumina microparticles by a screen printing method. After printed, the sheet was impregnated with an epoxy resin, followed by curing under heating to obtain a composite material with a built-in inductor. The inductance of the formed inductor was 10 nH.

Example 3

In Example 3, a method of producing a substrate with a built-in passive element according to the present invention is explained in which method a copper pattern of wiring, a condenser and an inductance is formed on a porous sheet by using a light-sensitive molecule generating a carboxyl group by exposure to fabricate a condenser and an inductor on one porous sheet. Wiring, a condenser portion and an inductor portion were formed using the same light-sensitive agent as in Example 2 in the same manner as in Examples 1 and 2 except that both surfaces were exposed at an exposure amount of 1.2 J/cm$^2$. A high dielectric polymer was screen-printed on the condenser portion and an alumina paste was screen-printed on the inductor portion to form a condenser element and an inductor element on one porous sheet. The remainder portion where wiring and a via were formed was impregnated with an epoxy resin, which was then cured to fabricate a passive element composite component according to the present invention. The capacity of the condenser element was 2 pF and the inductance of the inductor element was 10 nH.

Below, the examples and comparative example which are consulted as the formation method of an electric conductor layer in porous sheet will be explained.

Example 4

In the example 4, a method of forming a copper pattern to a porous sheet will be explained in the following as an example of the manufacture method of a component of the 1st and 2nd embodiments using the photosensitive polymer which generates an amino group by exposure.

Synthesis of polymer 1

The polymer 1 which is the random copolymer shown with the following chemical formula (34) was used as photosensitive polymer which generates an amino group which is an anion exchange group by exposure.

[Formula 34]

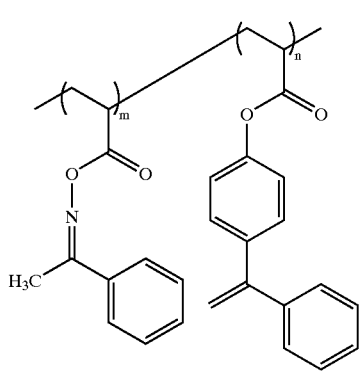

A polymer 1 is a compound of a weight average molecular weight 30,000 synthesized by the polymerization method like the following the radical polymerization which used azobisisobutyronitrile (it is called AIBN hereinafter) as a radical polymerization initiating agent.

First, the solution which dissolved 1 g of monomer 1 shown with the following formula (35), 3 g of monomer 2 shown with the following formula (36), and 0.1 g of AIBN in 14 g of dried tetra hydro furan (it is called THF hereinafter), were added into the 100 ml flask which was dried and replaced by argon gas, with a stirrer.

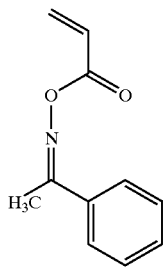

[Formula 35]

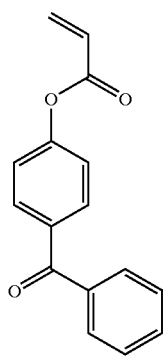

[Formula 36]

After putting solution into a flask, it was bubbled and degassed by argon gas for 1 minute. While agitated slowly, it was heated at 60 degrees centigrade under the argon flow for 40 hours. After heating, and then returning to room temperature, it was re-precipitated in the methanol solvent. After re-precipitation, precipitated material was separated from the solution by the filtration using a glass filter. The filtrated material was dried in vacuum, and polymer 1 was obtained as white powder.

Formation of a Photosensitive Layer

The porous sheet (0.2 micrometers of average pore size, 20 micrometers of thickness) of hydrophilicitized polytetrafluoroethylene (PTFE)resin was dipped in the 5 weight % THF solution of synthesized polymer 1. After the solution was permeated to the porous sheet enough by dipping, the porous sheet was pulled up and dried in the atmosphere, and the surface of pore in a porous sheet was coated with the polymer 1. After coating, the pore of a porous sheet was not blockaded and still in the porous state.

Exposure

With the parallel exposure vessel (PLA501 made from Canon), the porous sheet was exposed with the condition that quantity of light was 2 J/cm$^2$ through the mask having a circuit pattern with lines of 20 micrometers width, and spaces of 30 micrometer, and pattern latent image was formed in the exposed area wherein the amino group was generated.

Adsorption of a Plating Core

The porous sheet in which pattern latent image was formed, was immersed in 10 wt % chloroplatinic acid solution for 30 minutes, and chloroplatinic acid ion was stuck to an amino group. After adsorption, the porous sheet was washed with distilled water and excessive chloroplatinic acid aqueous solution was removed. After washing, the porous sheet was dipped for 5 minutes in sodium borohydride 0.01 M aqueous solution and then it was washed with distilled water.

Plating

Furthermore, the porous sheet was dipped in electroless plating bath containing copper plating liquid PS-503 at 40 degrees centigrade for 3 hours, and copper plating was formed, and the composite material which can be used as a wiring sheet with which Cu circuit pattern as a line width of 20 micrometers and a space 30 micrometer mask was formed, was obtained. Moreover, the composite component which can be used as a wiring sheet (via sheet) with which it plated with the same technique using the mask of the via pattern of the diameter of 50 micrometer, and via was formed, was obtained.

Evaluation

Using the manufactured wiring sheet and the via sheet, the composite component having good wiring and via was obtained without any poor plating which was caused from peeling of a photosensitive composite layer.

Use

After laminating of these four wiring sheets and three via sheets mutually, the laminated sheets were dipped in a resin liquid containing 100 weight part of 1,2-polybutadien (molecular weight 8000), 5 weight part of dicumilparoxide, and then they were heated and hardened at 170 degrees centigrade for 1 hour. The multilayer-interconnection substrate was manufactured.

Comparative Example 1

As a comparative example of the above-mentioned example 4, using a polymer which generates a cation exchange group, replaced with polymer 1, a wiring sheet was tried to manufacture as follows. 1 weight part mixture of the naphthalic imide-tri-fluoro-methane sulfonate as a photo-acid generating agent was first added to the random copolymer of a poly-methyl-methacrylate-poly-tetrahydromethacrylate (60 molo: 40 mol %, Mw=40000). The photosensitive composite solution of acetone was prepared by dissolving the resin and the photo-acid generating agent to acetone so that the sum total for the resin and solid of photo-acid generating agent might become 1 weight part. The above-mentioned photosensitive composite was coated to the porous sheet by the dipping method using the same porous sheet as the example 4. After the coating, the porous sheet was exposed using the same exposure equipment and same mask as the example 4, and latent image was formed in an exposed area of this porous sheet. Then, the de-masking reaction was promoted and the exposure area was made to generate the carboxyl group which is a cation exchange group by heating on a hot plate. The sheet with which latent image was formed, was dipped for 5 minutes in the copper sulfate solution which adjusted to 0.5M, then it was washed by distilled water 3 times. The sheet was dipped in sodium borohydride 0.01M solution for 30 minutes, and then washed by distilled water. After washing, it was dipped in the electroless copper plating liquid PS-503 which is the same as an example 4, at 40 degrees centigrade for 3 hours, copper plating was performed, and the wiring sheet was obtained. The defect of the plating pattern considered that the area of produced wiring sheet was originated in an exfoliation of a photosensitive layer from the porous sheet, was seen.

Example 5

It is explained that an example of the composite of the 1st of this invention of an example 5, or the 2nd mode—the example using the porous sheet which becomes basis material from the nonwoven fabric of a detailed aramid fiber is explained as an example of the manufacture method of a component Manufacture of a Nonwoven Fabric The nonwoven fabric in thickness of 50 micrometers was made by dipping up fine aramid fiber having diameter from 0.2 to 0.3 micrometer (Dicel chemistry company make, brand name tiara).

Hydrophilicitize Process

After degreasing, and sequentially washing by methanol, the nonwoven fabric was immersed into N-hydroxyphthalimid 5 mmol, cobalt acetylacetonato (II) 0.05 mmol, and the mixed solution of 30 ml of acetic acid, and under oxygen atmosphere (1atm), at 75 degrees centigrade, it was kept calmly for 4 hours, oxidization and hydrophilicitize processed. It was washed after the hydrophilicitize process.

Coating

The hydrophilicitized nonwovenfabric was immersed in the 5-% of the weight THF solution of polymer 1. After solution permeated the nonwovenfabric enough by being immersed, natural dryness was pulled up and carried out and coating of the polymer 1 was carried out to the fiber surface of a nonwoven fabric. Pore of a nonwoven fabric was not blockaded but after coating held the porosity state.

Exposure

With the parallel exposure vessel (PLA501 made from Canon), it exposed on condition that quantity of light 200 mJ/cm2 through the mask of a line width [of 100 micrometers], and space 200 micrometer circuit pattern, and pattern latent image which the amino group which is a shade ion exchange nature machine generated was formed in the exposure part.

Adsorption of a Plating Core

The nonwoven fabric in which pattern latent image was formed was immersed in the chloride solution of 0.1N for 10 minutes. An amino group changes with chlorides to ammonium salt. After being immersed, after washing, it was immersed in the solution of a complex 1 shown with the following chemical formula (37). A complex 1 has sodium salt of a carboxyl group as a unity machine. This unity machine sticks to the ammonium base which is an anion exchange group.

[Formula 37]

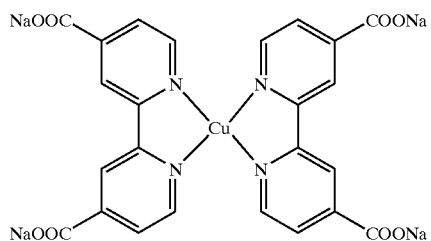

It was immersed in the solution of a complex 1 for 30 minutes, and the complex 1 was made to stick to an amino group. After adsorption, distilled water washed and the excessive complex 1 was removed. Distilled water washed after being immersed for 5 minutes in hydrogenation boron sodium 0.0M solution after washing.

Plating

Furthermore, it was immersed in nothing electrolysis copper plating liquid PS-503 at 40 degrees for 3 hours, copper plating was given, and the composite material which can be used as a wiring sheet with which Cu circuit pattern as a line width of 100 micrometers and a space 200 micrometer mask was formed was obtained.

Evaluation

As for the circuit pattern, wiring with a width of 100 micrometers was formed in the exposure side of a nonwoven fabric by about 20 micrometers in thickness. The unusual deposit of plating was not observed by the non-exposed part. Impregnating and pressurizing an epoxy resin at this, heat for 1 hour, it was made to harden at 120 degrees under a nitrogen air current, and the wiring board was manufactured. The manufactured wiring board had enough bending intensity and the sheet resistance of wiring was below 1.5 mohm/□, which is sufficient rate of electric conduction.

Example 6

In example 6, a method will be explained in which a composite component is manufactured using the porous sheet which becomes basis material from the nonwoven fabric of the PPS fiver produced by the melt blowing method.

Manufacture of a Nonwoven Fabric

The nonwoven fabric with a thickness of 50 micrometers it is thin from a PPS fiber with a diameter of about 1–2 micrometers manufactured by the melt blowing method, was manufactured.

Hydorophilicitize Process

With the plasma irradiation vessel (KEYENCE CORP. make), plasma processing in the atmosphere was carried out and this nonwoven fabric was hydrophilicitized.

Formation of a Circuit Pattern

The wiring board which has wiring with a 100-micrometer width and a thickness of about 20 micrometers like a case of the operation 2 was manufactured after hydrophilicitize process.

Evaluation

The manufactured wiring board had enough bending intensity and the sheet resistance of wiring was below 1.5 mohm/□, which is sufficient rate of electric conduction.

Example 7

Package Formation of Surface Wiring and Via

In the example 7, a method to carry out package formation of surface wiring and the via by one exposure to a porous sheet will be explained as an example of the manufacture method of a component using the photosensitive polymer which generates an amino group by exposure.

Formation of a Photosensitive Layer

The PTFE porous sheet (0.2 micrometers of average pore size, 30 micrometers of thickness of film) hydrophilicitize-processed in the 5-% of the weight THF solution of the polymer 1 same with having used in the case of the operation 1 was immersed. After it was immersed and solution permeated the porous sheet enough, natural dryness was pulled up and carried out and coating of the polymer 1 was carried out to the surface in pore of a porous sheet. Pore of a porous sheet was not blockaded but after coating held the porosity state.

Exposure

It exposed on condition that quantity of light 2 J/cm2 through the mask with which a line width of 50 micrometers, the space 50 micrometer circuit pattern, and the via pattern with a diameter of 50 micrometers were formed using the parallel exposure machine (PLA501 made from Canon). As a mask, the half-tone mask which made transmissivity of a circuit pattern part 10% for the transmissivity of a via pattern part 100% was used. A circuit pattern part exposes near the surface of a porous sheet by this exposure, and a via pattern part penetrates and exposes a porous sheet.

Adsorption of a Plating Core

The exposed porous sheet was immersed in 10 wt % chloroaurate solution for 30 minutes, and ion of chloroaurate was made to stick to an amino group. After adsorption, distilled water washed and excessive chloroaurate solution was removed. Distilled water washed after being immersed for 5 minutes in hydrogenation boron sodium 0.1M solution after washing.

Plating

Further, the sheet was soaked in an electroless copper plating solution PS-503 at 40° C. for 3 hours to carry out copper plating, thereby obtaining a double wired sheet in which a Cu surface wiring with a line width of 50 μm, a space of 50 μm and a thickness of 10 μm is formed on both surfaces thereof and each wiring formed on both surfaces was connected with each other through a Cu via having a diameter of 50 μm.

Evaluation

The sheet resistance of this Cu surface wiring had abbreviation 2 mohm/□ and sufficient rate of electric conduction. If this composite material is stuck on both sides of core wiring boards, such as a double-sided wiring board, a build-up wiring board can be manufactured.

Example 8

Example Using Base Multiplication Nature Photosensitivity Polymer

In the example 8, a method of forming a copper pattern to a porous sheet will be explained in the following as an example of the manufacture method of a component of the 1st and 2nd embodiments using the photosensitive polymer which combined the polymer which generates a amino group by exposure, and the base multiplication nature polymer which generates a amino group in self-multiplication with a amino group as an example of the manufacture method of a component.

Formation of a Photosensitive Layer

The PTFE porous sheet (0.2 micrometers of average pore size, 20 micrometers of thickness of film) hydrophilicitization process in the 5 weight % solution of the mixture of 1:2 by the weight ratio with the base multiplication nature polymer 2 shown with polymer 1 and the following chemical formula (38) was immersed. After solution permeated the PTFE porous sheet enough by being immersed, natural dryness was pulled up and carried out, and coating of the polymer 1 was carried out to the surface in pore of a porous sheet. Pore of a porous sheet was not blockaded but after coating held the porosity state.

[Formula 38]

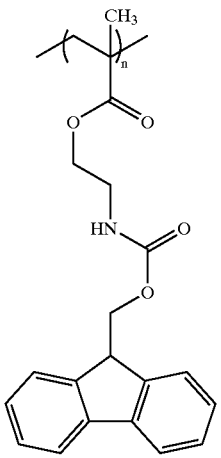

Exposure

With the parallel exposure vessel (PLA501 made from Canon), it exposed on condition that quantity of light 200 mJ/cm2 through the mask of a line width [of 100 micrometers], and space 200 micrometer circuit pattern. It heat-treated for 5 minutes at 130 degrees after exposure, and pattern latent image which the amino group which is a shade ion exchange nature machine generated was formed in the exposure part.

Adsorption of a Plating Core

It was immersed in the chloride solution same with having used the porous sheet in which pattern latent image was formed, in the case of the operation 2, and the solution of a complex 1. A complex 1 has sodium salt of a carboxyl group as a unity machine. This unity machine sticks to an amino group.

It was immersed in the solution of a complex 1 for 30 minutes, and the complex 1 was made to stick to an amino group. After adsorption, distilled water washed and the excessive complex 1 was removed. Distilled water washed after being immersed for 5 minutes in hydrogenation boron sodium 0.01M solution after washing.

Plating

Furthermore, it was immersed in nothing electrolysis copper plating liquid PS-503 at 40 degrees for 3 hours, copper plating was given, and the composite material which can be used as a wiring sheet with which Cu circuit pattern as a line width of 100 micrometers and a space 200 micrometer mask was formed was obtained.

Evaluation

Wiring with a width of 100 micrometers penetrated to the both sides of a porous sheet, and the circuit pattern was formed. The unusual deposit of plating was not observed by the non-exposed part. Impregnating and pressurizing an epoxy resin at this, heat for 1 hour, it was made to harden at 120 degrees under a nitrogen air current, and the wiring board was manufactured. The manufactured wiring board had enough bending intensity and the sheet resistance of wiring was below 1.5 mohm/□, which is sufficient rate of electric conduction.

Example 9

In the example 9, a method of forming a copper pattern to a porous sheet will be explained in the following as an example of the manufacture method of a component of the 1st embodiments using the photosensitive polymer which has the photosensitive group which disappears a anion exchange group as an example of the manufacture method of a component.

Composition of Polymer 3

As polymer which forms a photosensitive layer, the copolymerization polymer 3 of the monomer 3, the monomer 4, and methyl meta-chestnut rate which are shown by the following chemical formula (39) and (40), respectively was compounded. A monomer 3 has the basis which disappears anion exchange group (sulfonium group) by optical irradiation, and a monomer 4 has the poly hedralorigosylsesquioxane derivative group which is 3-dimensional a basis which can construct a bridge-like.

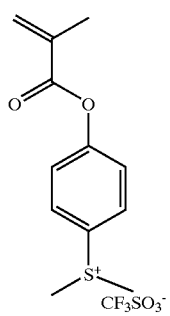

[Formula 39]

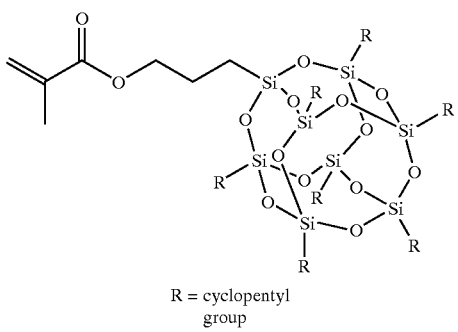

[Formula 40]

R = cyclopentyl group

The mixed solution which dissolved composition of copolymer polymer 3 in the tetra hydro furan (THF) which degassed the mixture of three kinds of monomers—as a polymerization initiator—2,2'-azobisisobuthyronitril (AIBN)—in addition, it carried out by carrying out polymerization under argon atmosphere. The weight average molecular weight of polymer 3 was 170, 000. The rate of a weight part in the polymer 3 of each monomer was as follows. Monomer 3 was 17%, monomer 4 was 22%, a methyl-metacrylate was 61%.

Formation of a Photosensitive Layer

The PTFE porous sheet (0.2 micrometers of average pore size, 20 micrometers of thickness of film) hydrophilicitization process in the 5-% of the weight THF solution of compound polymer 3 was immersed. After it was immersed and solution permeated the porous sheet enough, natural dryness was pulled up and carried out and coating of the polymer was carried out to the surface in pore of a porous sheet. Pore of a porous sheet was not blockaded but after coating held the porosity state.

Exposure

With the parallel exposure vessel CANON PLA501, it exposed on condition that quantity of light 800 mJ/cm2 through the mask of the dot array pattern (dot pitch=500 micrometer) which has the shading part of the shape of a diameter=of dot 200 micrometer dot. Since the anion exchange group (sulfonium group) of an exposure part was disassembled and anion exchange ability was lost, only the non-exposed part has formed pattern latent image by which the shade ion exchange nature machine has been arranged.

Adsorption of a Plating Core

It was immersed in the solution of the complex 1 same with having used the porous sheet in which pattern latent image was formed, in the case of the operation 2. A complex 1 has sodium salt of a carboxyl group as a unity machine. This unity machine sticks to the sulfonium group which is anion exchange group. It was immersed in the solution of a complex 1 for 30 minutes, and the complex 1 was made to stick to the sulfonium group which is a shade ion exchange nature machine. After adsorption, distilled water washed and the excessive complex 1 was removed. Distilled water washed after being immersed for 5 minutes in hydrogenation boron sodium 0.01M solution after washing.

Plating

After washing with distilled water, the sheet was soaked in an electroless copper plating solution PS-503 at 40° C. for 3 hours to carry out copper plating, thereby obtaining a composite material which can be used as an anisotropic electric conduction sheet with which it penetrated to front reverse side both sides of aporous sheet in the shape of (diameter of dot was 200 micrometer and dot pitch was 500 micrometer) a dot array, and copper deposited was obtained Poor plating to which the produced composite material originates in peeling of a photosensitive composite layer was not observed, but the good copper pattern was formed.

Example 10

In the example 10, a method of forming a copper pattern to a porous sheet will be explained in the following as an example of the manufacture method of a composite material of the 1st embodiments using the photosensitive polymer which has the photosensitive group which disappears an anion exchange group as an example of the manufacture method of a component.

Composition of Polymer 4

As polymer which forms a photosensitive layer, the polymer 4 shown with the following chemical formula (41) was used. The sulfonium group of the side chain of polymer functions as anion exchange group, and loses anion exchange ability by exposure.

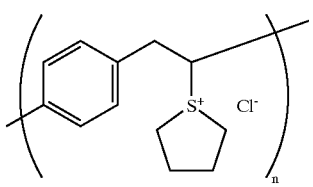

[Formula 41]

Polymer 4 was compounded as follows. 15 g tetrahydrothiophene was added to methanol solution (0.75M) of 10 g of xylylene dichloride among 300 ml eggplant flask equipped with the flowing-back pipe, and it agitated at 50 degrees for 20 hours. The solvent was removed after stirring. The residual substance was dissolved in methanol at the mixed solvent small quantity which mixed little water and it re-precipitation in acetone of 0 degrees centigrade. After acetone of 0 degrees centigrade washed precipitation, vacuum drying was carried out and white precipitation was obtained.

3.51 g of the obtained white precipitation was dissolved in 50 ml of water which was degassed, under the argon air current, and 50 ml of 0.1M sodium hydroxide was dropped into it under refrigeration with ice for 5 minutes. It agitated under refrigeration with ice after dropping for 1 hour. The hydrochloric acid solution of 1M was added after churning, and it neutralized about to pH six. After neutralization, the reaction liquid was fill up to semipermeable membrane (brand name Spectra/pore 3, Mw3500), and it was dialyzed for three days with the water which blew and degassed argon gas. The solution of polymer 4 was obtained as a light yellow liquid after dialysis.

Formation of a Photosensitive Layer

The solution of the polymer 4 obtained on the glass fiber strengthening bis-maleimide-triazine resin board which surface was roughened. The application was performed by number-of-rotations 300 rpm by the spin coating method. It was dried in air at room temperature after the application, and the thin film of polymer 4 was formed in the substrate surface.

Exposure

It exposed on condition that quantity of light 7 J/cm2 through the mask of the circuit pattern (line pitch was 500 micrometer) which has the shading part of the shape of a line width was 200 micrometer line to the bis maleimide-triazine resin board in which the thin film of polymer 4 was formed. Since the anion exchange group (sulfonium group) of an exposure part was disassembled and anion exchange ability was lost, only the non-exposed part had formed pattern latent image in which the anion exchange group has been arranged.

Adsorption of a Plating Core

The bismaleimide-triazine resin board in which pattern latent image was formed was immersed in sodium chloroaurate solution for 30 minutes 10% of the weight, and chloroaurate ion was made to stick to a sulfonium group. After adsorption, the resin board was washed by distilled water and excessive sodium chloroaurate solution was removed. After washed, it was immersed in hydrogenation boron sodium 0.01M solution for 5 minutes, and then it was washed with distilled water. The non-exposed part presented the purple resulting from surface plasmon absorption of the particle of the generated gold.

Plating

It was immersed in nothing electrolysis copper plating liquid PS-503 at 40 degrees after washing with distilled water for 3 hours, and copper plating was given. It heat-treated for 30 minutes at 200 degrees under the nitrogen air current after copper plating, and the composite material which can be used as a wiring board to which copper deposited on the bismaleimide-triazinerear gin resin board in the shape of (line width=200 micrometer and line pitch=500 micrometer) a line was obtained. In this heating process, the sulfonium group of polymer 4 is fallen away, and it changed to poly paraphenylene-vinyl ene or its oxide which has non-ion nature without fear of corrosion, and the heat-resistance.

Evaluation

Poor plating to which the produced composite material originates in peeling of a photosensitive composite layer was not observed, but the good copper pattern was formed. Moreover, the sheet resistance of wiring showed abbreviation 1.5 mohm/☐ and sufficient conductivity. Furthermore, it tore off to the substrate of wiring and intensity was also as good as 1 or more N/cm.

Example 11

Example Using the Photosensitive Silane Coupling Agent

In the example 11, a method will be explained in which a copper pattern is formed on a glass substrate using the photosensitive compound having the basis combined with the functional group on the surface of a substrate and a photosensitive group.

Formation of a Photosensitive Layer

The solution of the photosensitive composite which mixed the photosensitive compound shown with the following chemical formula (42) and tri-isopropoxy aluminum at a rate of 80:1 by the weight ratio was adjusted.

[Formula 42]

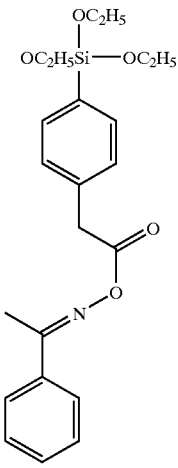

The adjusted photosensitive composite solution was applied by the spin coating method on the glass substrate made pure by the usual state method. The glass substrate was heated for 1 minute at 100 degrees C on the hot plate after the application, the application film was dried, and the photosensitive layer was formed. The thickness of the obtained photosensitive layer was about 5 nm. The silanol group generated from a photosensitive compound forms the Shiroki Sun combination by the silanol group and drying condensation reaction on the surface of glass.

Exposure

To the glass substrate in which the photosensitive layer was formed, it exposed on condition that quantity of light 50 mJ/cm2 through the mask of a line width=200 micrometer (line pitch=500 micrometer) circuit pattern, and pattern latent image which the amino group generated at the exposure part was formed.

Adsorption of a Plating Core

The glass substrate in which pattern latent image was formed was immersed in 10 wt % chlorination platinum acid solution for 30 minutes, and platinum complex ion was made to stick to an amino group. After adsorption, distilled water washed and excessive chlorination platinum acid solution was removed. Distilled water washed after being immersed for 5 minutes in hydrogenation boron sodium 0.01M solution after washing.

Plating

It was immersed in nothing electrolysis copper plating liquid PS-503 at 40 degrees after washing with distilled water for 5 hours, and copper plating was given. Line width=200 micrometer, a line pitch=the composite material which can be used on a glass substrate 500 micrometers in the shape of a line as a wiring board to which copper deposited was obtained.

Evaluation

Poor plating to which the produced composite material originates in peeling of a photosensitive composite layer was not observed, but the good copper pattern was formed. Moreover, the sheet resistance of wiring showed the conductivity which can be used as abbreviation 8 mohm/☐ and wiring.

Formation of a Reversal Pattern

The fluoride compound (3-par full orthhexyl-1, 2-epoxy liquefied petroleum gas) was contacted to the glass substrate in which above-mentioned pattern latent image was formed, and it heated for 10 minutes at 80 degrees. Thereby, a fluoride compound forms and adsorbs the amino group and combination which were generated in the exposure part. The portion to which the fluoride compound was absorbed, changes to water repellence.

It exposed completely on condition that quantity of light is 200 mJ/cm2 after adsorption. The amino group was generated in addition to the portion to which the fluoride compound stuck by this. The glass substrate was immersed in chloroaurate sodium solution for 30 minutes 10% of the weight after complete exposure, and chloroaurate ion was made to stick to an amino group. After adsorption, distilled water washed and excessive sodium chloroaurate solution was removed. After washed, the porous sheet was immersed for 5 minutes in hydrogenated sodium borate 0.01M solution, and then washed by distilled water. It was immersed in nothing electrolysis copper plating liquid PS-503 at 40 degrees after washing with distilled water for 5 hours, and copper plating was given. Line width=300 micrometer, the line pitch which were reversed with the mask pattern at the time of exposing first=the composite material which can be used on a glass substrate 500 micrometers in the shape of a line as a wiring board to which copper deposited was obtained.

Example 12

Electrolysis Plating

A case of the operation 12 explains how to form wiring and via in a porous sheet by electrolysis plating using the photosensitive polymer which generates the amino group which is a shade ion exchange nature machine by exposure as an example of the manufacture method of the 3rd mode of this invention.
Formation of a Photosensitive Layer The PTFE porous sheet (0.2 micrometers of average pore size, 20 micrometers of thickness of film) hydrophilicitization process in the 5-% of the weight THF solution of the polymer 1 same with having used in the case of the operation 1 was immersed. After it was immersed and solution permeated the porous sheet enough, natural dryness was pulled up and carried out and coating of the polymer 1 was carried out to the surface in pore of a porous sheet. Pore of a porous sheet was not blockaded but after coating held the porosity state.
Exposure It exposed on condition that 2 1.2 J[/cm] quantity of light through the mask with which a line width of 50 micrometers, the space 50 micrometer circuit pattern, and the via pattern with a diameter of 50 micrometers were formed using the parallel exposure machine (PLA501 made from Canon), and pattern latent image which the amino group generated in the exposure part was formed.
Electrolysis Plating The exposed porous sheet was stuck on copper electrode with a thickness of 0.5 mm through the conductive adhesion tape. This was flooded with electrolysis plating liquid and electrolysis plating was carried out by impression voltage 6V by making a copperplate into opposite electrode. Electrolysis plating liquid used copper sulfate and the mixed solution of chlorination calcium. Since electrolysis plating liquid is acidity, the amino group machine generated in the exposure part changes to the ammonium ion which shows strong parent water. For this reason, plating liquid had permeated the exposure part alternatively. Copper deposited only in the exposure part which plating liquid permeated by electrolysis plating, and the composite material which can be used as the wiring sheet with which Cu wiring of line width of 50 micrometers and space 50 micrometer and Cu via with a diameter of 50 micrometers were formed,or an anisotropic electric conduction sheet was obtained.
Evaluation When the section of the portions of Cu wiring or Cu via was observed by the scanned type electron microscope, it filled up with pore of a porous sheet with copper nearly completely.

Example 13

In example 13, a method will be explained in which how to form wiring and via in a porous sheet by electrolysis plating using the photosensitive polymer which disappears the sulfonyl group which is an anion exchange group by exposure as an example of the manufacture method of the 3rd mode of this invention.
Synthesis of Polymer 5

The co-polymer 5 of the monomer 3 same as the monomer used in the example 6 and the poly-methyl-methacrylate (PMMA) was synthesized. The polymer was synthesized by the polymerization with the mixed solution which contained 2 kind of monomer dissolved in the tetrahydrofuran (THF) and 2,2'-azobisisobutyronitril (AIBN) as a polymerization initiator in argon atmosphere. The weight average molecular weight of polymer 3 was 30,000. The rate of a weight part in the polymer 5 of each monomer is as follows. Monomer 3 was 32%, and methyl-methacrylate was 680.
Formation of a Photosensitive Layer The PTFE porous sheet (0.2 micrometers of average pore, 20 micrometers of thickness of film) hydrophilicization-processed in the 5-0 of the weight THF solution of compound polymer 5 was immersed. After it was immersed and solution permeated the porous sheet enough, natural dryness was pulled up and carried out and coating of the polymer was carried out to the surface in pore of a porous sheet. Pore of a porous sheet was not blockaded but after coating held the porosity state.
Exposure With the parallel exposure vessel CANON PLA501, it exposed on condition that 2 1.2 J [/cm] quantity of light through the mask of the dot array pattern (dot pitch= 500micrometer) which has the shading part of the shape of a diameter=of dot 200 micrometer dot. It decomposes and the shade ion exchange nature machine (sulfonium group) of an exposure part changes to canal nature. The shade ion exchange nature machine which receives and exists in dot-like a non-exposed part is parent water, and can permeate plating liquid.
Electrolysis Plating The exposed porous sheet was stuck to the pillar with a diameter of 2 cm made from stainless steel, and it twisted and fixed. This was flooded with electrolysis plating liquid and electrolysis plating was carried out by impression voltage 6V by making a copperplate into opposite electrode. Electrolysis plating liquid used copper sulfate and the mixed solution of chlorination calcium. Electrolysis plating liquid permeated alternatively the non-exposed part in which a sulfonium group exists. When it turned on electricity to stainless steel electrode, copper deposited only in the non-exposed part which plating liquid permeated by electrolysis plating, and the composite material which can be used as the wiring sheet with which Cu via of a diameter=of dot 200 micrometer dot array pattern (dot pitch=500 micrometer) was formed, or an anisotoropic electric conduction sheet was obtained.

Evaluation

When the section of the portions of Cu wiring or Cu via was observed by the scanned type electron microscope, it filled up with pore of a porous sheet with copper nearly completely.

Example 14

In the example 14, a method of forming a copper pattern in a porous sheet continuously will be explained in the following as an example of the forming method of a component of the 1st and 2nd embodiments using roll-like electrode.

Preparation of a Porous Sheet

The porous sheet with which pattern latent image was formed was prepared like the case of the operation 9.

A belt-shaped porous sheet was used, that a width of the sheet was 5 cm and the length was 1 m.

Electrolysis Plating Using Roll-like Electrode

Electrolysis plating was continuously carried out on the porous sheet with which latent image was formed using roll-like electrode. The figure of the electrolysis plating equipment used for FIG. 5 is shown. The porous sheet with which latent image was formed is pulled out from a reel 41, and is introduced into the electrolysis plating tub 43. Electrolysis plating liquid 44 is filled by the electrolysis plating tub 43. Aporous sheet is immersed into electrolysis plating liquid, coiled and stuck to rotating roll-like electrode 45. Roll-like electrode 45 and the copper opposite poles 46 was turned on electricity, plating deposits to the plating liquid perviousness domain (in the case of example, it is an exposure part) of the porous sheet stuck to roll-like electrode 45, and an electric conduction part is formed in it. It inspects whether the electric conduction part has penetrated the porous sheet 47 with which the electric conduction part was formed on the both sides of a porous sheet with the roll 48 for inspection. The roll for inspection consists of a roll with which pair of surfaces was covered with conductive rubber. Two rolls are arranged so that a porous sheet may be put, and they contact the surface and the back of a porous sheet, respectively. By measuring the rate of electric conduction during two rolls, it checks that the electric conduction part is penetrated and formed in the front reverse side of a porous sheet. It is introduced into the tub 49 for a flush after inspection, and the electrolysis plating liquid which remained is washed out. The porous sheet with which the electric conduction part was formed is rolled round by the reel 50 after washing.

As roll-like electrode 45, the pillar with a diameter [of 2 cm] and a length of 10 cm made from stainless steel was used. Distance between the surface of roll-like electrode 45 and the surface of the opposite poles 46 was set to 1cm. Electrolysis plating liquid used the same thing as a case of example 9. The speed which sends a porous sheet was adjusted based on the inspection result with the roll 48 for inspection. Consequently, the composite material which can be used as the wiring sheet with which Cu wiring of line width [of 50 micrometers] and space 50 micrometer and Cu via with a diameter of 50 micrometers were formed,or an anisotropic electric conduction sheet was obtained.

Evaluation

When the section of the portions of Cu wiring or Cu via was observed by the scanned type electron microscope, it filled up with pore of a porous sheet with copper nearly completely.

Example 15

In the example 15, a method will be explained in which a composite material is manufactured using a photosensitive polymer which has the photosensitive group which generates an anion exchange group, and a cross-link construction group as an example of photosensitive polymer.

Photosensitive Polymer and a Photosensitive Composite

The photosensitive polymer 6 and photosensitive polymer 7 which are shown by the following chemical formula (43) and (44) respectively were used. Each compounded polymer 6 and polymer 7 by the radical polymerization method.

[Formula 43]

Polymer 6
Weight average molecular weight Mw = 31000, a:b:c = 2:5:1

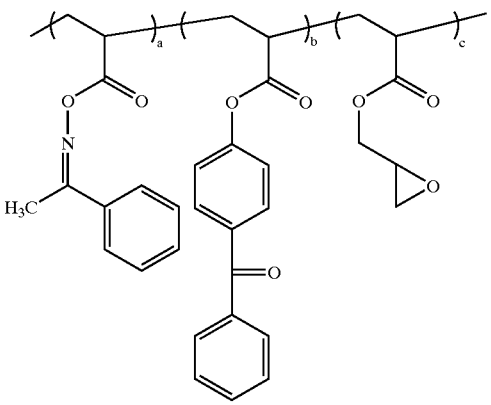

[Formula 44]

Polymer 7
Weight average molecular weight Mw = 22000 and a:b:c:d = 6:14:5:1
BTTB was added to the polymer 7, the ratio of BTTB was 5% by weight.

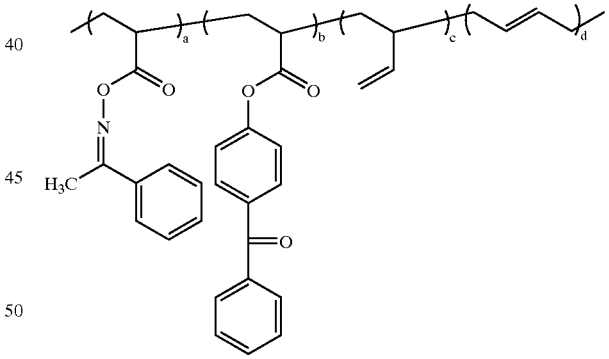

Formation of a Cooper Pattern

When the composite of polymer 6 or polymer 7, and BTTB was used and also Cu circuit pattern as well as a case of the operation 1 was formed as polymer which forms a photosensitive layer, all were able to form the composite material in which Cu circuit pattern was formed satisfactory.

Moreover, when ultrasonic washing by acetone was performed for 2 minutes and also Cu circuit pattern as well as a case of the operation 1 was formed after being immersed in chlorination platinum acid solution using the composite of polymer 6 or polymer 7, and BTTB, and washing, all were able to form too the composite material in which Cu circuit pattern was formed satisfactory.

However, when ultrasonic washing by acetone was performed for 5 minutes and also Cu circuit pattern as well as a case of the operation 1 was formed after being immersed in chlorination platinum acid solution, using polymer 1 as an example of comparison, and washing, the deficit of Cu circuit pattern considered to originate in exfoliation of a photosensitive layer in some places of wiring has checked by microscope observation.

This showed that the durability of polymer [the polymer 6 or polymer 7] which has a bridge construction nature machine over a solvent (it is acetone in this case) was improving as compared with polymer 1.

The polymer 6 and polymer 7 can be used to the method of manufacturing the composite material of the 3rd embodiment of this invention.

Example 16

In the example 16, a method will be explained in which the composite material is manufactured using a photosensitive polymer which has a photosensitive group which disappears an anion exchange group, and a cross-link construction group.

Photosensitive Polymer and a Photosensitive Composite

The photosensitive polymer 8 and photosensitive polymer 9 which are shown by the following formula (45) and (46) respectively were used. The polymer 8 and the polymer 9 were synthesized by the radical polymerization method.

[Formula 45]

Polymer 8
Weight average molecular weight Mw = 34000, m:n = 7:3

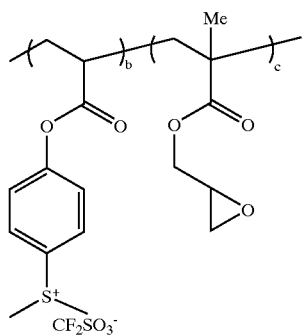

[Formula 46]

Polymer 9
Weight average molecular weight Mw = 21000 and m:n:l = 6:5:1 BTTB was added to the polymer 7, the ratio of BTTB was 5% by weight.

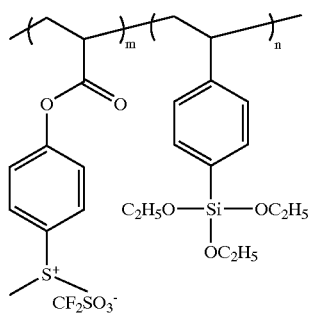

Formation of a Copper Pattern

When the composite of polymer 8 or polymer 9, and BTTB was used and also Cu circuit pattern as well as a case of the operation 6 was formed as polymer which forms a photosensitive layer, all were able to form the composite material in which Cu circuit pattern was formed satisfactory.

Moreover, when ultrasonic washing by acetone was performed for 2 minutes and also Cu circuit pattern as well as a case of the operation 6 was formed after being immersed in the solution of a complex 1 using the composite of polymer 8 or polymer 9, and BTTB, and washing, all were able to form too the composite material in which Cu circuit pattern was formed satisfactory.

However, when ultrasonic washing by acetone was performed for 5 minutes and also Cu circuit pattern as well as a case of the operation 6 was formed after being immersed in the solution of a complex 1, using polymer 5 as an example of comparison, and washing, the deficit of Cu circuit pattern considered to originate in exfoliation of a photosensitive layer in some places of wiring has checked by microscope observation. When polymer 5 was incidentally used and also having been produced like the case of the operation 6, the deficit of such a Cu circuit pattern was not accepted.

This showed that the durability of polymer [the polymer 6 or polymer 7] which has a bridge construction nature machine over a solvent (it is acetone in this example) was improving as compared with polymer 5.

The polymer 8 and polymer 9 can be used to the method of manufacturing the composite material of the 3rd embodiment of this invention.

Example 17

In the example 17, a method will be explained in which the composite material is manufactured using a photosensitive material containing a photosensitive polymer having azide derivative group and a phenol novolak resin. The photosensitive polymer having azide group generates an anion exchange group, and phenol novolak resin as assisting agent for cross-link, react with nitren which is generated from azide group by exposure, to form cross-link.

Photosensitive Polymer and Bridge Construction Assistant Agent

The photosensitive azide group content polymer shown with the following chemical formula (47) was used. Azide group content polymer was synthesized from partial acetylized polyvinyl alcohol. Phenol novolak resin having molecular weight 6500 was used.

[Formula 47]

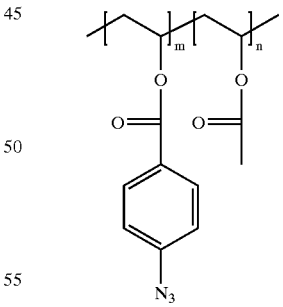

Polymer

The polymer having the weight average molecular weight (Mw) was 24000 and the ratio of m:n was 6:4, was used.

Formation of a copper pattern

When forming a photosensitive layer, and the mixed solution of 9:1 was applied by the weight ratio of azide machine content polymer and phenol novolak resin and also Cu circuit pattern as well as a case of the operation 1 was formed, the composite material in which Cu circuit pattern was formed similarly was able to be formed. The mixture of the polymer having azide group and phenol novolak resin can be used in the 3rd embodiment as manufacturing method of composite material of this invention.

INDUSTRIAL APPLICABILITY

In a passive element, a passive element composite component, a substrate with a built-in passive element and a composite wiring substrate according to the present invention as explained above, the generation of layer peeling of layers constituting these materials is eliminated and packaging density can be improved, thereby attaining electronic devices with high-density packaging.

What is claimed is:

1. A passive element component comprising a passive element comprising a conductive material region produced by filling a conductive material in two regions of a porous base material, which regions are not in contact with each other, and a functional region sandwiched between each conductive material region on the porous base material, which is prepared by filling unfilled porous base material with a passive element functional material.

2. A passive element component according to claim 1, wherein the passive element comprising said conductive material region and said functional material region is provided plurally.

3. A passive element component comprising plural functional regions of a material having different electromagnetic characteristics, and a conductive material region, wherein one of said plural functional regions is a passive element functional material region, which is in contact with said conductive material region, and is produced by filling a portion of a porous base material with a passive element functional material, which constitutes a passive element in combination with said conductive material region; and the other of the plural functional regions is an insulation material region, which is in contact with at least one of said conductive material region and said passive element functional material region, and is produced by filling a portion of said porous base material with an insulation material differing from the passive element functional material.

4. A passive element component according to claim 3, wherein the passive element comprising said conductive material region and said passive element functional material region is provided plurally.

5. A passive element component according to claim 4, wherein said plural passive elements are separated from each other by said insulation material region.

6. A substrate with a built-in passive element comprising the passive element component according to claim 3, and wiring leading from the conductive material region of the passive element.

7. A substrate with a built-in passive element according to claim 6, wherein a through-hole for mounting an electronic component is formed.

8. A substrate with a built-in passive element according to claim 6, wherein said passive element functional material is a high-dielectric material.

9. A substrate with a built-in passive element according to claim 6, wherein said passive element functional material is a resistant material.

10. A substrate with a built-in passive element according to claim 6, wherein said passive element functional material is a high-permeability material.

11. A passive element component comprising a first functional region, a second functional region and a third functional region produced by filling a porous base material with a material having different electromagnetic characteristics, wherein said first functional region is a conductive material region produced by filling a portion of said porous base material with a conductive material;

said second functional region is a passive element functional material region, which is in contact with said conductive material region, and is produced by filling a portion of said porous base material with a passive element functional material, which constitutes a passive element in combination with said conductive material region; and said third functional region is an insulation material region, which is in contact with at least one of said conductive material region and said functional material region and is produced by filling a portion of said porous base material with an insulation material differing from said passive element functional material.

12. A passive element component according to claim 11, wherein the passive element comprising said conductive material region and said passive element functional material region is provided plurally; and said plural passive elements are separated from each other by said insulation material region.

13. A condenser element component comprising a conductive material region produced by filling a conductive material in two regions of a porous base material which regions are not in contact with each other, and a functional region sandwiched between each conductive material region on the porous base material, which is prepared by filling unfilled porous base material with a high-dielectric material.

14. A resister element component comprising a conductive material region produced by filling a conductive material in two regions of a porous base material which regions are not in contact with each other, and a functional region sandwiched between each conductive material region on the porous base material, which is prepared by filling unfilled porous base material with a resistant material.

15. A coil element component comprising a conductive material region produced by filling a conductive material in two regions of a porous base material, which regions are not in contact with each other, and a functional region sandwiched between each conductive material region on the porous base material, which is prepared by filling unfilled porous base material with a high-magnetic permeability material.

* * * * *